United States Patent
Kondo

(10) Patent No.: US 9,831,256 B1
(45) Date of Patent: Nov. 28, 2017

(54) SEMICONDUCTOR DEVICE AND METHOD FOR MANUFACTURING SAME

(71) Applicant: Toshiba Memory Corporation, Minato-ku (JP)

(72) Inventor: Haruka Kondo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/462,395

(22) Filed: Mar. 17, 2017

Related U.S. Application Data

(60) Provisional application No. 62/445,905, filed on Jan. 13, 2017.

(51) Int. Cl.
| | |
|---|---|
| *H01L 27/11548* | (2017.01) |
| *H01L 27/11556* | (2017.01) |
| *H01L 27/11575* | (2017.01) |
| *H01L 27/11582* | (2017.01) |
| *H01L 23/522* | (2006.01) |
| *H01L 21/768* | (2006.01) |
| *H01L 21/311* | (2006.01) |

(52) U.S. Cl.
CPC .. *H01L 27/11548* (2013.01); *H01L 21/31144* (2013.01); *H01L 21/76816* (2013.01); *H01L 21/76897* (2013.01); *H01L 23/5226* (2013.01); *H01L 27/11556* (2013.01); *H01L 27/11575* (2013.01); *H01L 27/11582* (2013.01)

(58) Field of Classification Search
CPC ......... H01L 27/11548; H01L 27/11575; H01L 23/5226; H01L 21/31144; H01L 21/76816; H01L 21/76897; H01L 27/11556; H01L 27/11582
See application file for complete search history.

(56) References Cited

U.S. PATENT DOCUMENTS

| | | | |
|---|---|---|---|
| 2010/0013049 A1* | 1/2010 | Tanaka | H01L 21/76816 257/532 |
| 2011/0057251 A1 | 3/2011 | Higashi | |
| 2011/0156132 A1 | 6/2011 | Kiyotoshi | |
| 2012/0184078 A1 | 7/2012 | Kiyotoshi | |
| 2016/0079185 A1* | 3/2016 | Kato | H01L 21/76877 257/314 |
| 2016/0322374 A1* | 11/2016 | Sano | H01L 21/31111 |

FOREIGN PATENT DOCUMENTS

| | | |
|---|---|---|
| JP | 2011-60838 | 3/2011 |
| JP | 2011-138945 | 7/2011 |
| JP | 2012-151187 | 8/2012 |

* cited by examiner

*Primary Examiner* — Walter H Swanson
(74) *Attorney, Agent, or Firm* — Oblon, McClelland, Maier & Neustadt, L.L.P.

(57) ABSTRACT

A semiconductor device includes a base member, a first structure body, a second structure body, a first contact portion, a second contact portion, and a first post. The first structure body is provided above the base member. The first structure body has a first terrace in a front surface of a first end portion of the first electrode layer. The second structure body is provided on the first structure body other than the first end portion. The second structure body has a second terrace in a front surface of a second end portion of the second electrode layer. The side surface of the second electrode layer is at a first level difference between the first terrace and the second terrace. The first post is disposed between the first contact portion and the second contact portion. The first post crosses the first level difference.

17 Claims, 55 Drawing Sheets

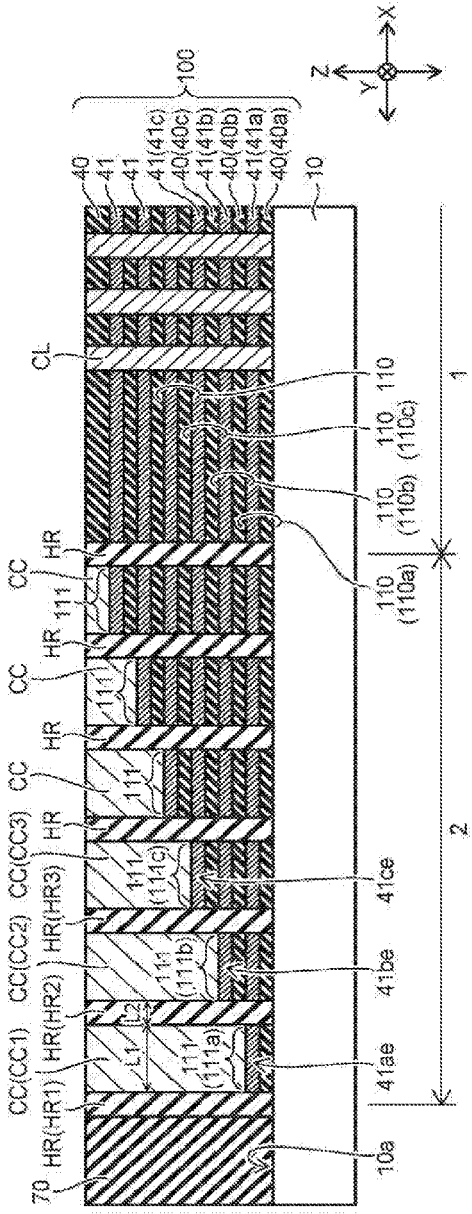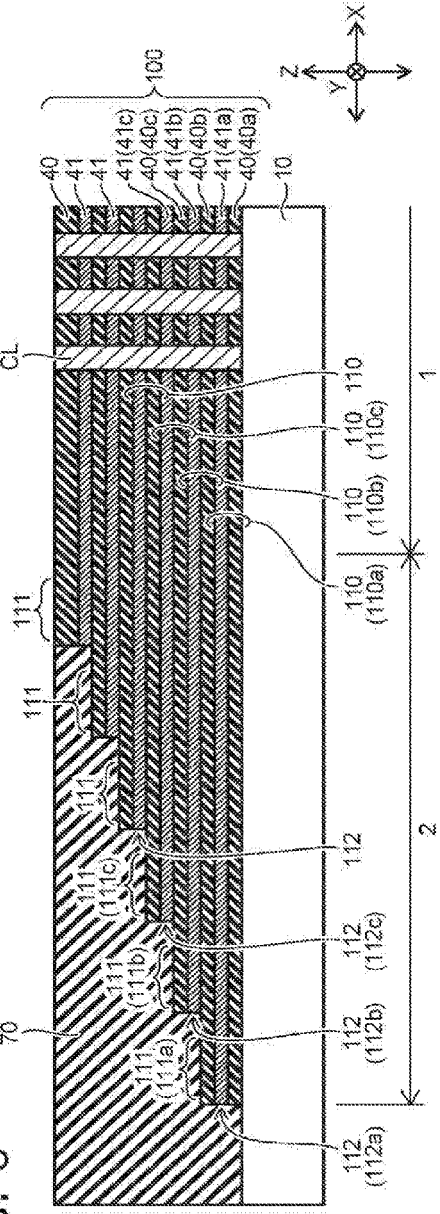

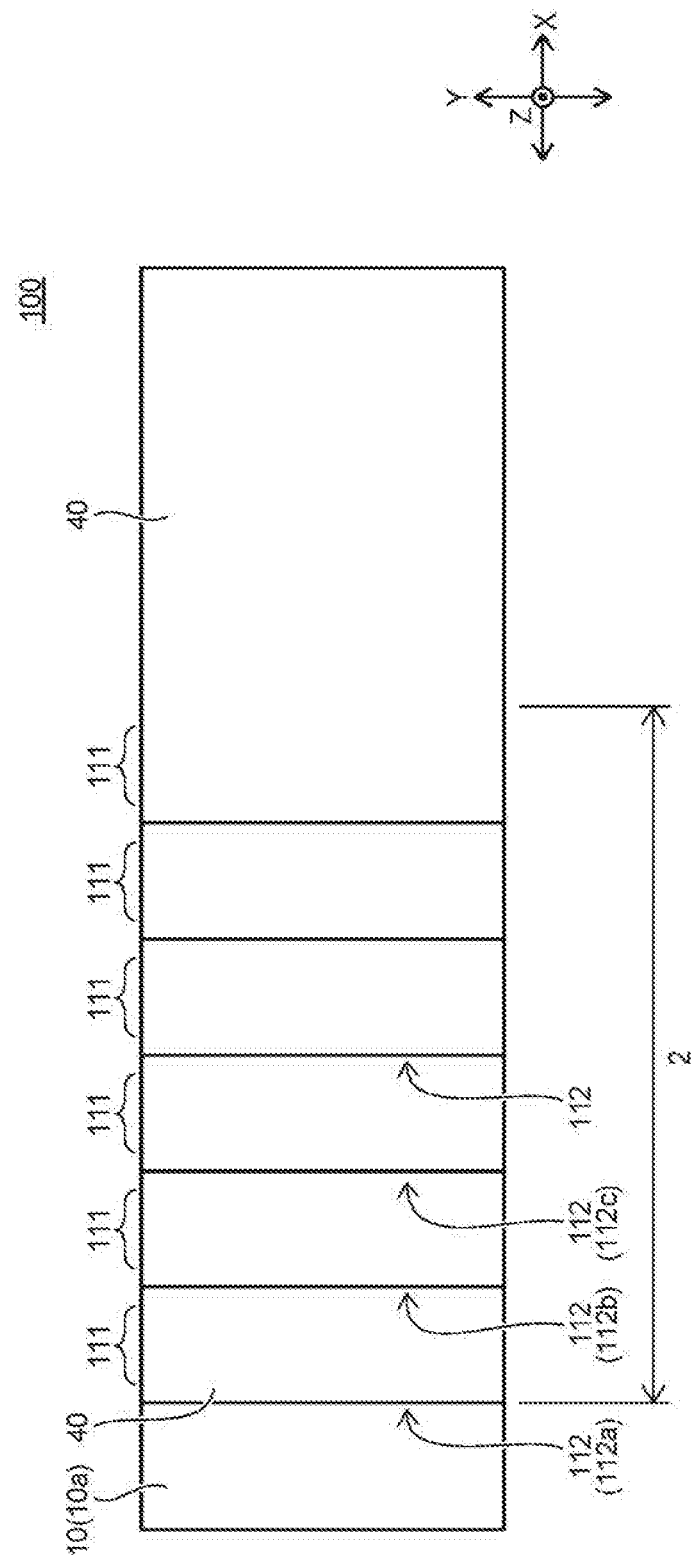

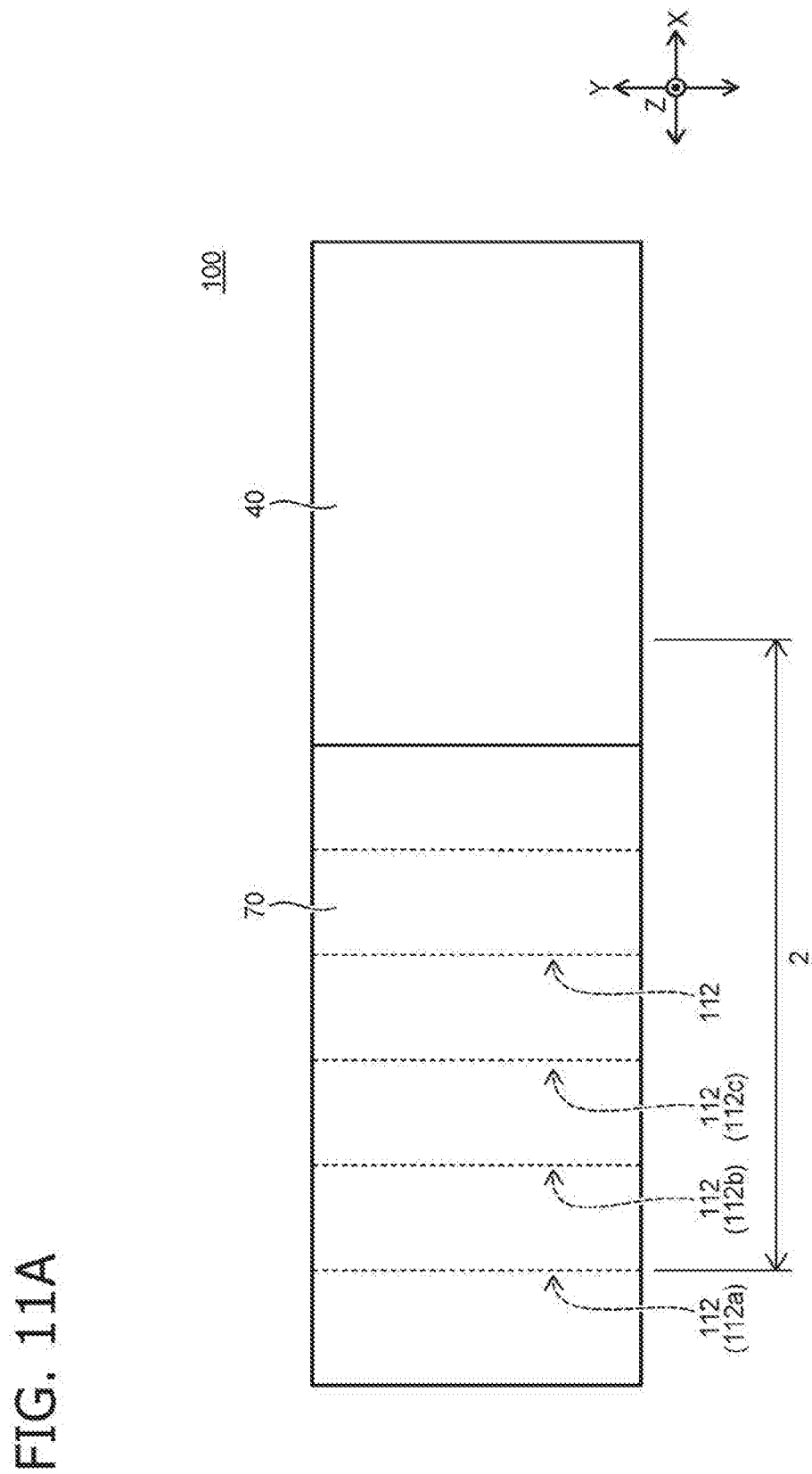

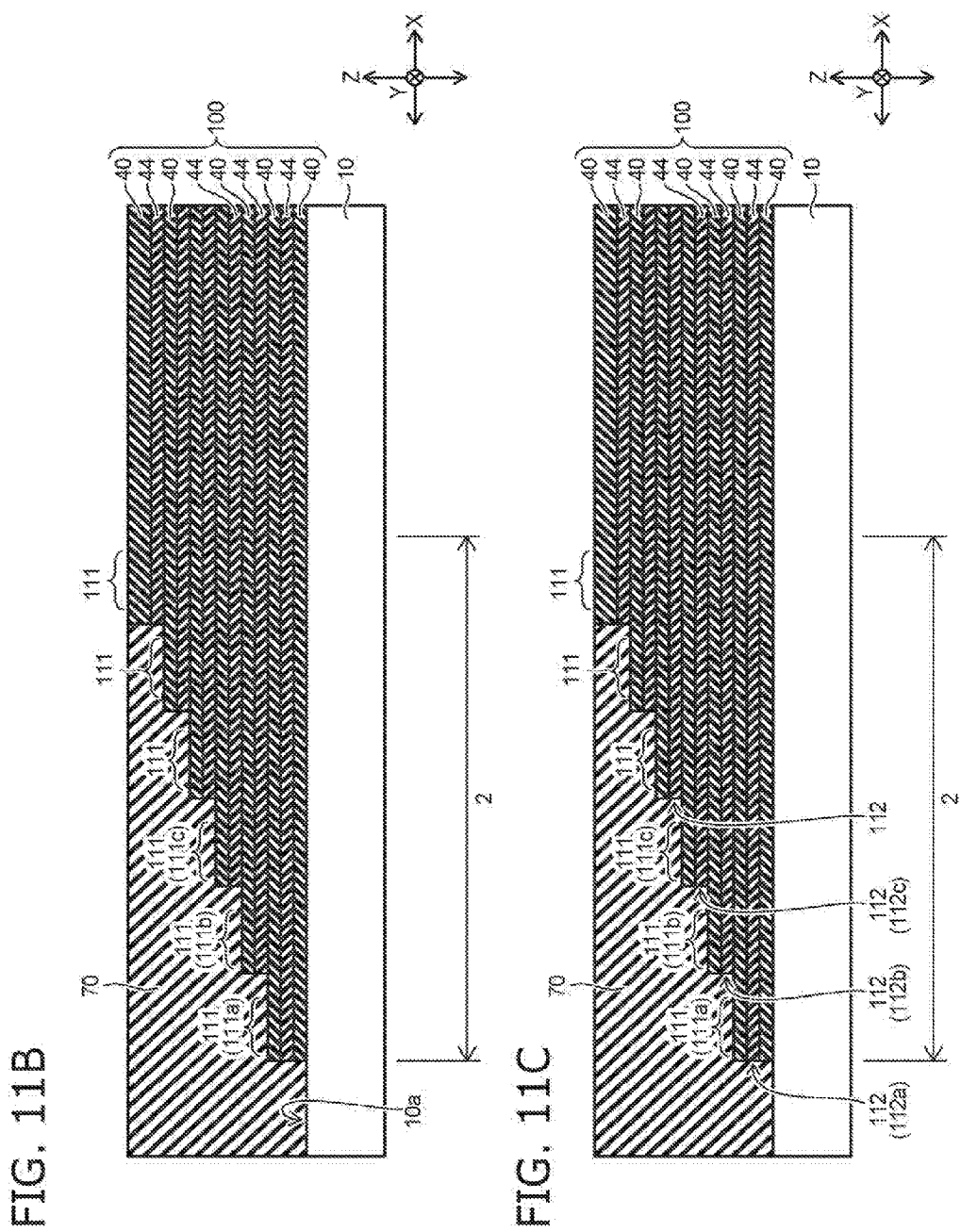

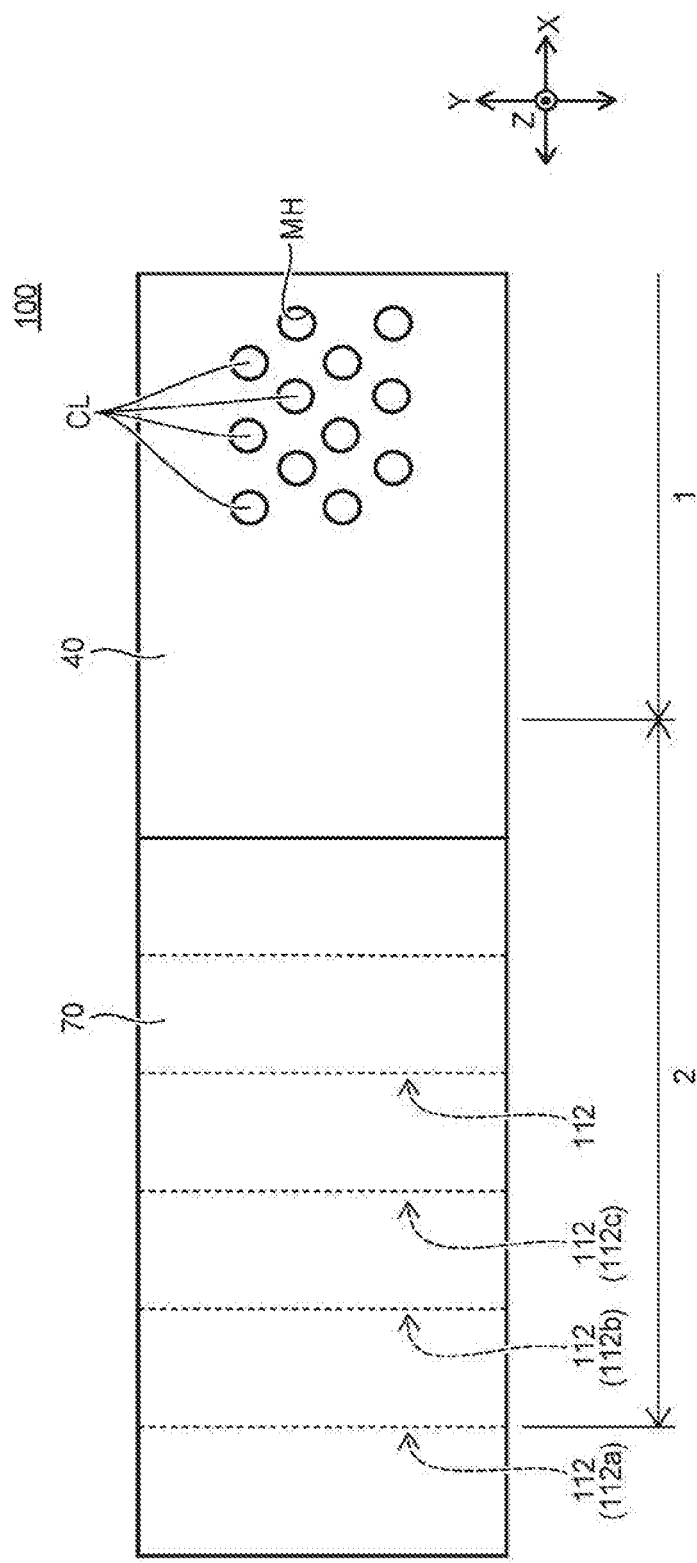

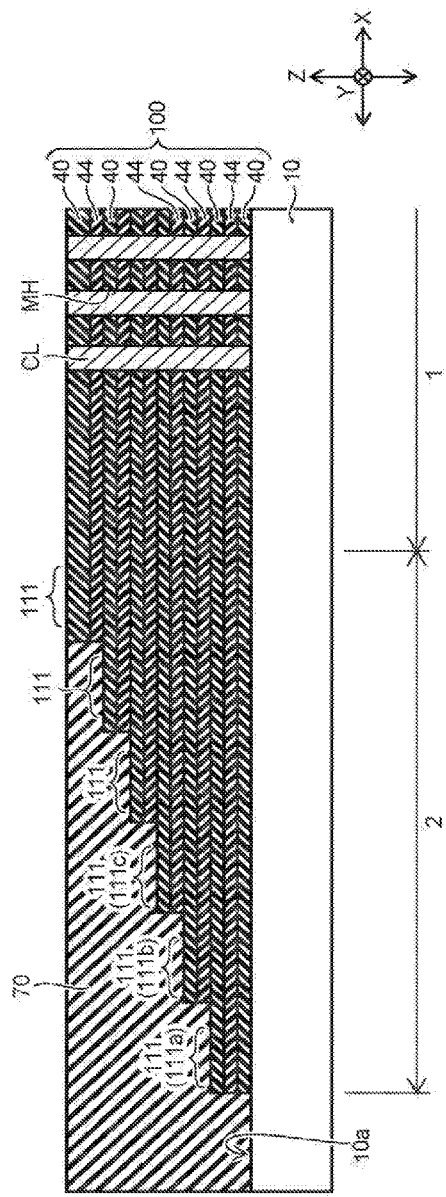
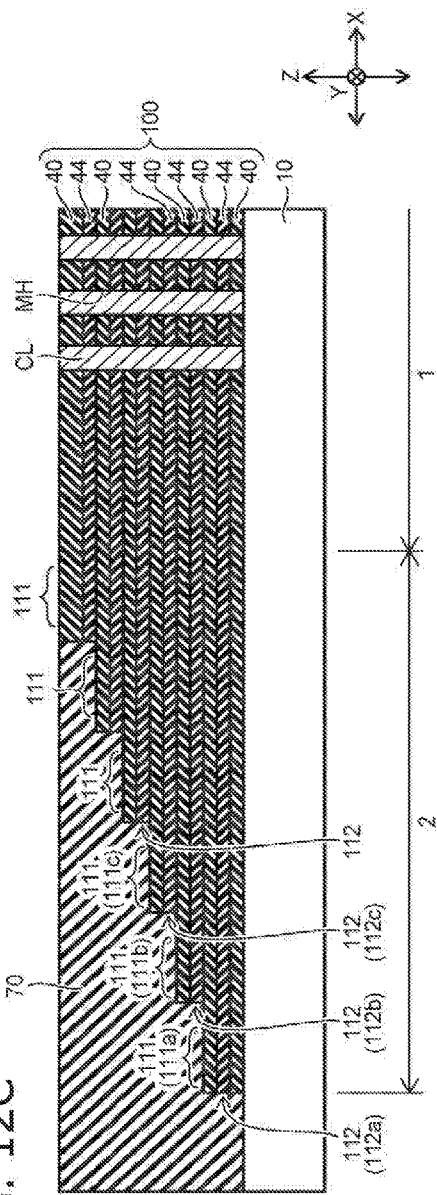
FIG. 12B
FIG. 12C

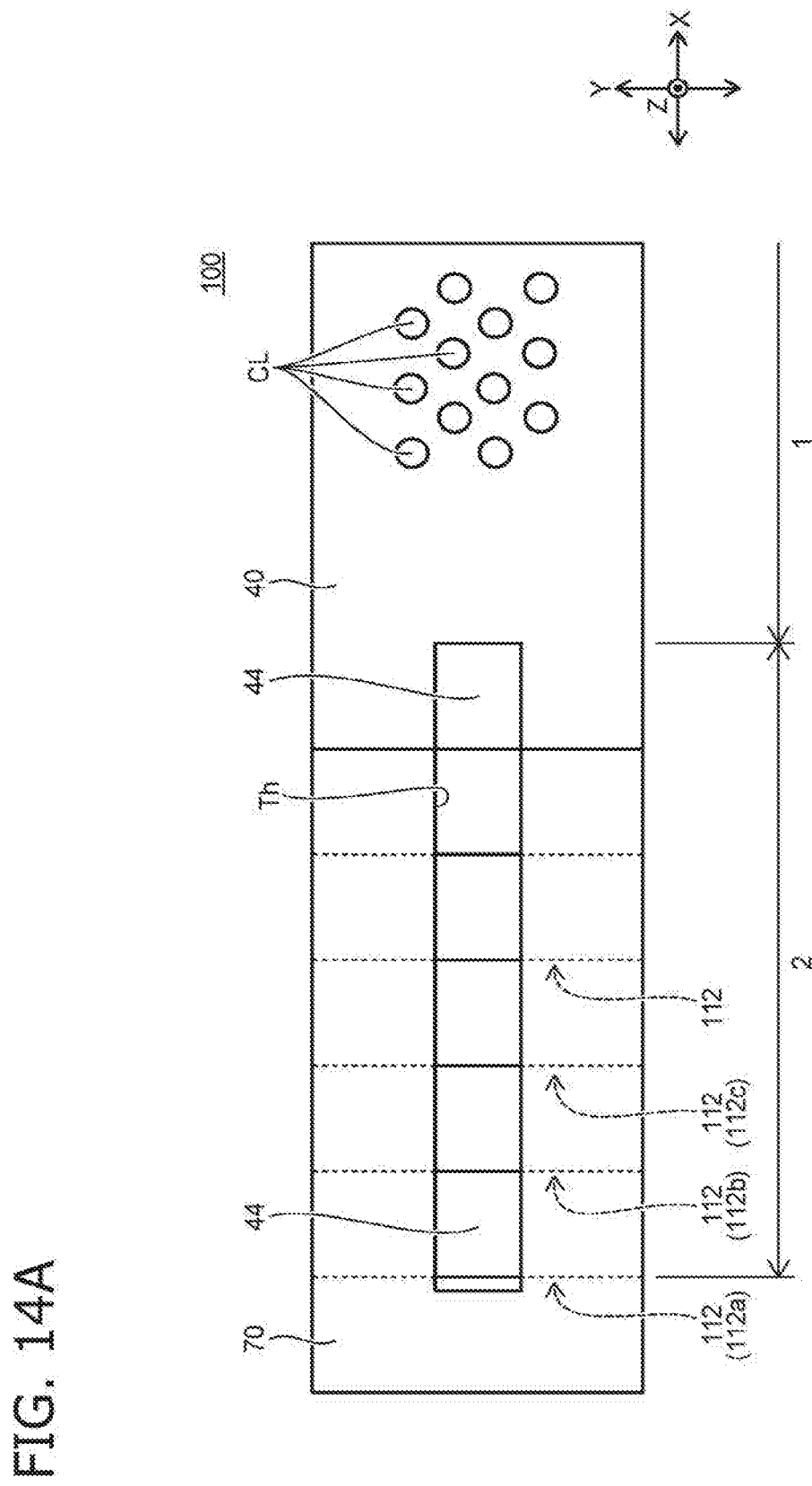

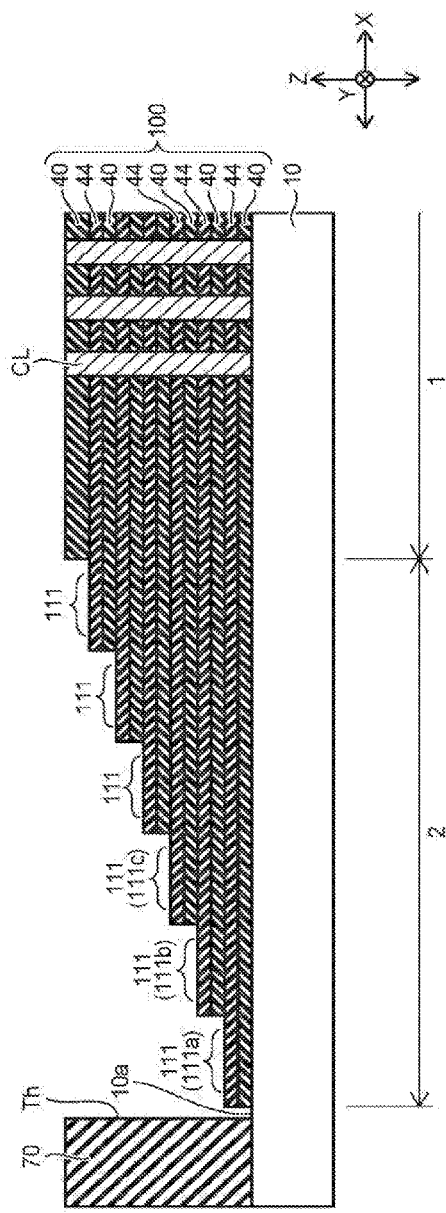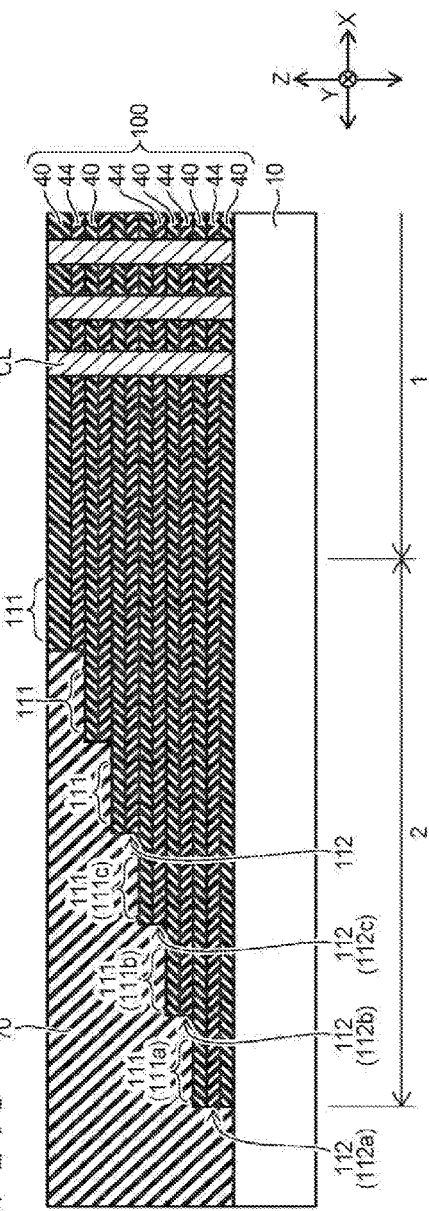

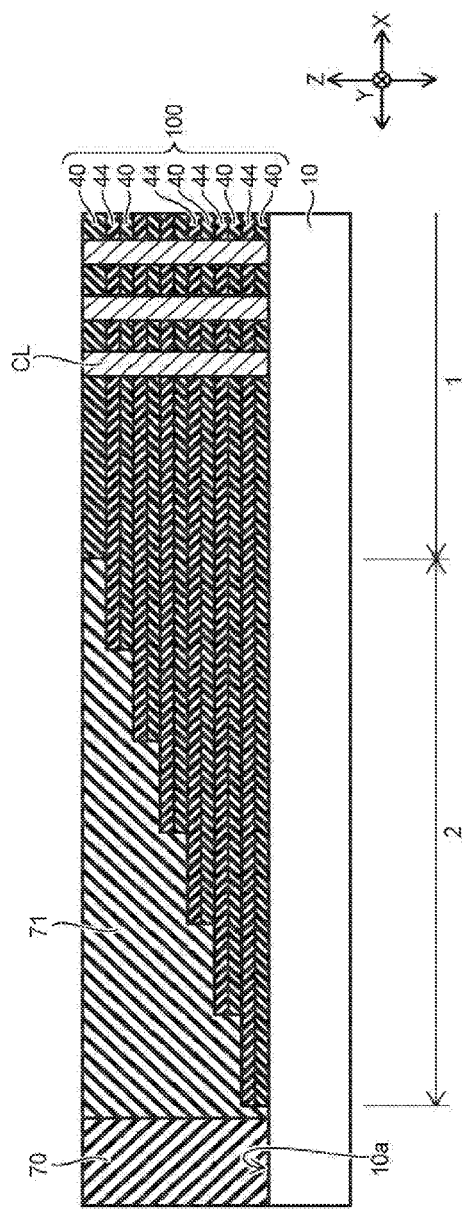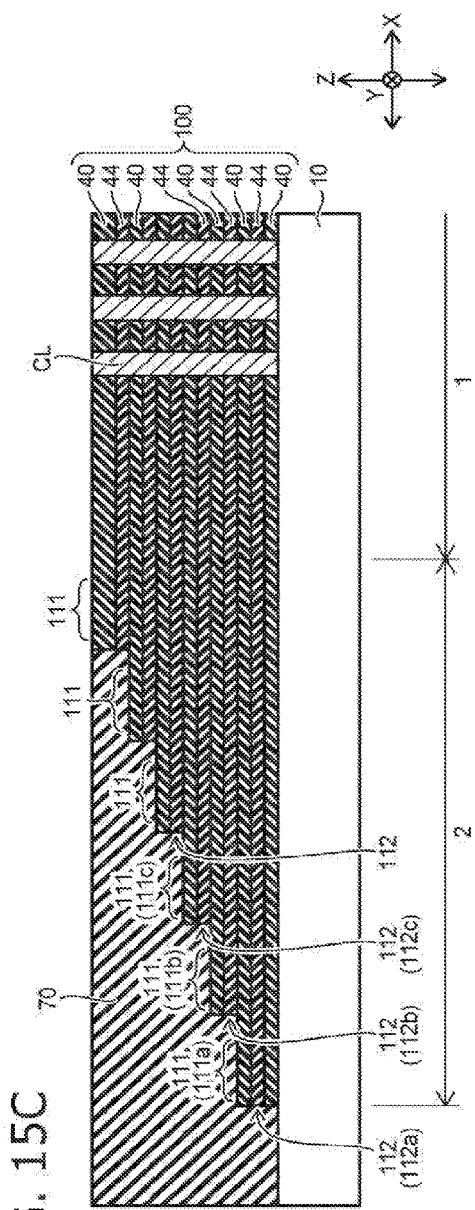

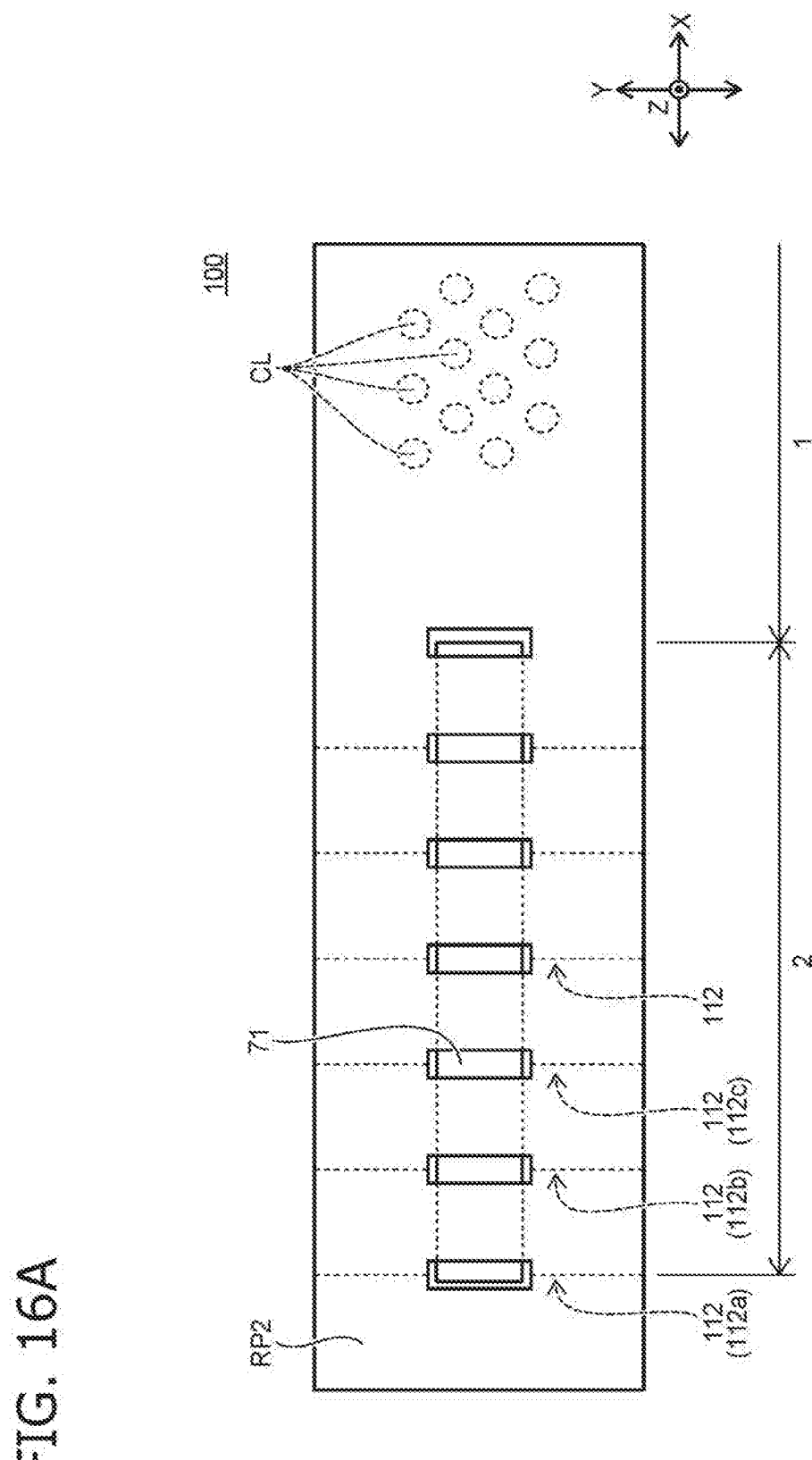

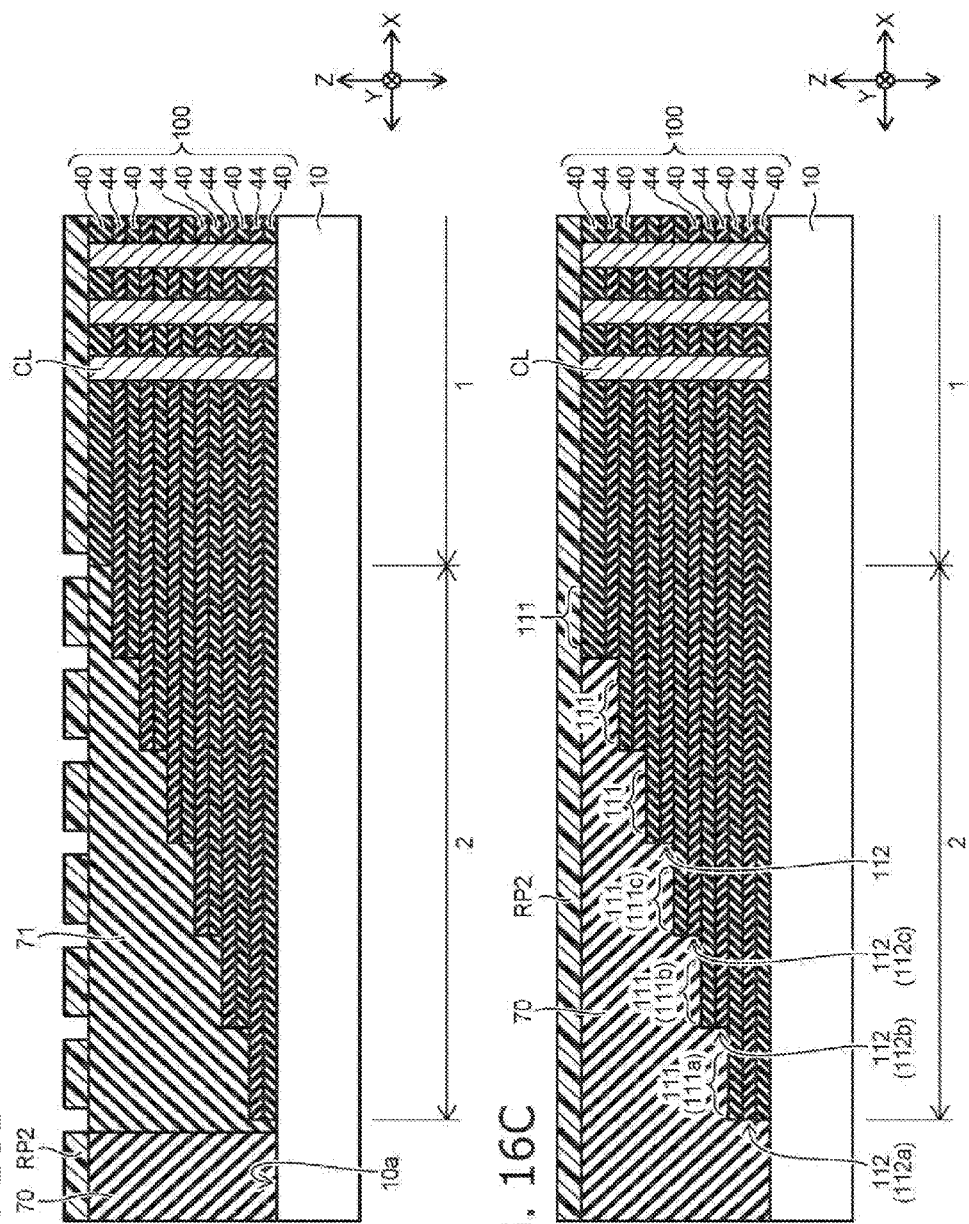

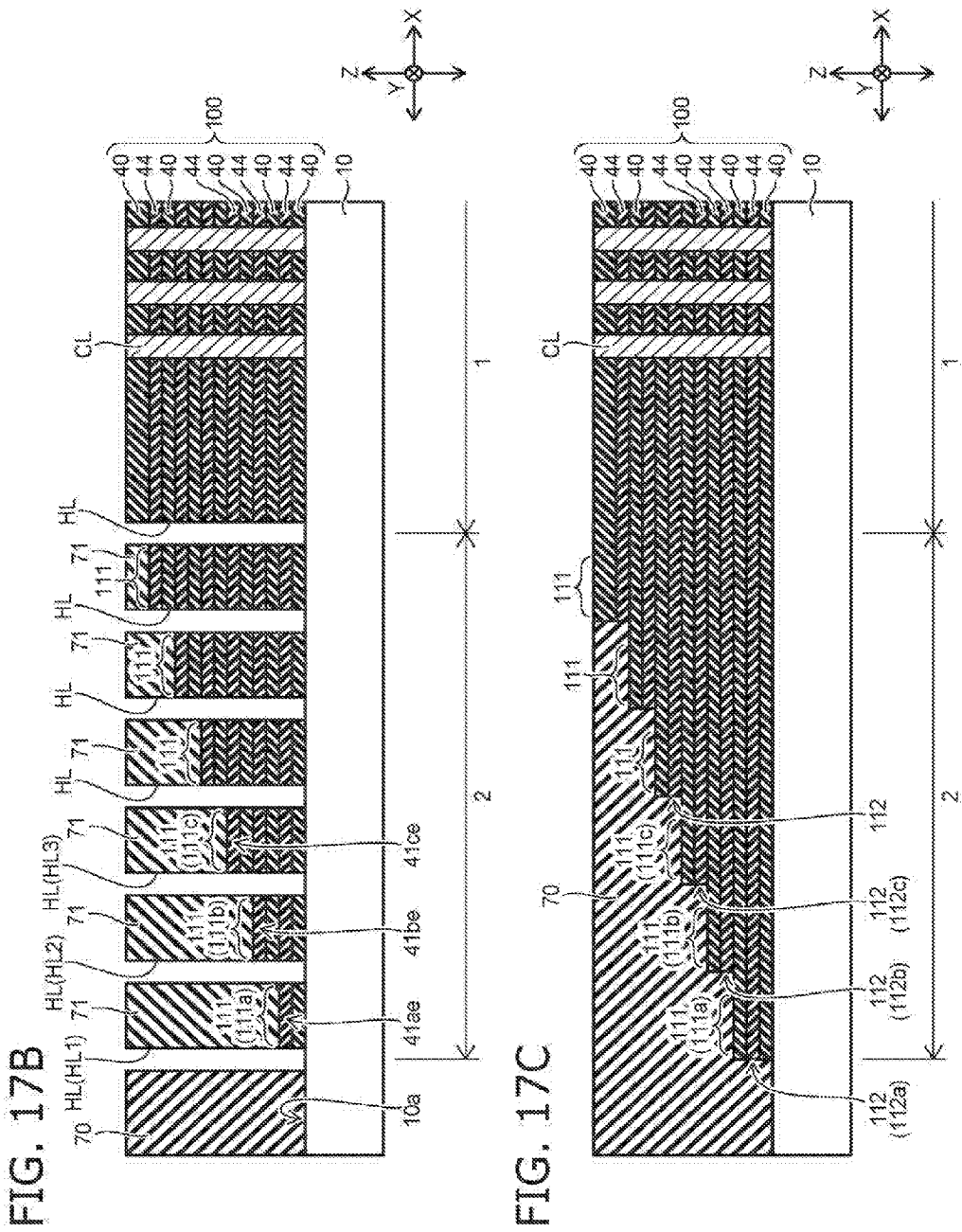

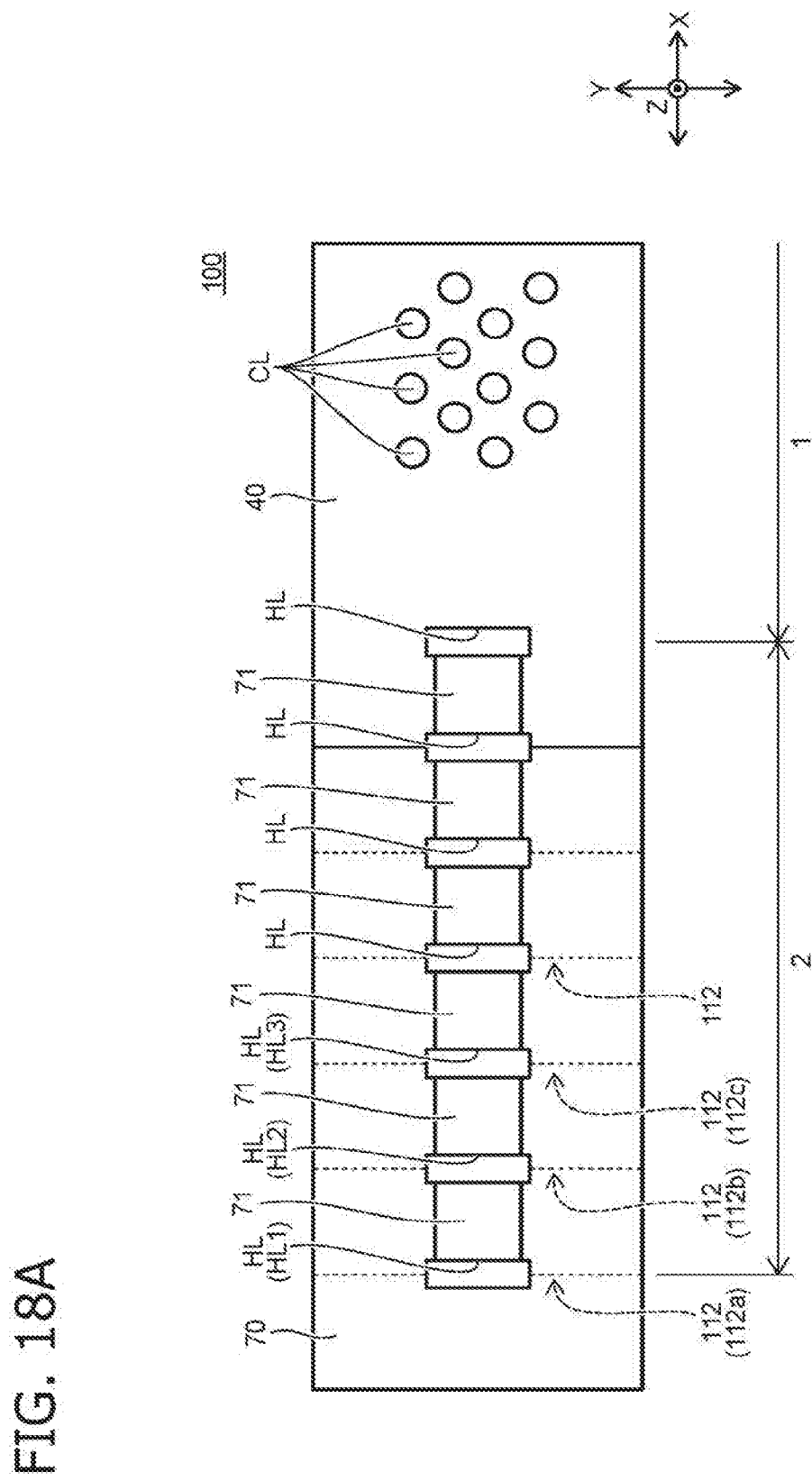

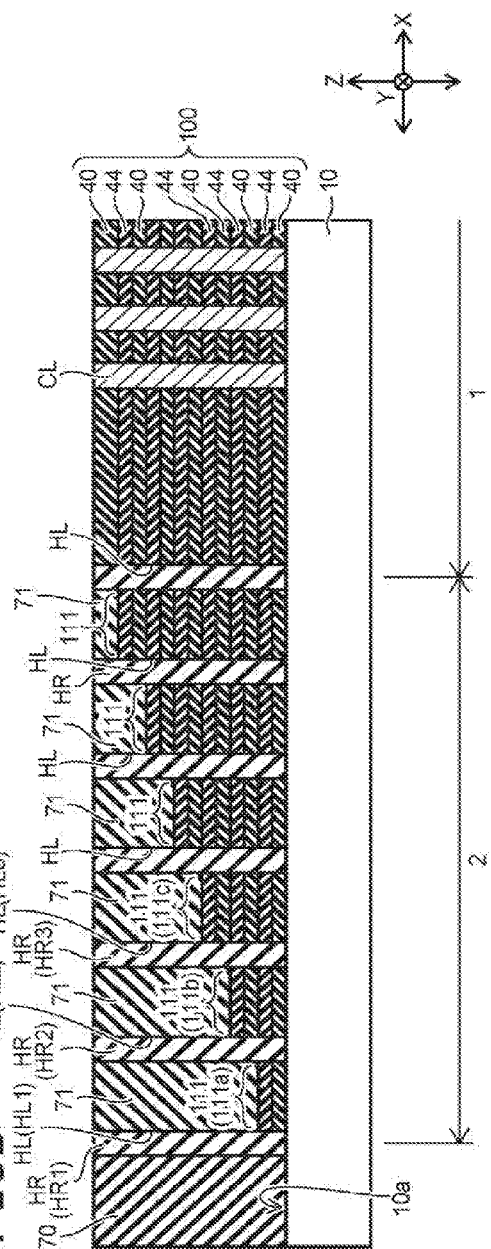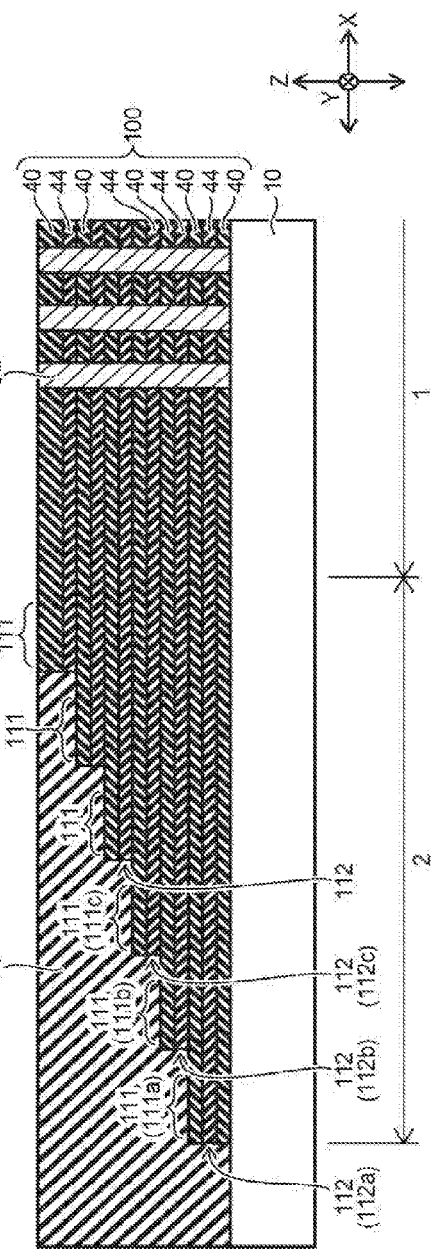

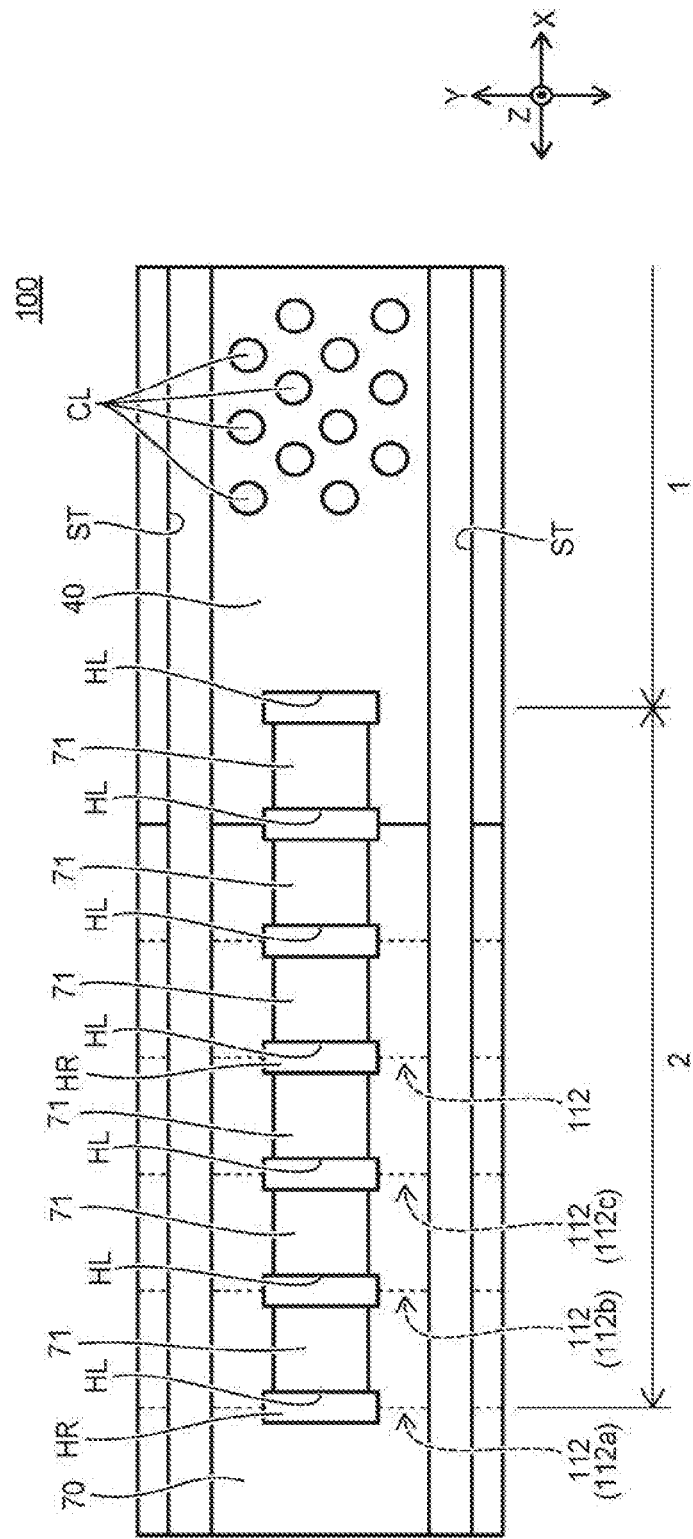

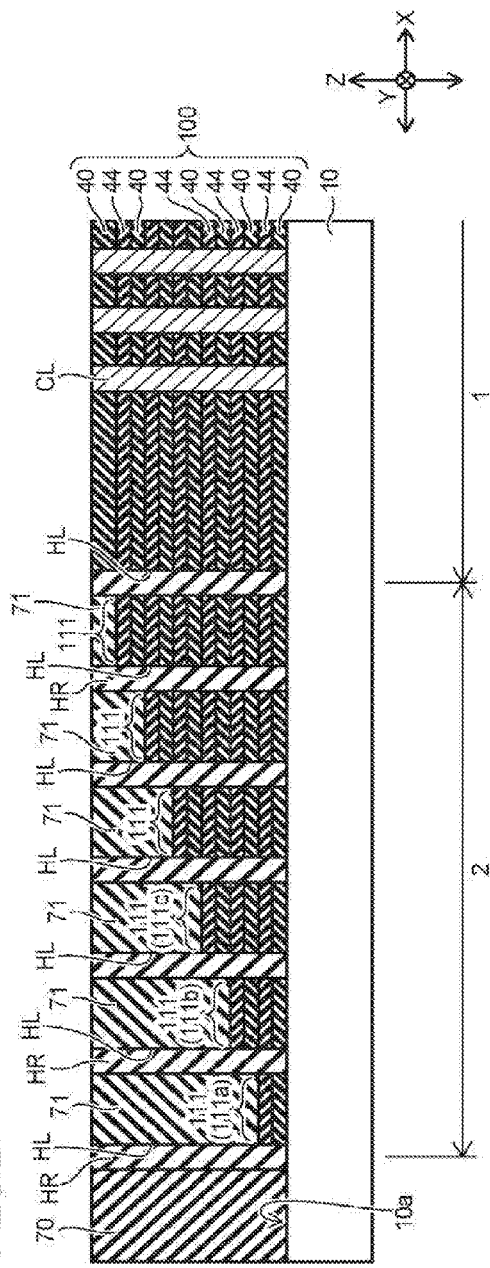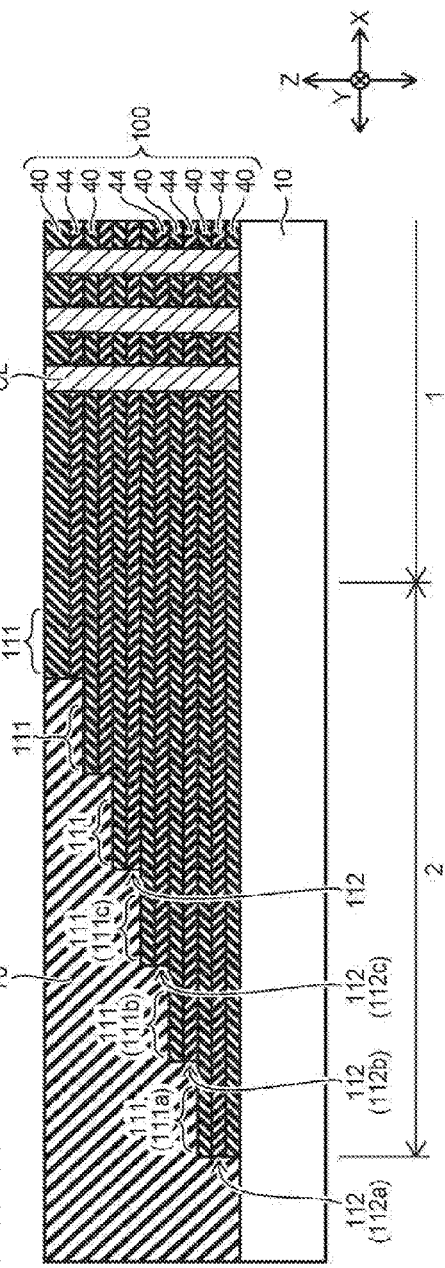

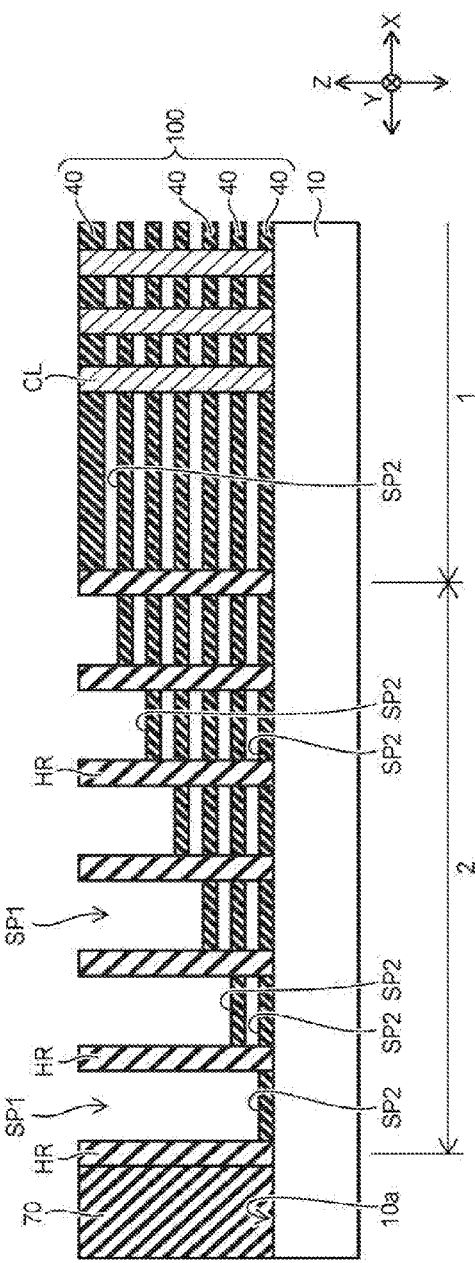
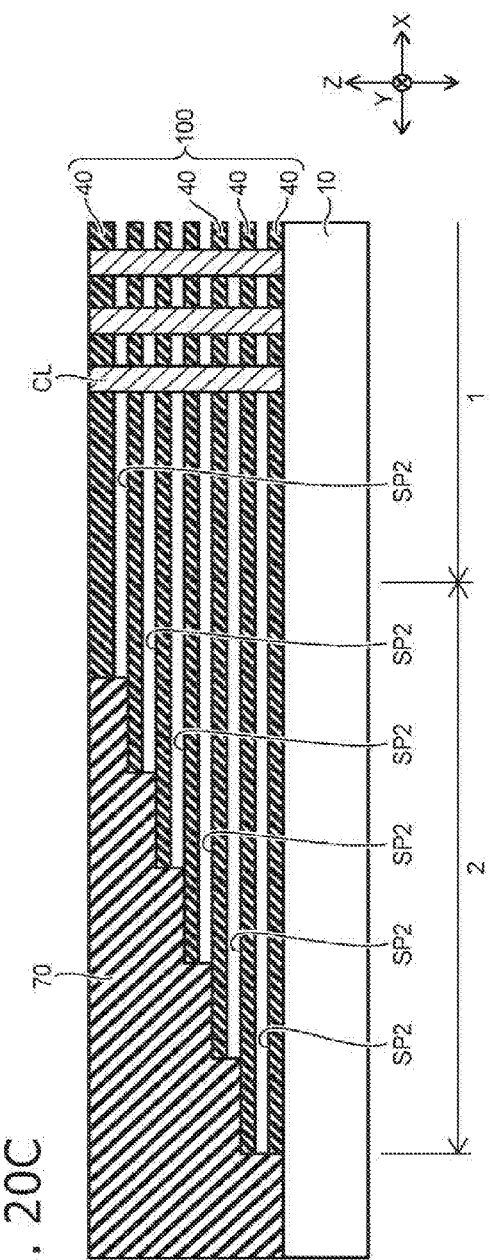
FIG. 20B
FIG. 20C

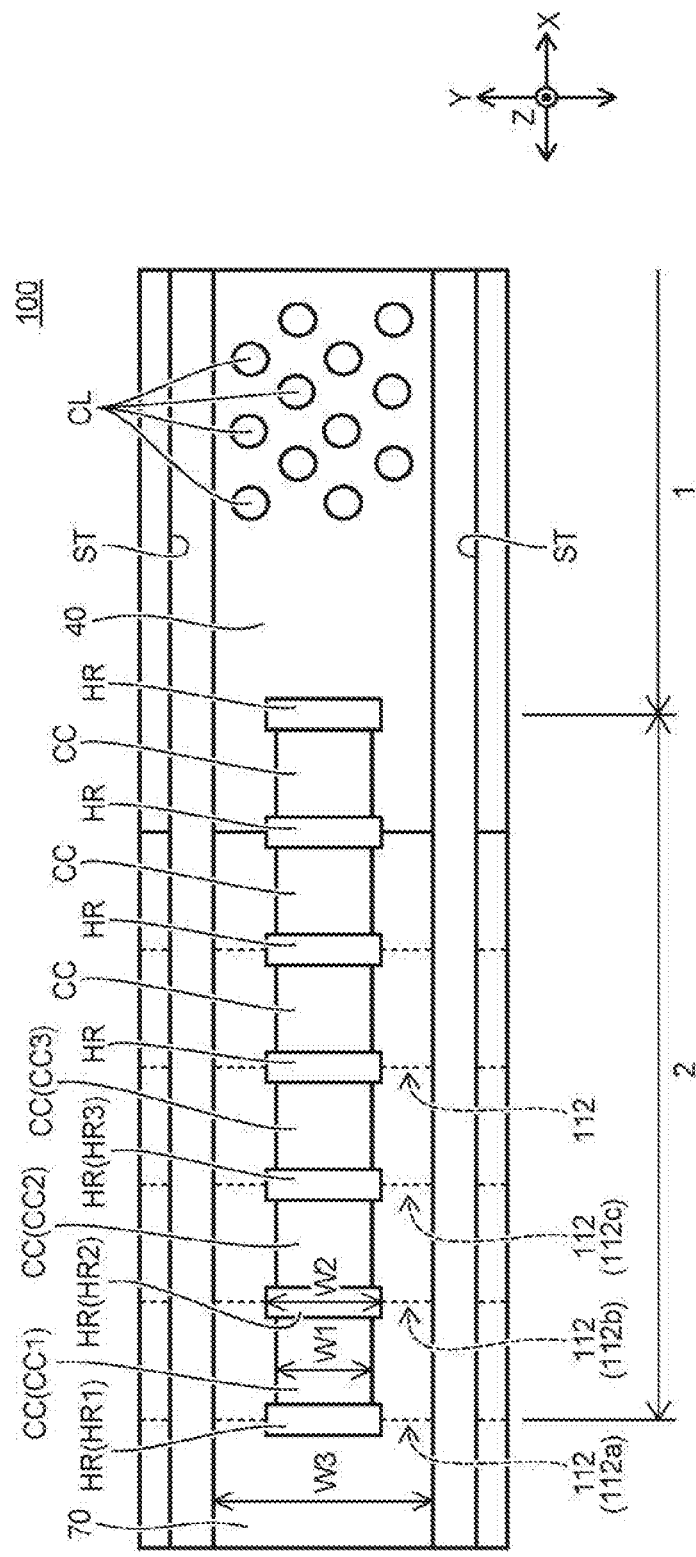

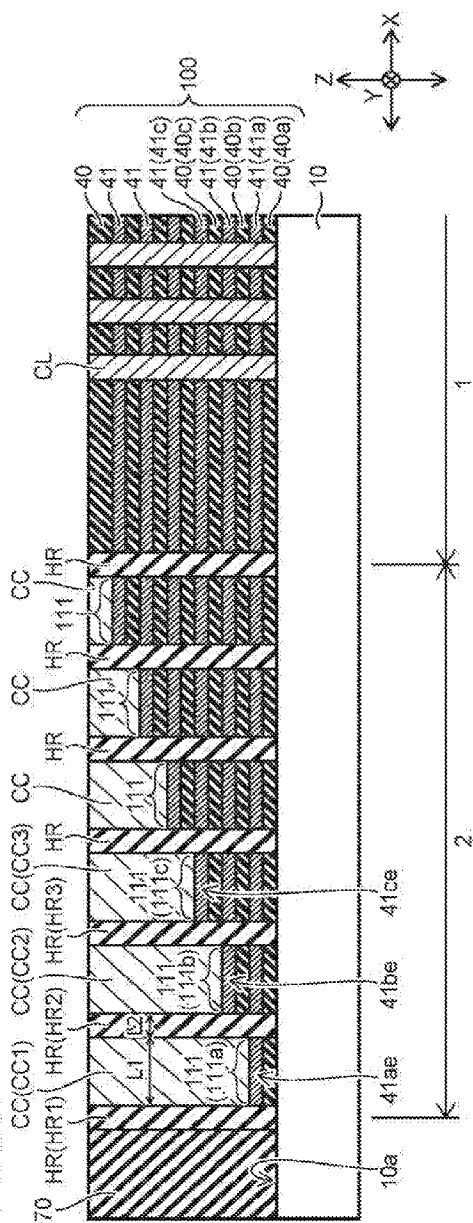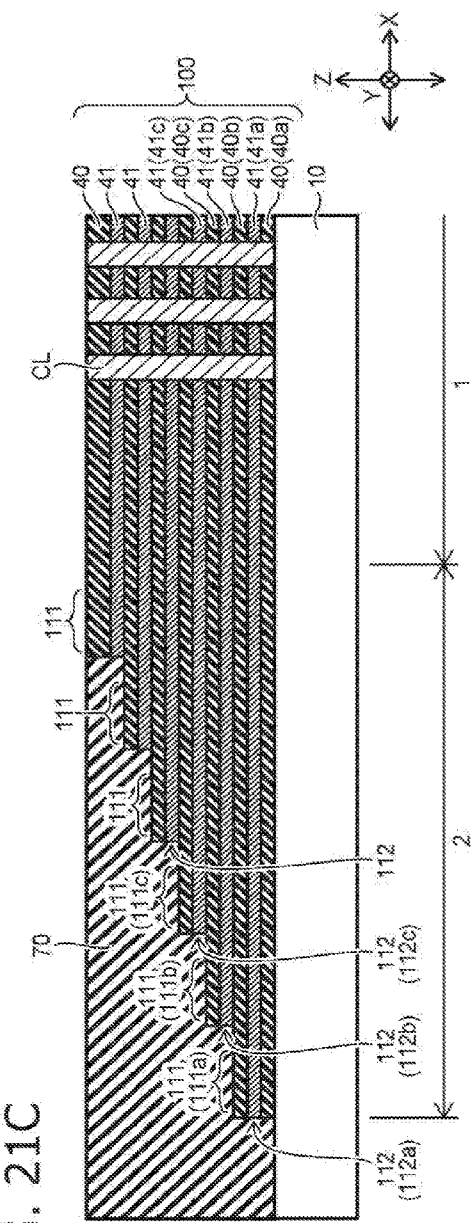

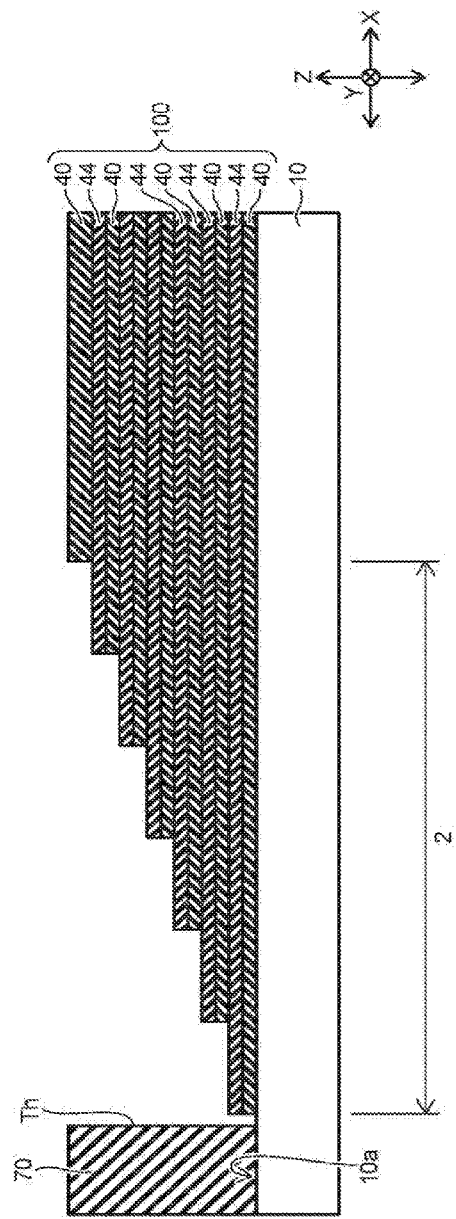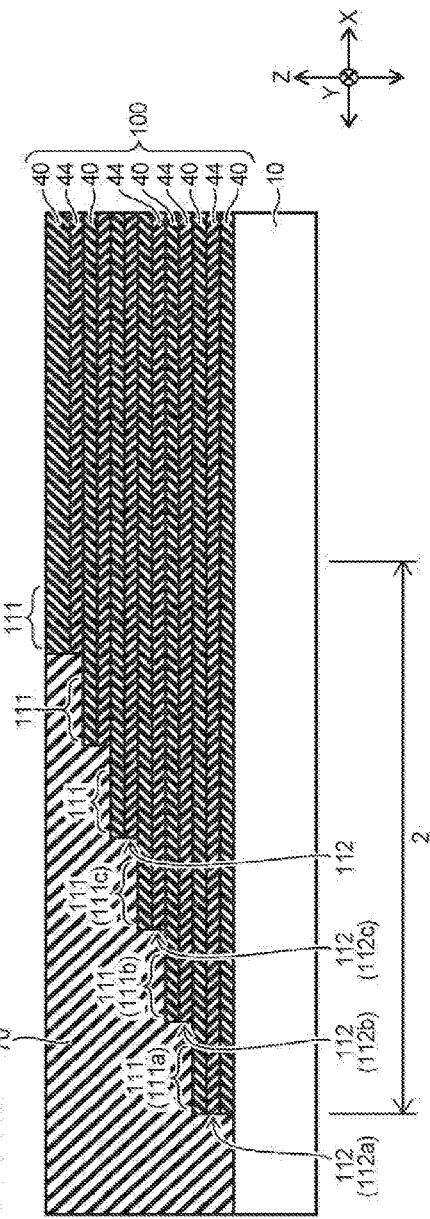
FIG. 24B
FIG. 24C

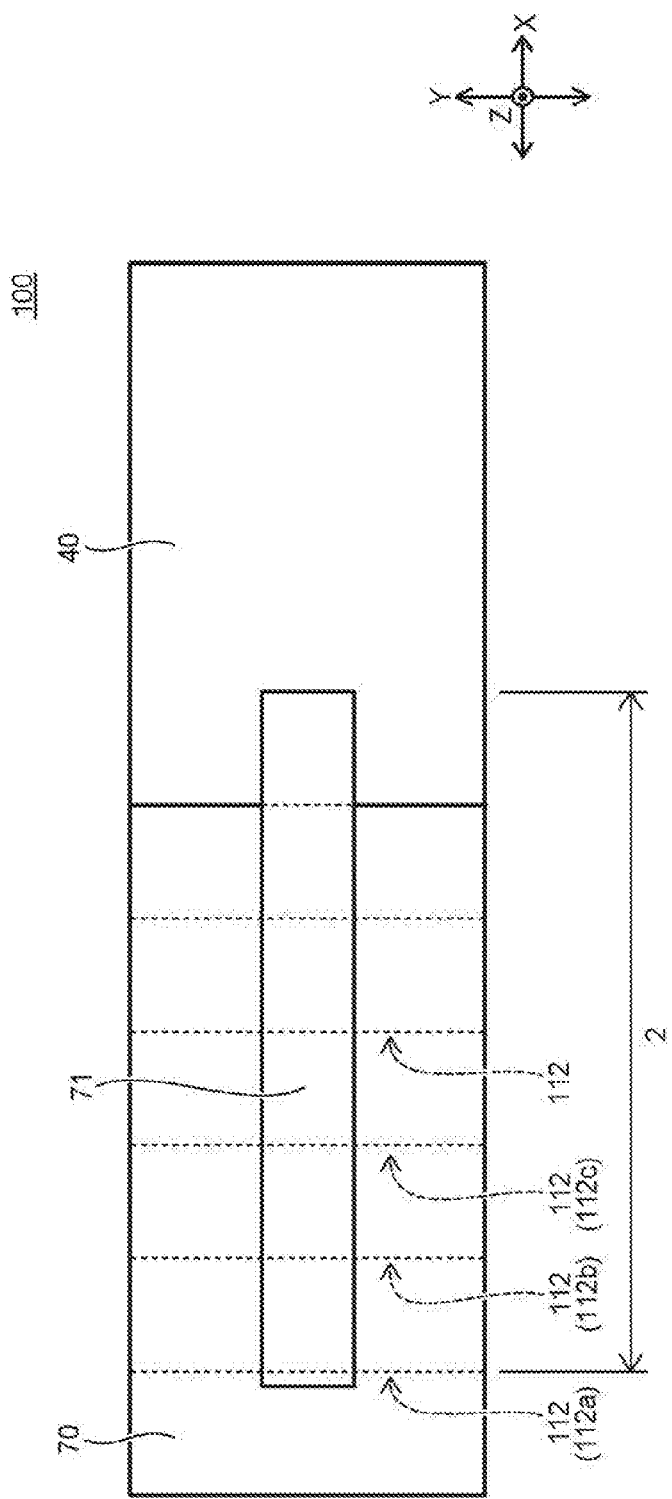

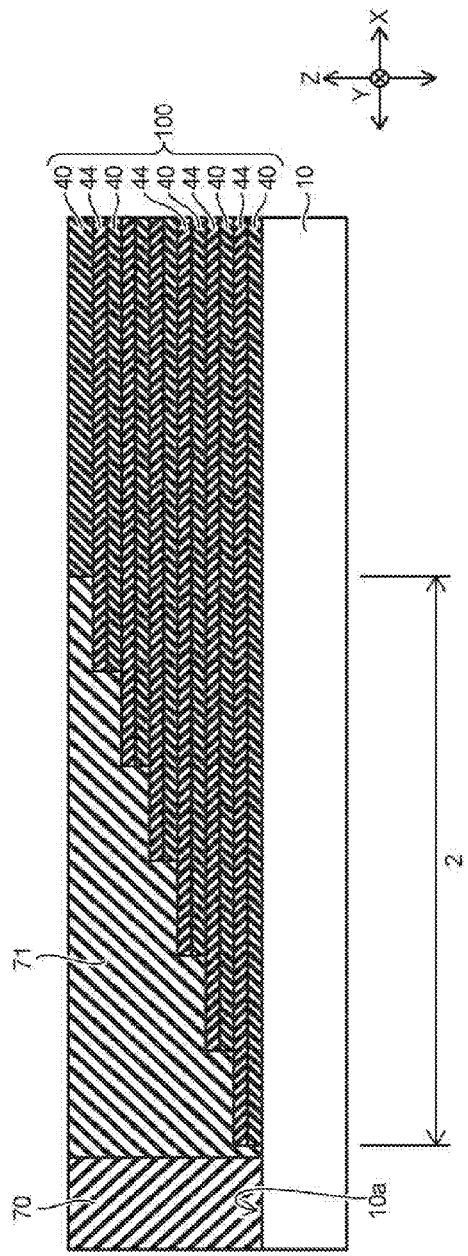
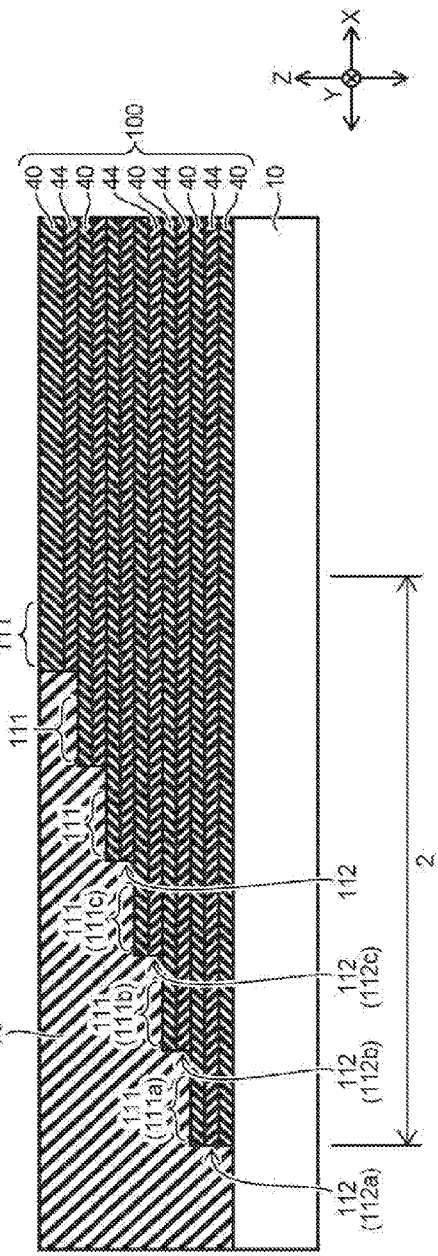
FIG. 25B
FIG. 25C

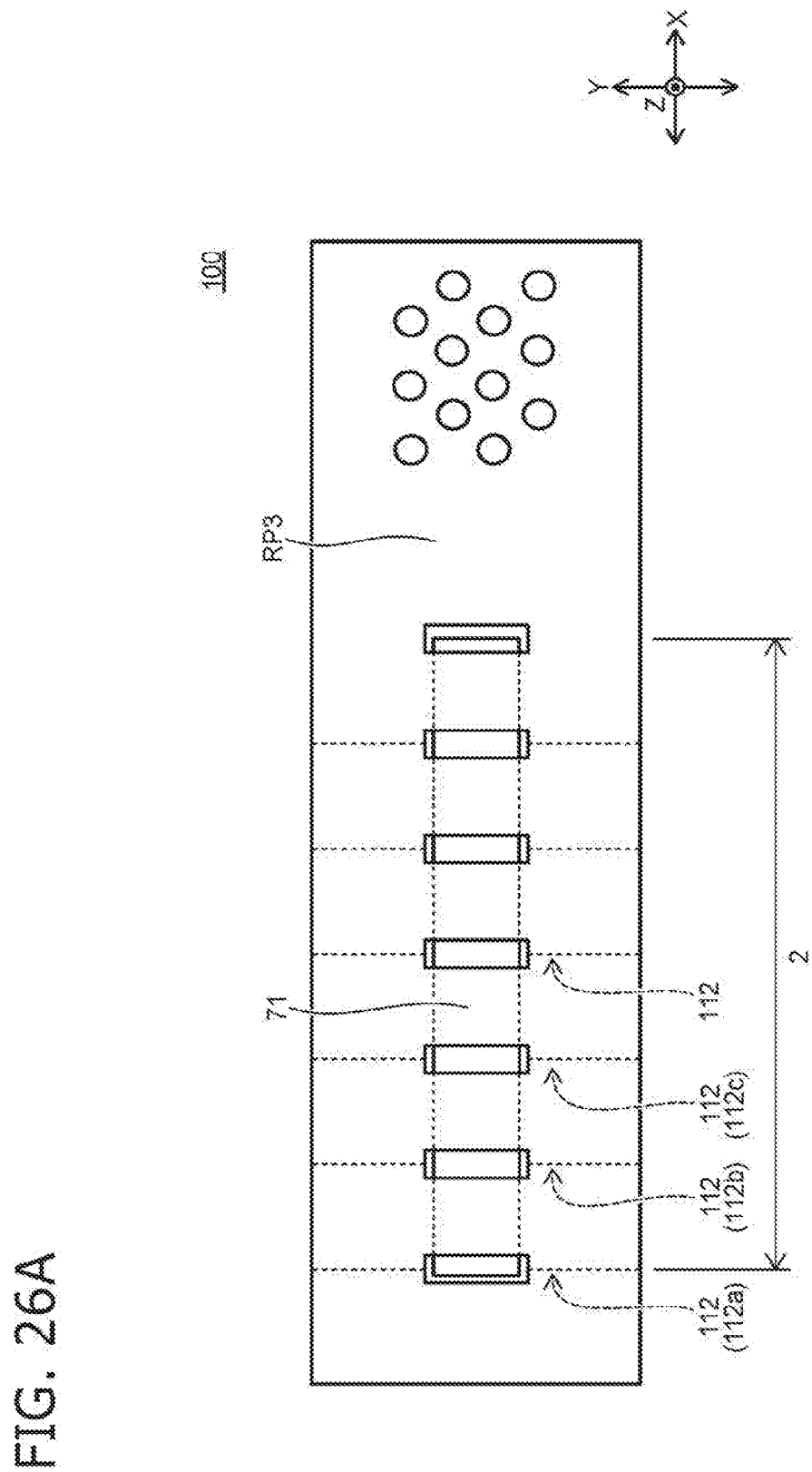

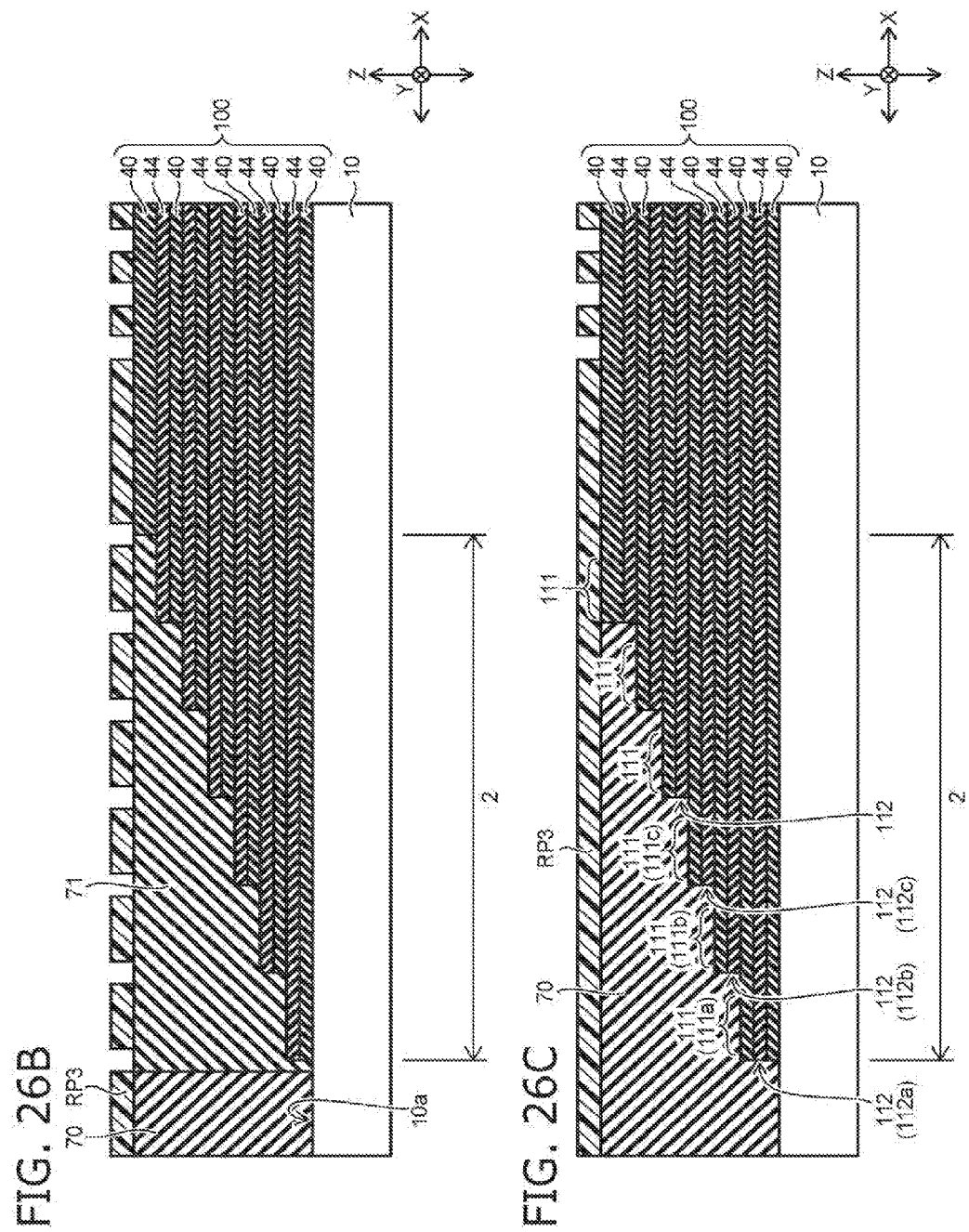

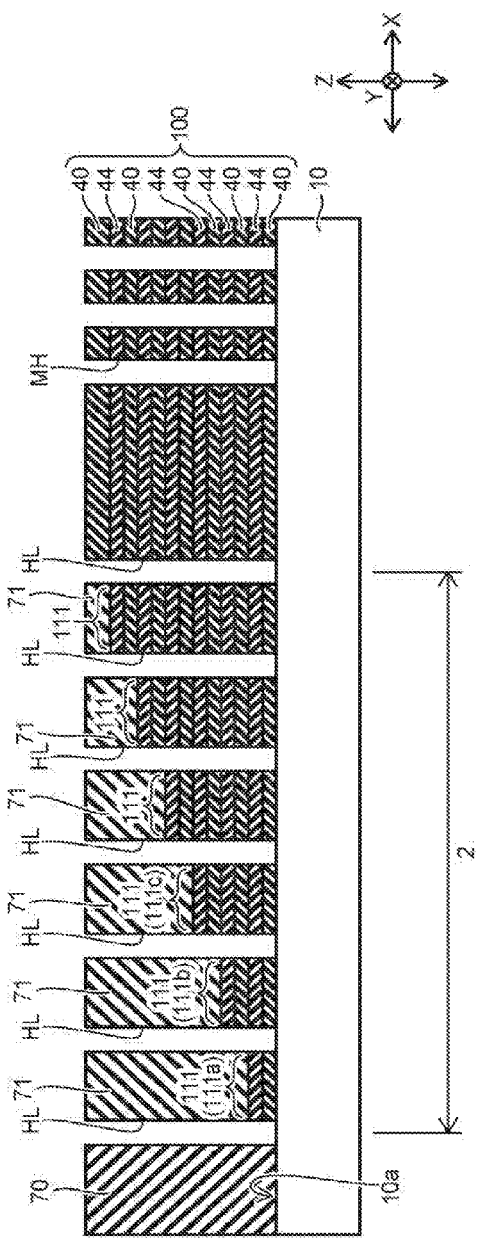
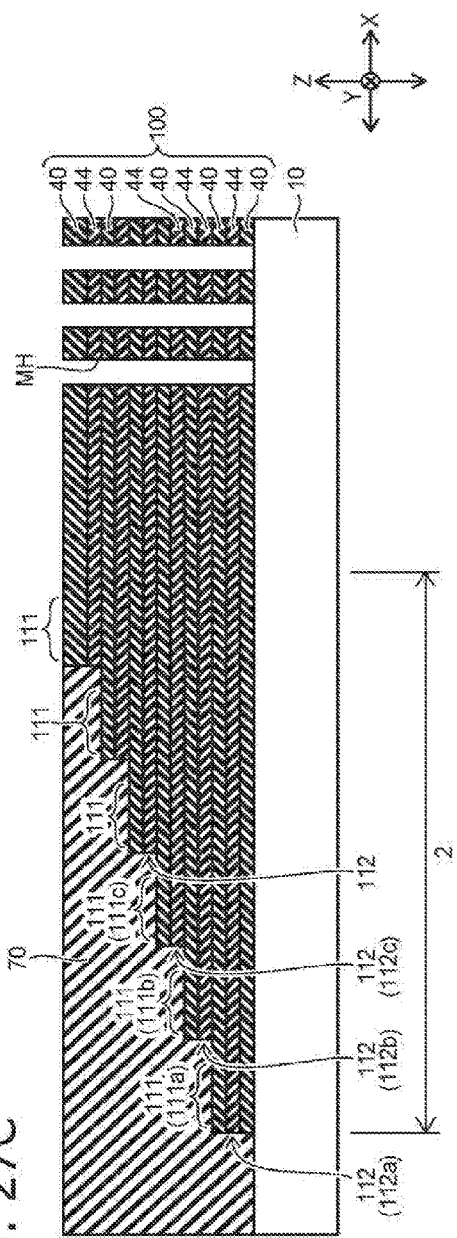
FIG. 27B
FIG. 27C

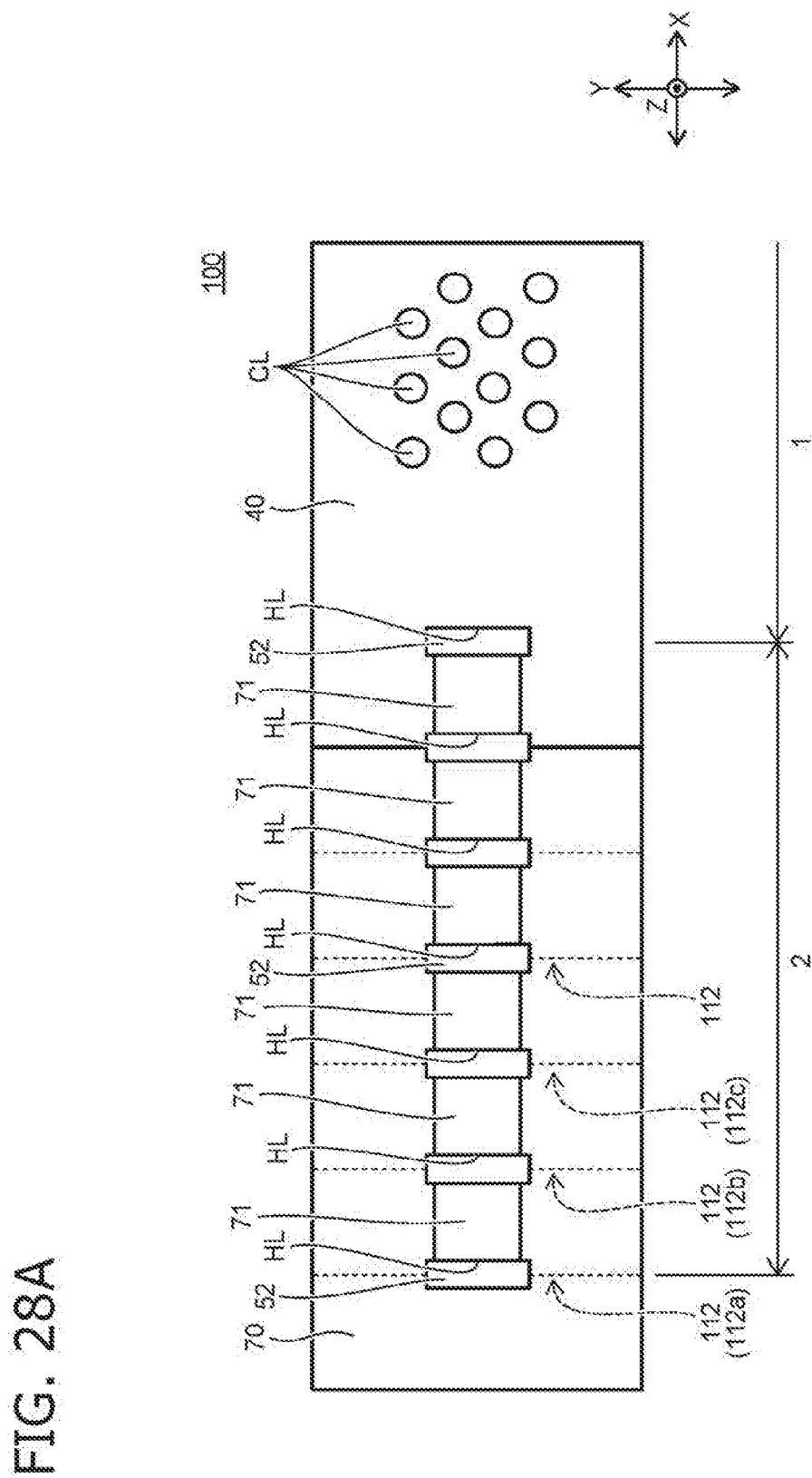

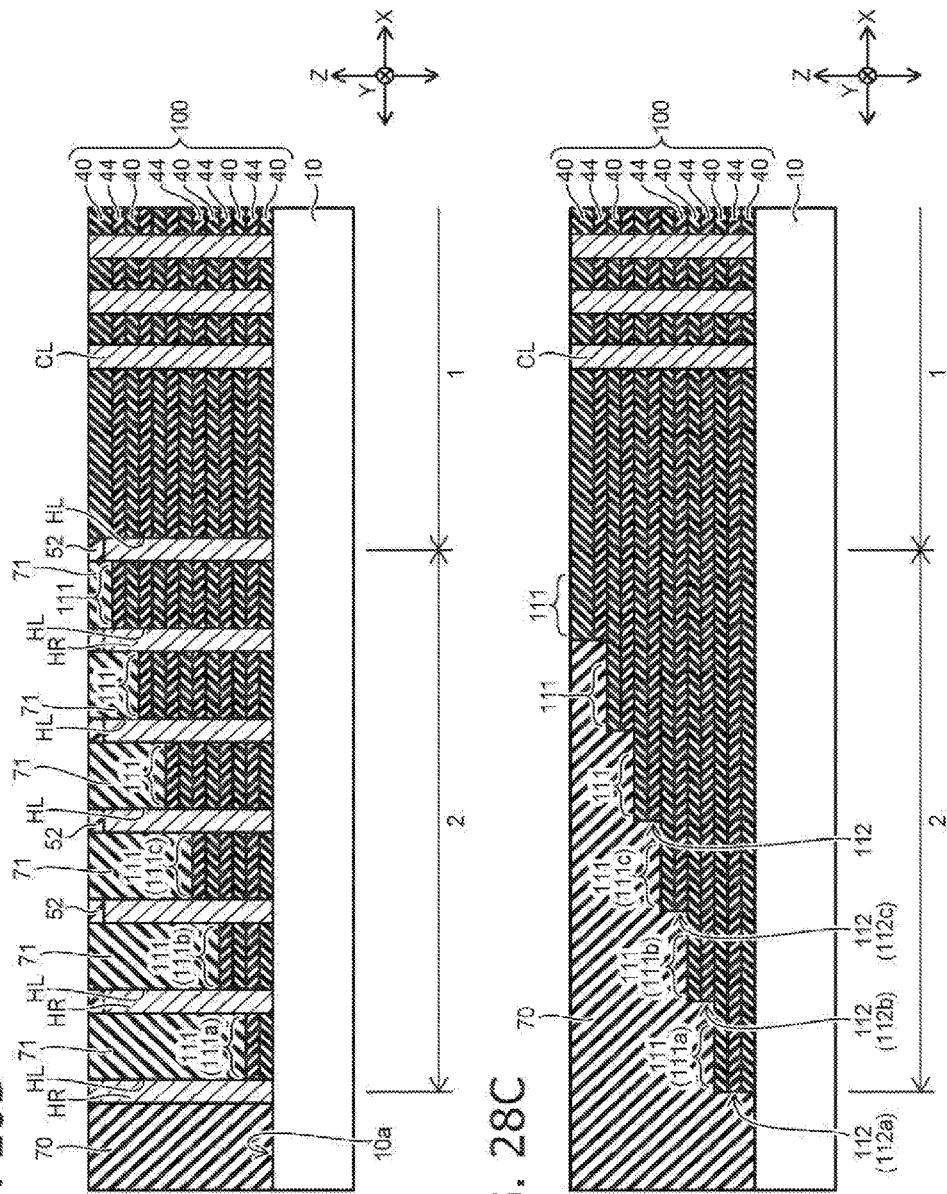

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/445,905, filed on Jan. 13, 2017; the entire contents of which are incorporated herein by reference.

FIELD

Embodiments described herein relate generally to a semiconductor device and a method for manufacturing the same.

BACKGROUND

A semiconductor memory device that has a three-dimensional structure has been proposed in which a memory hole is formed in a stacked body in which multiple electrode layers are stacked, and a charge storage film and a semiconductor film are provided to extend in the stacking direction of the stacked body inside the memory hole. Such a semiconductor memory device includes multiple memory cells connected in series between a drain-side selection transistor and a source-side selection transistor. The electrode layers of the stacked body are used as word lines and selection gates. The stacked body includes a staircase structure portion at an end portion of the stacked body. The staircase structure portion includes multiple terraces provided every electrode layer. The terraces are portions where the electrode layers are drawn out to the outside from the stacked body. It is desirable to reduce the planar size of the staircase structure portion to downscale the semiconductor memory device.

BRIEF DESCRIPTION OF THE DRAWINGS

FIG. 5 is a cross-sectional view along line V-V in FIG. 4;

FIG. 6 is a cross-sectional view along line VI-VI in FIG. 4;

FIG. 9A to FIG. 21E are drawings showing a method for manufacturing the semiconductor device according to the first embodiment;

FIG. 24A to FIG. 28C are drawings showing a method for manufacturing the semiconductor device according to the second embodiment.

DETAILED DESCRIPTION

Figure 1:
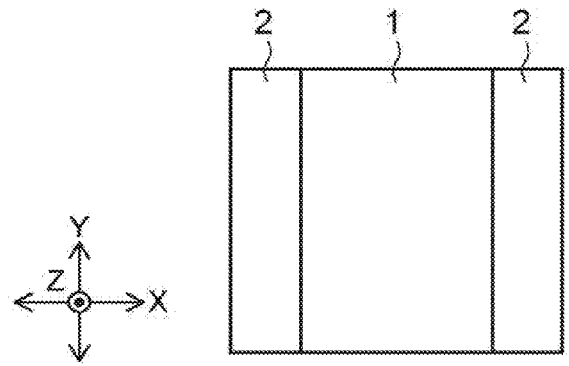
FIG. 1 is a plan view showing a planar layout of a semiconductor device according to a first embodiment.

A semiconductor device includes a base member, a first structure body, a second structure body, a first contact portion, a second contact portion, and a first post. The first structure body is provided above the base member. The first structure body includes a first electrode layer and a first insulator. The first structure body has a first terrace in a front surface of a first end portion of the first electrode layer. The second structure body is provided on the first structure body other than the first end portion. The second structure body includes a second electrode layer and a second insulator. The second structure body has a second terrace in a front surface of a second end portion of the second electrode layer. The side surface of the second electrode layer is at a first level difference between the first terrace and the second terrace. The first contact portion is provided on the first terrace. The first contact portion is electrically connected to the first electrode layer at the first terrace. The first contact portion extends in a first direction in which the base member, the first structure body, and the second structure body are arranged. The second contact portion is provided on the second terrace. The second contact portion is electrically connected to the second electrode layer at the second terrace. The second contact portion extends in the first direction. The first post is disposed between the first contact portion and the second contact portion, is provided inside the first structure body, and contacts the base member. The first post crosses the first level difference.

Embodiments will now be described with reference to the drawings. The same components in the drawings are marked with the same reference numerals. The semiconductor device according to the embodiment is a semiconductor memory device including a memory cell array.

First Embodiment

<Semiconductor Device>

FIG. 1 is a plan view showing a planar layout of a semiconductor device according to a first embodiment.

The semiconductor device according to the first embodiment includes a memory cell array 1 and a staircase portion 2. The memory cell array 1 and the staircase portion 2 are provided on a substrate. The staircase portion 2 is provided on the outer side of the memory cell array 1. In FIG. 1, two mutually-orthogonal directions parallel to a major surface of the substrate are taken as an X-direction and a Y-direction; and a direction orthogonal to both the X-direction and the Y-direction is taken as a Z-direction. The staircase portion 2 is provided on at least the two X-direction sides of the memory cell array 1.

Figure 2:
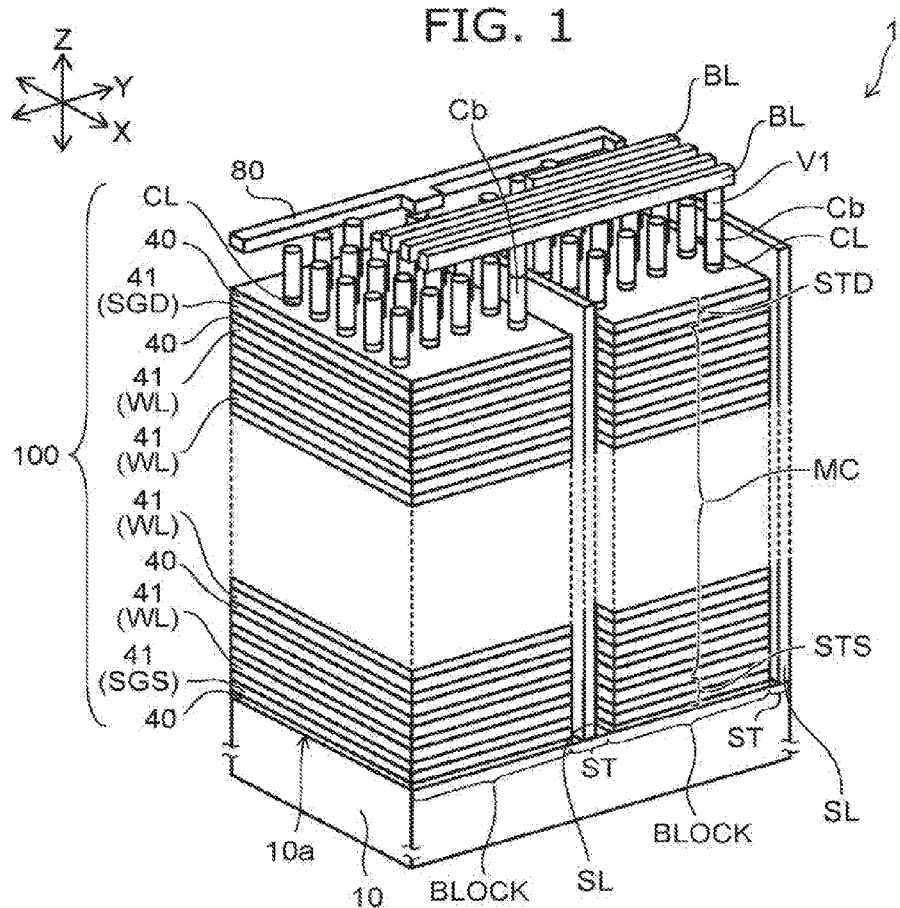
FIG. 2 is a perspective view of a memory cell array of the semiconductor device according to the first embodiment.

FIG. 2 is a perspective view of the memory cell array of the semiconductor device according to the first embodiment.

As shown in FIG. 2, the memory cell array 1 includes a stacked body 100. The stacked body 100 is provided on a major surface 10a of a substrate 10. The substrate 10 is used as a base member. In the specification, "up" refers to a direction of the Z-directions from the substrate 10 toward the stacked body 100; and "down" refers to a direction of the Z-directions from the stacked body 100 toward the substrate 10. The substrate 10 includes, for example, a crystallized p-type silicon layer. The stacked body 100 includes multiple insulators 40 and multiple electrode layers 41 stacked alternately along the Z-direction. The insulators 40 include an insulating material. The insulating material is, for example, silicon oxide (SiO). The insulators 40 may be, for example, air gaps. The electrode layers 41 include a conducting material. The conducting material is, for example, polysilicon (Si), tungsten (W), molybdenum (Mo), etc. The multiple electrode layers 41 include at least one source-side selection gate SGS, multiple word lines WL, and at least one drain-side selection gate SGD. The source-side selection gate SGS is a gate electrode of a source-side selection transistor STS. The word lines WL are gate electrodes of memory cells MC. The drain-side selection gate SGD is a gate electrode of a drain-side selection transistor STD. The number of stacks of the electrode layers 41 is arbitrary.

The source-side selection gate SGS is provided in a lower region of the stacked body 100. The drain-side selection gate SGD is provided in an upper region of the stacked body 100. The lower region refers to a region on the side of the stacked body 100 proximal to the substrate 10; and the upper region refers to a region on the side of the stacked body 100 distal to the substrate 10. For example, at least one of the multiple electrode layers 41 including the electrode layer 41 most proximal to the substrate 10 is used as the source-side selection gate SGS. At least one of the multiple electrode layers 41 including the electrode layer 41 most distal to the substrate 10 is used as the drain-side selection gate SGD. The word lines WL are provided in an intermediate region between the lower region and the upper region of the stacked body 100. In the stacked body 100, the drain-side selection transistor STD, the multiple memory cells MC, and the source-side selection transistor STS that are arranged in the Z-direction are connected in series via a semiconductor body 20 of a columnar portion CL described below and are included in one memory string. For example, the memory strings have a staggered arrangement in a planar direction parallel to the XY plane; and the multiple memory cells MC are provided three-dimensionally in the X-direction, the Y-direction, and the Z-direction.

A slit ST and the columnar portion CL are provided inside the stacked body 100. The columnar portion CL extends in the Z-direction, i.e., the stacking direction of the stacked body 100. The slit ST spreads along the XZ plane. The lower end of the slit ST reaches the substrate 10. The slit ST electrically divides the stacked body 100 into multiple regions along the Y-direction. For example, the divided regions of the stacked body 100 are called "blocks." The block is, for example, the minimum unit of the information erase. The erase size is set to one block or is set by combining multiple blocks. For example, a source line SL is provided inside the slit ST. The source line SL is provided inside the slit ST in a state of being electrically insulated from the stacked body 100. For example, the lower end of the source line SL is electrically connected to a source region of the source-side selection transistor STS via the substrate 10. The upper end of the source line SL is connected to a shunt interconnect 80. The shunt interconnect 80 electrically provides a shunt connection of the multiple source lines SL along the Y-direction.

For example, the upper end of the columnar portion CL is electrically connected to a bit line BL via a contact Cb and a conductive body V1. For example, the bit line BL extends in the Y-direction crossing the slit ST.

Figure 3A:
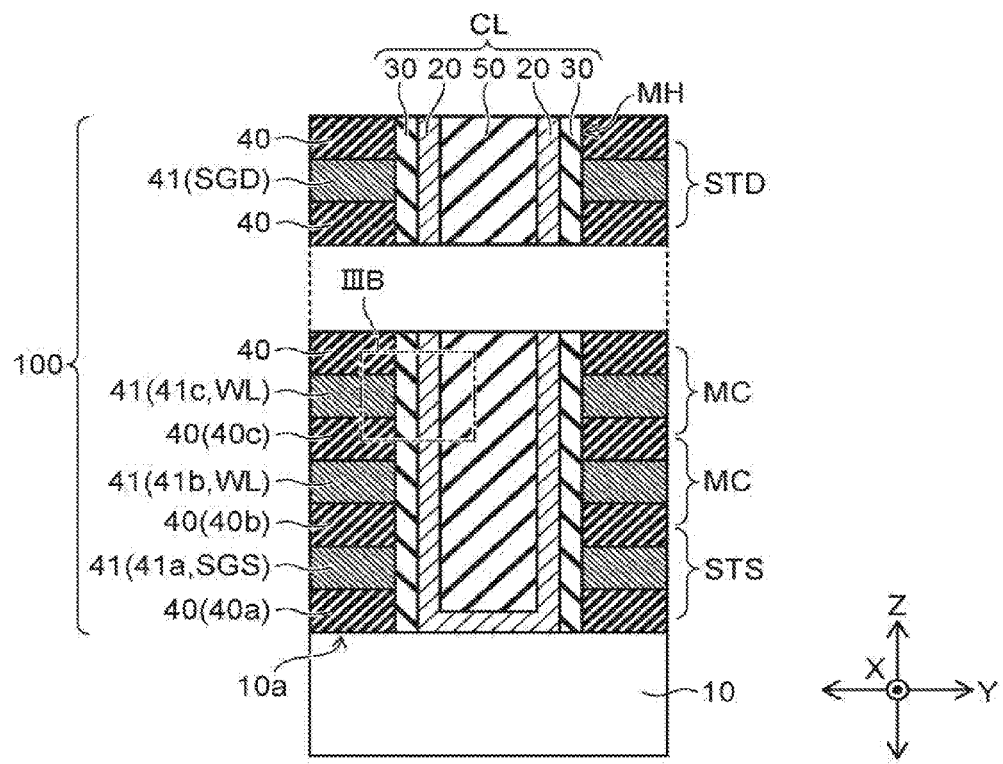
FIG. 3A is a cross-sectional view showing an enlargement of a columnar portion.
Figure 3B:
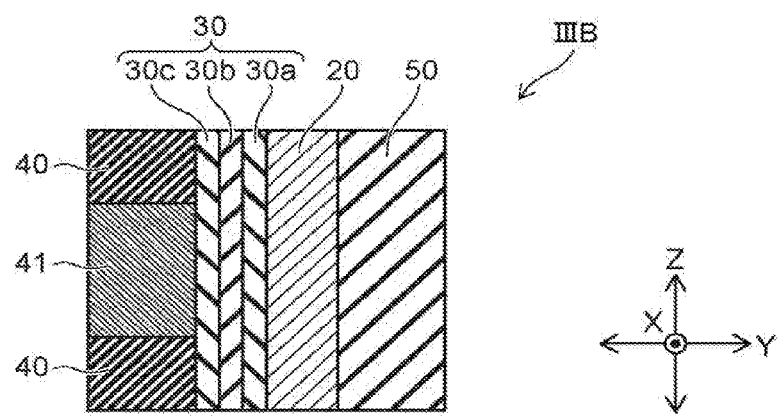
FIG. 3B is a cross-sectional view showing region IIIB of FIG. 3A.

FIG. 3A is a cross-sectional view showing an enlargement of the columnar portion; and FIG. 3B is a cross-sectional view showing region IIIB of FIG. 3A.

As shown in FIG. 3A, a memory hole MH is provided inside the stacked body 100. The memory hole MH is an opening extending in the Z-direction. The columnar portion CL is provided inside the memory hole MH. The memory hole MH is formed in a circular columnar configuration or an elliptical columnar configuration. The lower end of the memory hole MH reaches the substrate 10.

The columnar portion CL includes a memory film 30, the semiconductor body 20, and a core member 50. The core member 50 includes, for example, an insulating material such as silicon oxide, etc. The configuration of the core member 50 is a columnar configuration extending in the Z-direction.

The semiconductor body 20 is provided between the core member 50 and the stacked body 100. The semiconductor body 20 includes, for example, a semiconductor material such as crystallized p-type silicon, etc. The semiconductor body 20 is electrically connected to the substrate 10. The configuration of the semiconductor body 20 is, for example, a tubular configuration in which the lower end is plugged.

The memory film 30 is provided between the semiconductor body 20 and the stacked body 100. The configuration of the memory film 30 is, for example, a tubular configuration in which the upper and lower ends are open.

Hereinbelow, three electrode layers 41 of the multiple electrode layers 41 are illustrated as an electrode layer 41*a*, an electrode layer 41*b*, and an electrode layer 41*c*. For example, the electrode layer 41*a* is the electrode layer 41 of the lowermost layer; the electrode layer 41*b* is the electrode layer 41 of the second layer from the bottom; and the electrode layer 41*c* is the electrode layer 41 of the third layer from the bottom. In such a case, the memory film 30 is provided between the semiconductor body 20 and the electrode layer 41*a*, between the semiconductor body 20 and the electrode layer 41*b*, and between the semiconductor body 20 and the electrode layer 41*c*. Similarly below, there are cases where several component members are described in detail as examples of component members that are multiply provided. In such a case, differentiation is provided by adding an alphabet character (a, b, c, . . . ) or a numeral (1, 2, 3, . . . ) at the end part of the reference numeral (the numerals or the alphabet characters) of each component member.

In the memory film 30 as shown in FIG. 3B, a tunneling insulating film 30*a*, a charge storage portion 30*b*, and a blocking insulating film 30*c* are stacked in this order from the inner side, i.e., the semiconductor body 20 side, toward the outer side, i.e., the stacked body 100 side. Although the tunneling insulating film 30*a* normally is insulative, the tunneling insulating film 30*a* is a film in which a tunneling current flows when a prescribed voltage within the range of the drive voltage of the semiconductor device is applied and is, for example, a single-layer silicon oxide film or an ONO film in which a silicon oxide layer, a silicon nitride layer, and a silicon oxide layer are stacked in this order. The charge storage portion 30*b* is a portion that can store charge and is made of, for example, a material having trap sites of electrons and is made of, for example, silicon nitride. Or, the charge storage portion 30*b* may be a floating gate made of a conductive material. The blocking insulating film 30*c* is a film in which a current substantially does not flow even when a voltage within the range of the drive voltage of the semiconductor device is applied. The threshold voltage of the memory cell MC changes due to the existence or absence of the charge or the amount of the charge inside the charge storage portion 30*b*. Thereby, the memory cell MC stores information.

A semiconductor pillar (not illustrated) may be provided between the columnar portion CL and the substrate 10. In the case where the semiconductor pillar is provided, for example, the semiconductor body 20 is electrically connected to the substrate 10 via the semiconductor pillar. The semiconductor pillar is provided at the bottom of the memory hole MH. The semiconductor pillar includes, for example, crystallized p-type silicon. The semiconductor pillar contacts the substrate 10 and is included in a portion of the substrate 10. For example, the semiconductor pillar opposes the electrode layer 41a (the source-side selection gate SGS) with a gate insulating film (not illustrated) interposed.

Figure 4:
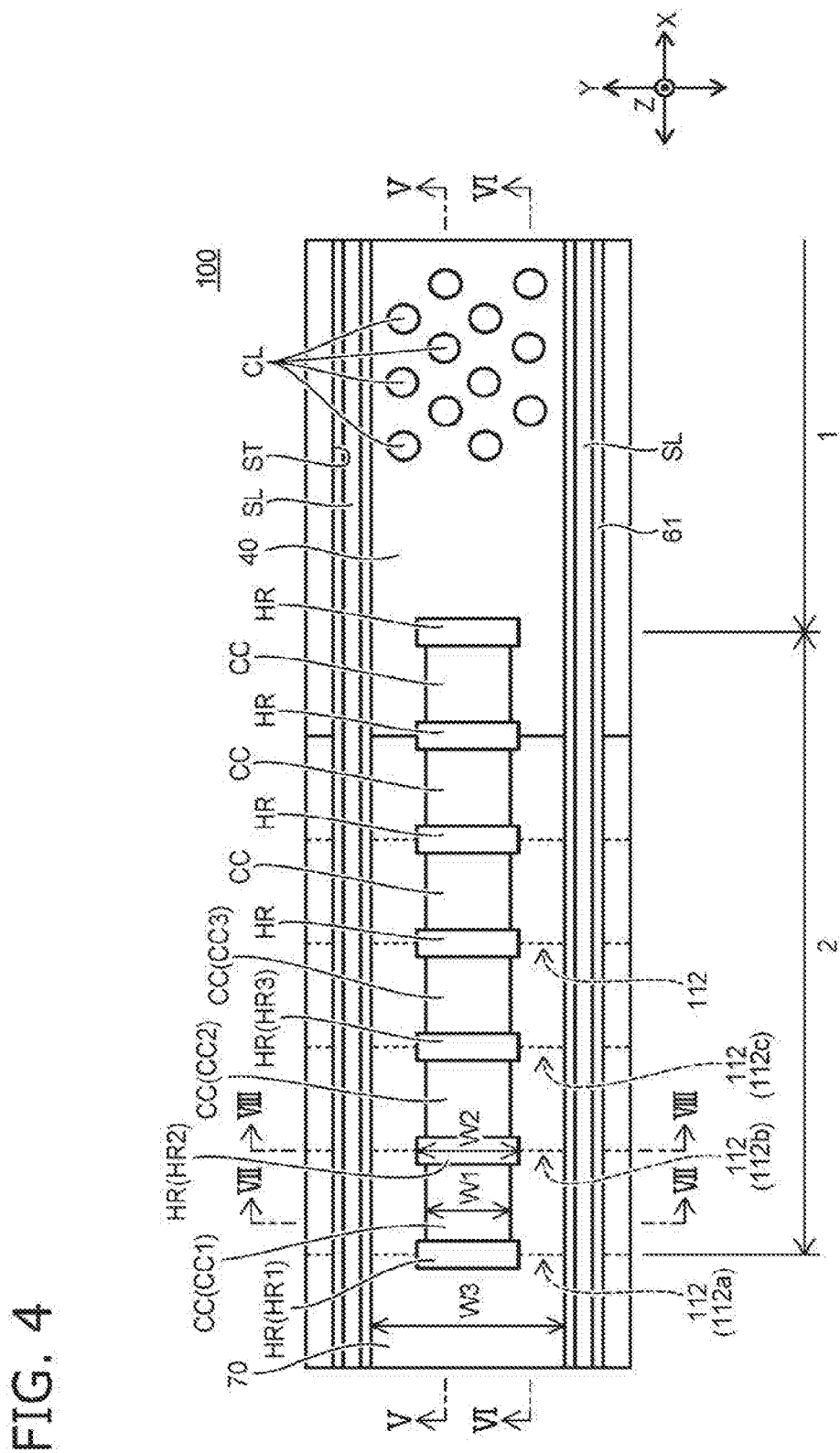
FIG. 4 is a plan view of the memory cell array and a staircase portion of the semiconductor device according to the first embodiment.
Figure 7:
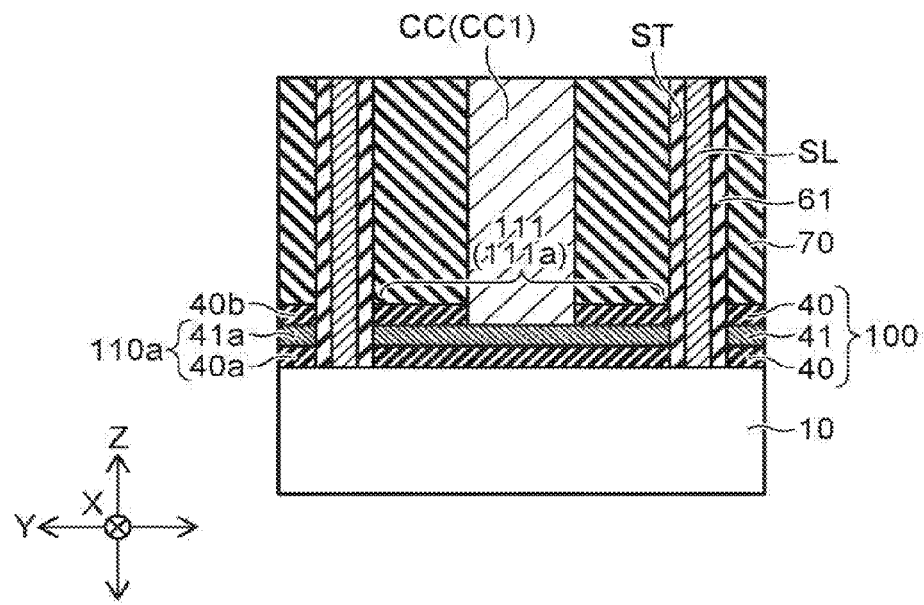
FIG. 7 is a cross-sectional view along line VII-VII in FIG. 4.
Figure 8:
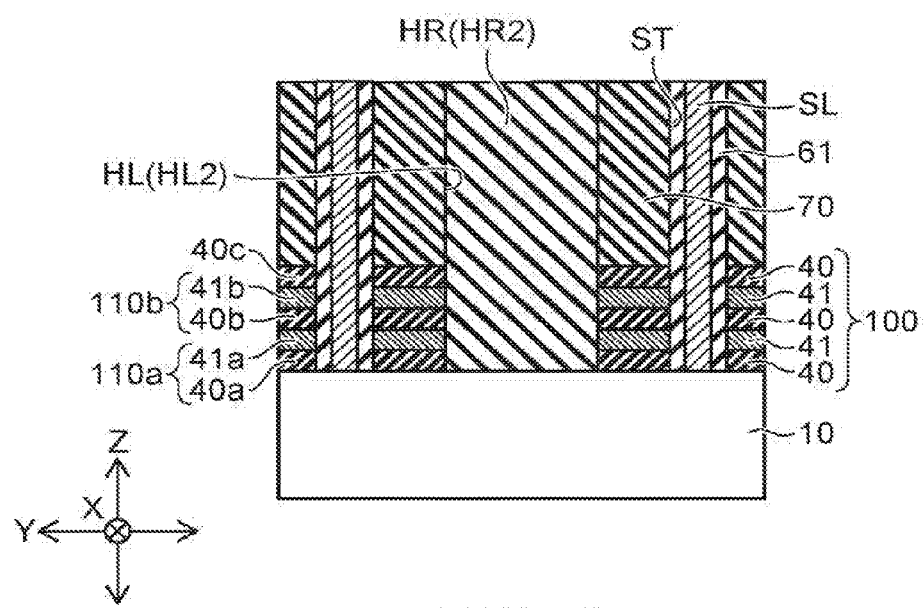
FIG. 8 is a cross-sectional view along line VIII-VIII in FIG. 4.
Figure 9A:
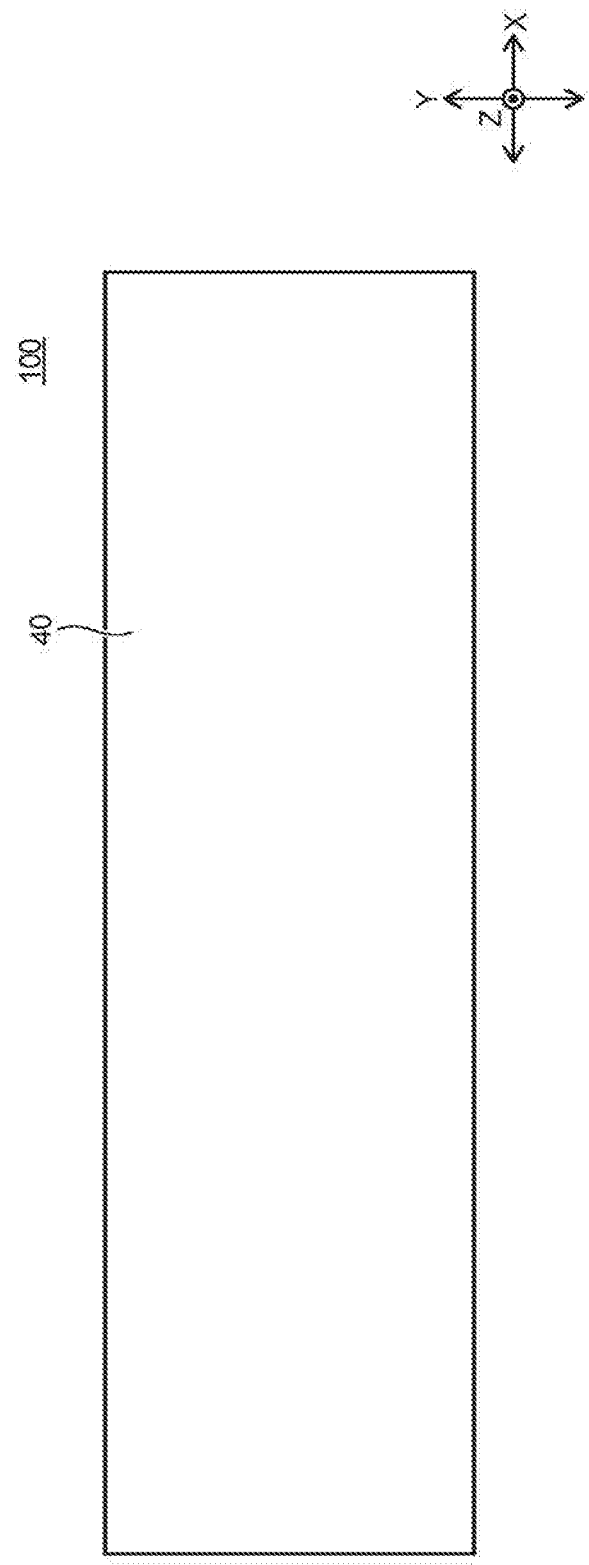
Figure 9B:
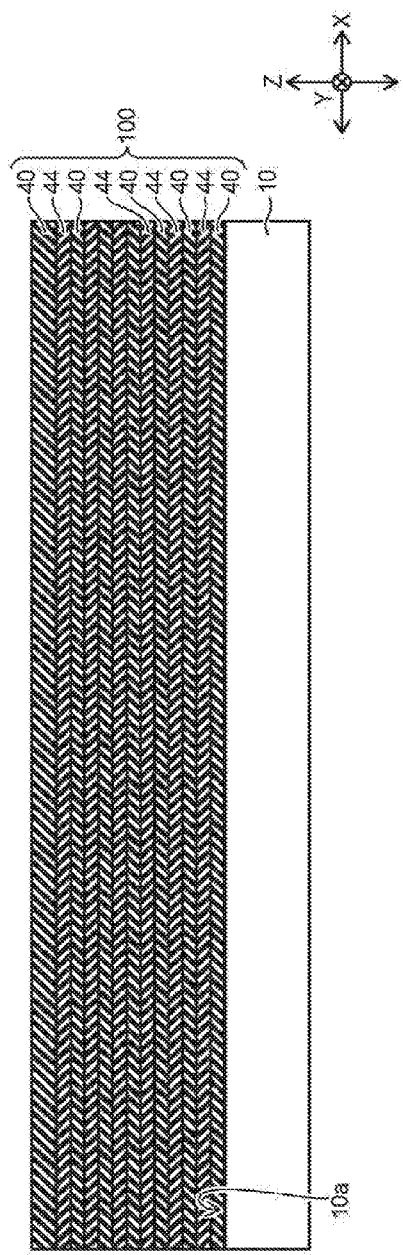
Figure 9C:
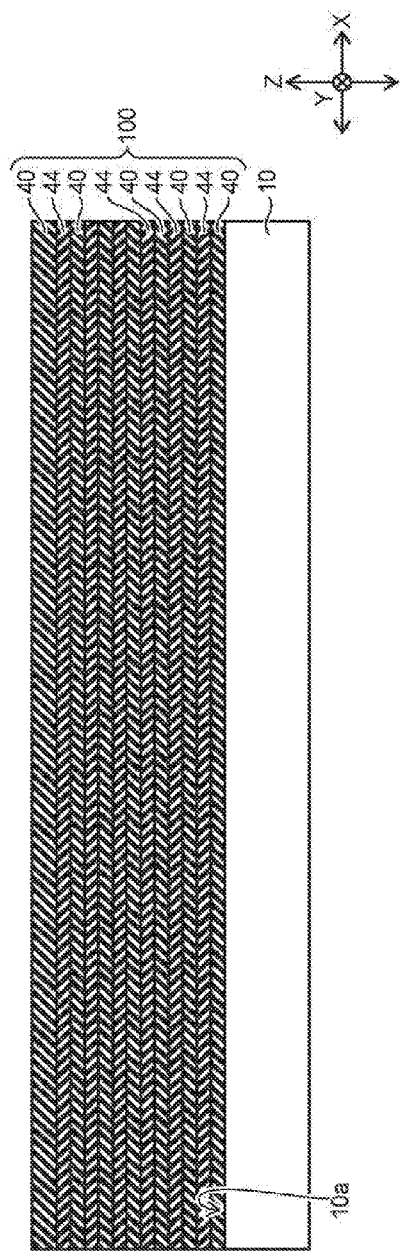
Figure 9D:
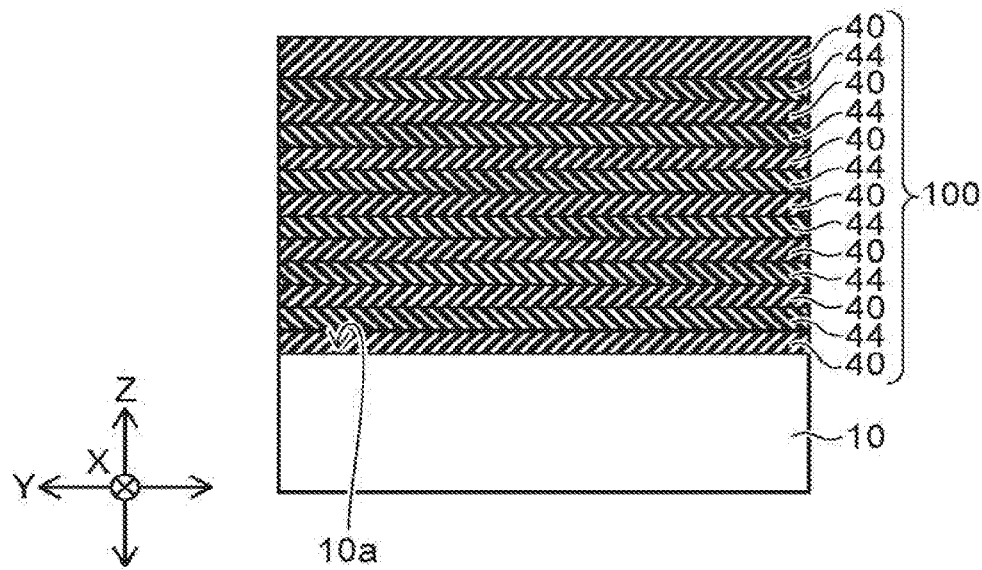
Figure 9E:
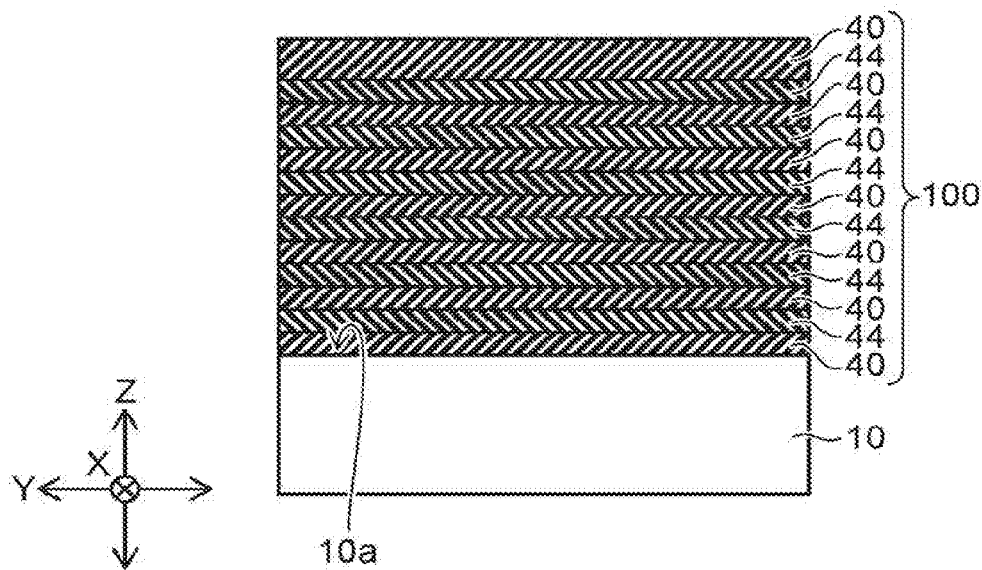
Figure 10B:
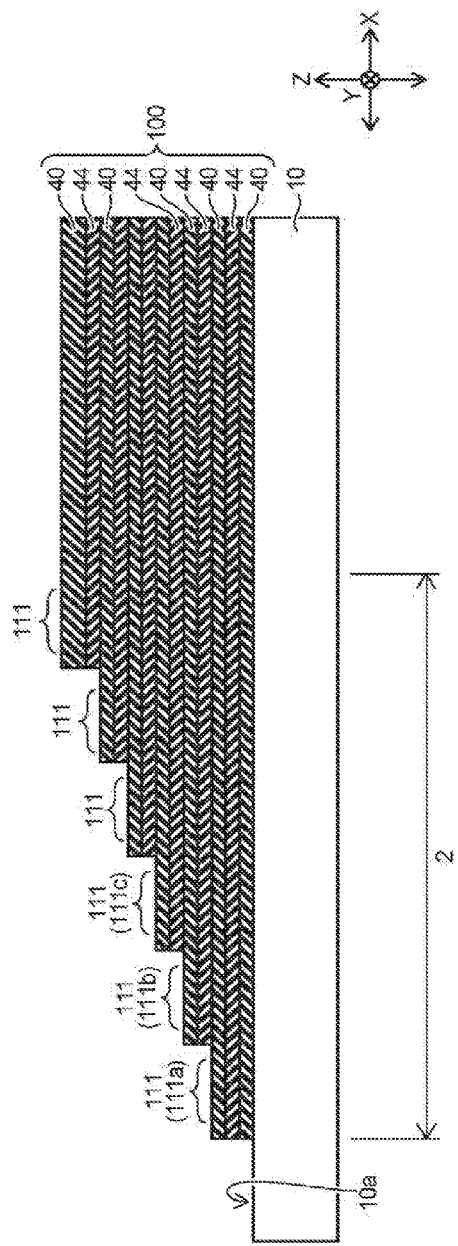
Figure 10C:
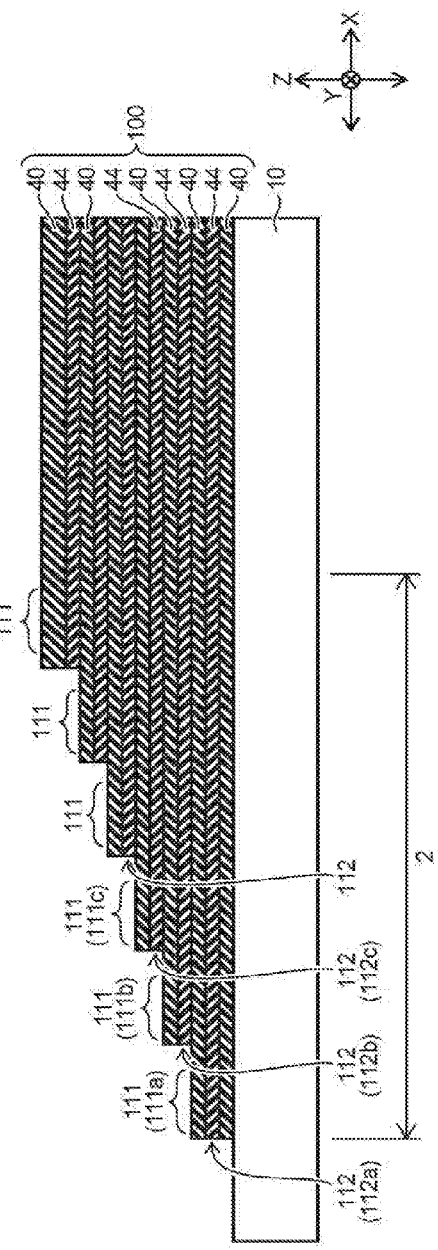
Figure 10D:
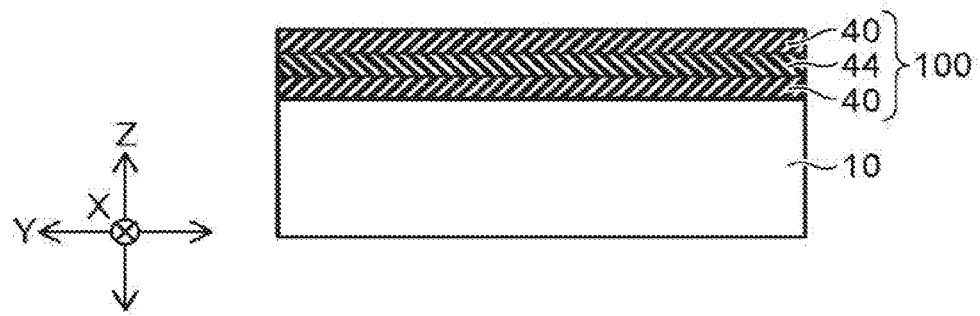
Figure 10E:
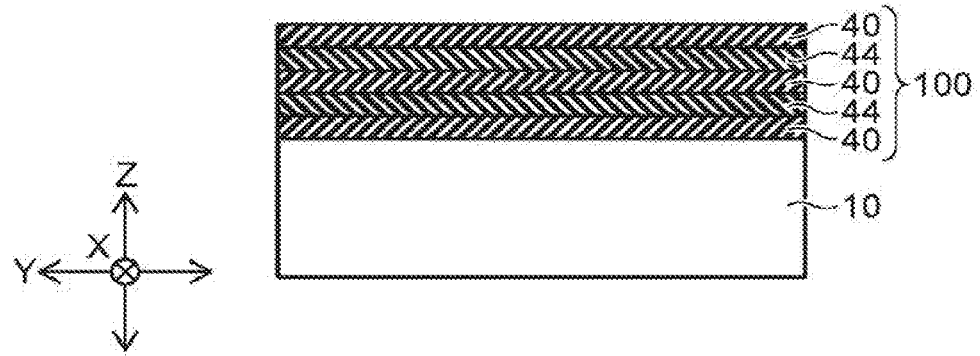
Figure 11D:
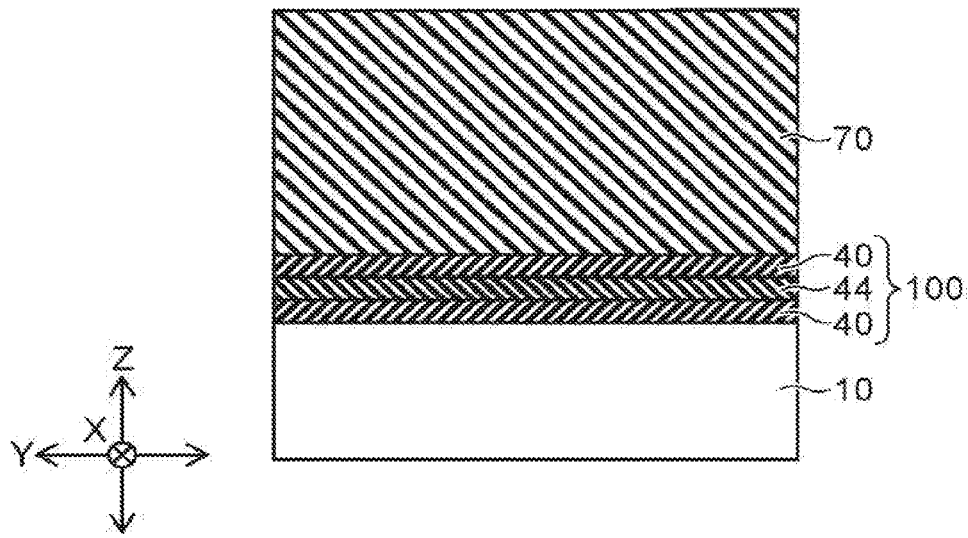
Figure 11E:
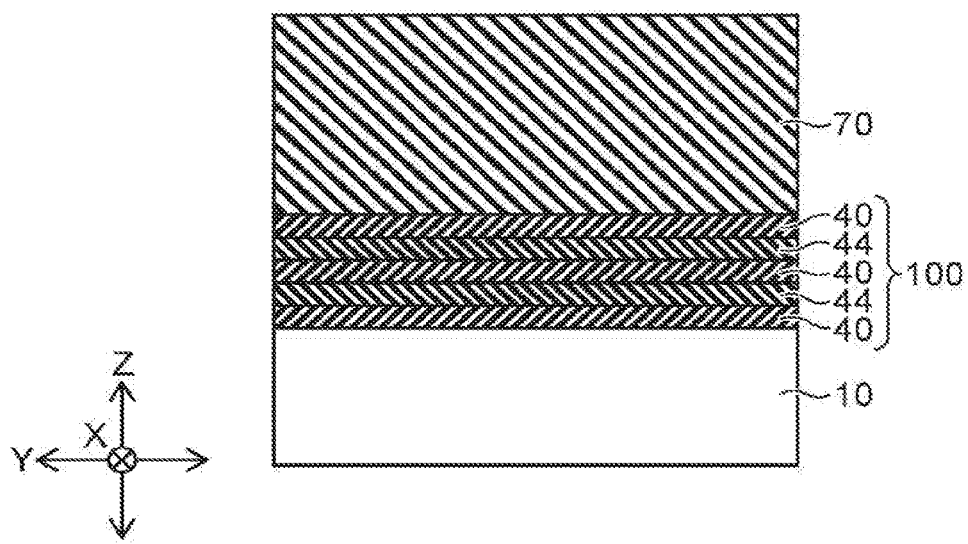
Figure 13A:
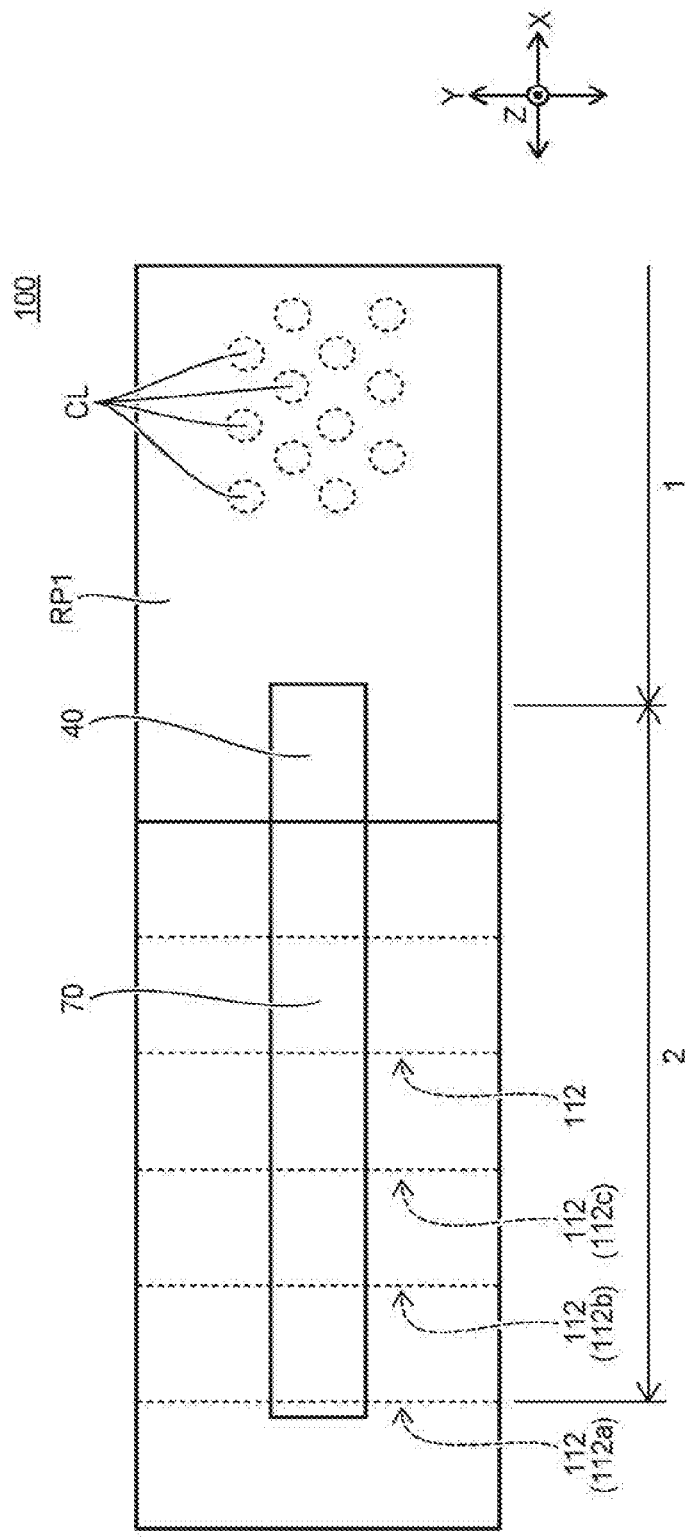
Figures 13B, 13C:
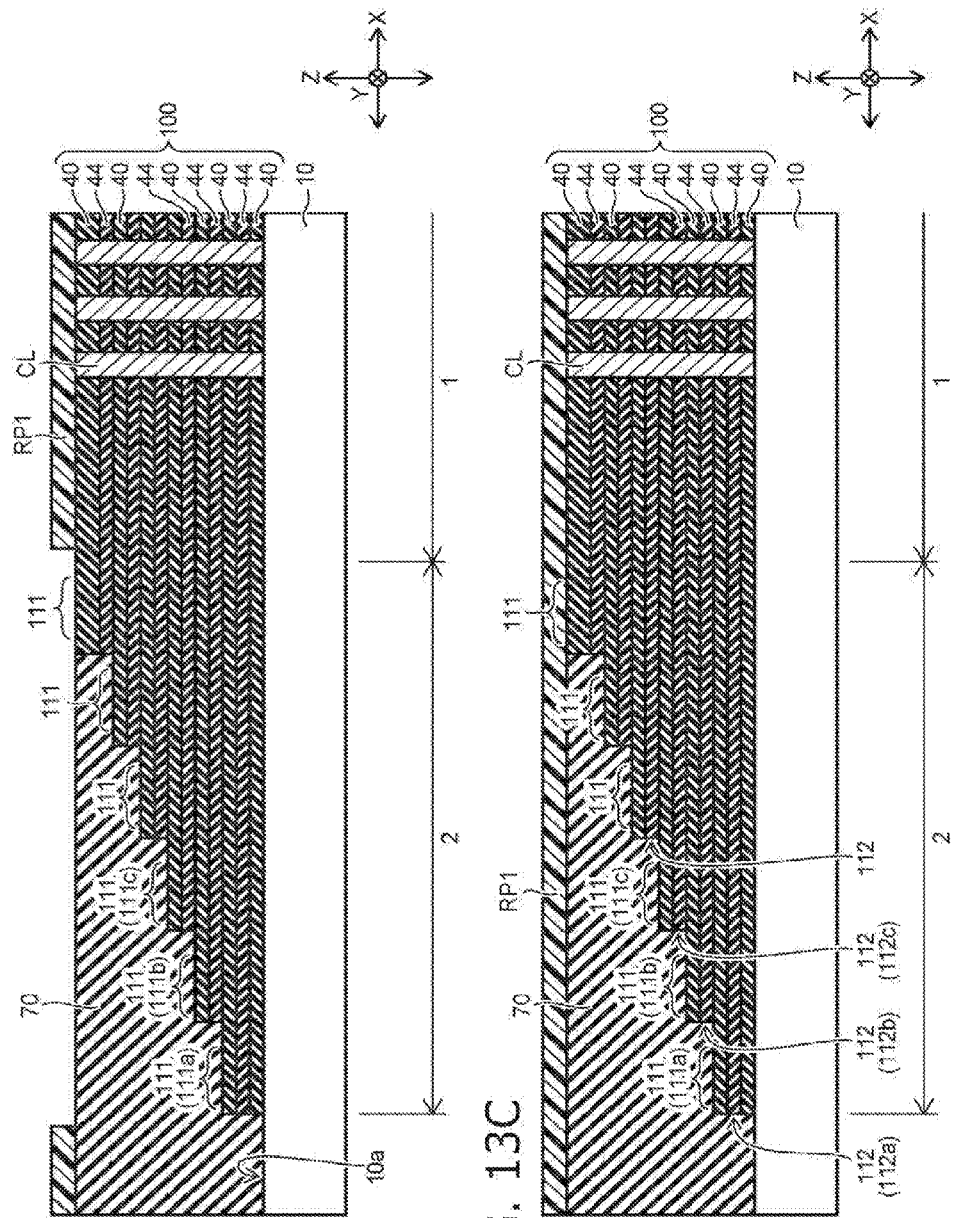
Figure 13D:
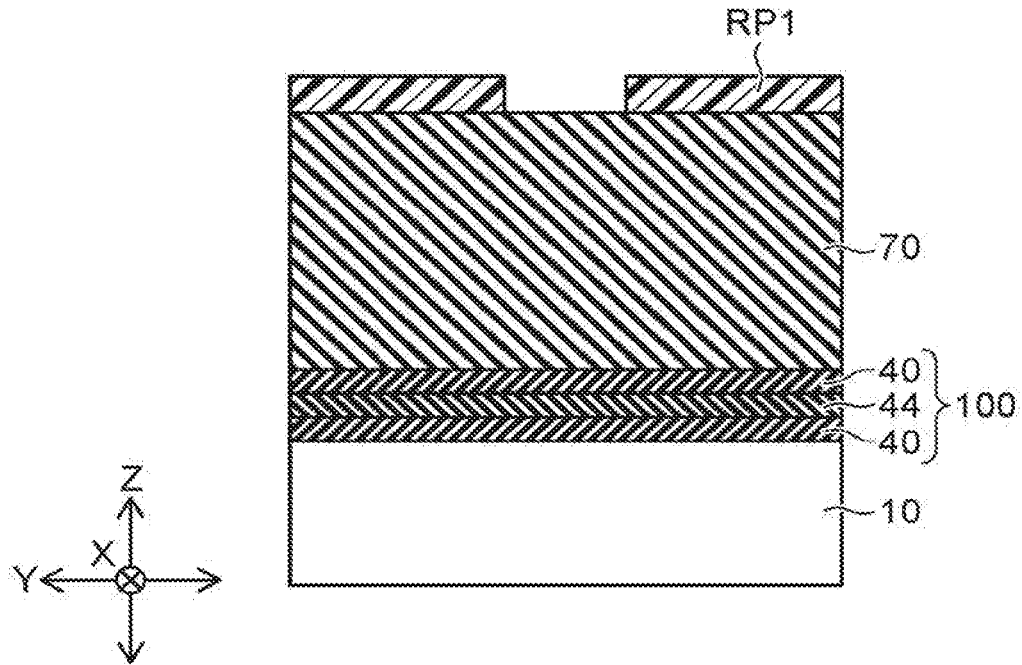
Figure 13E:
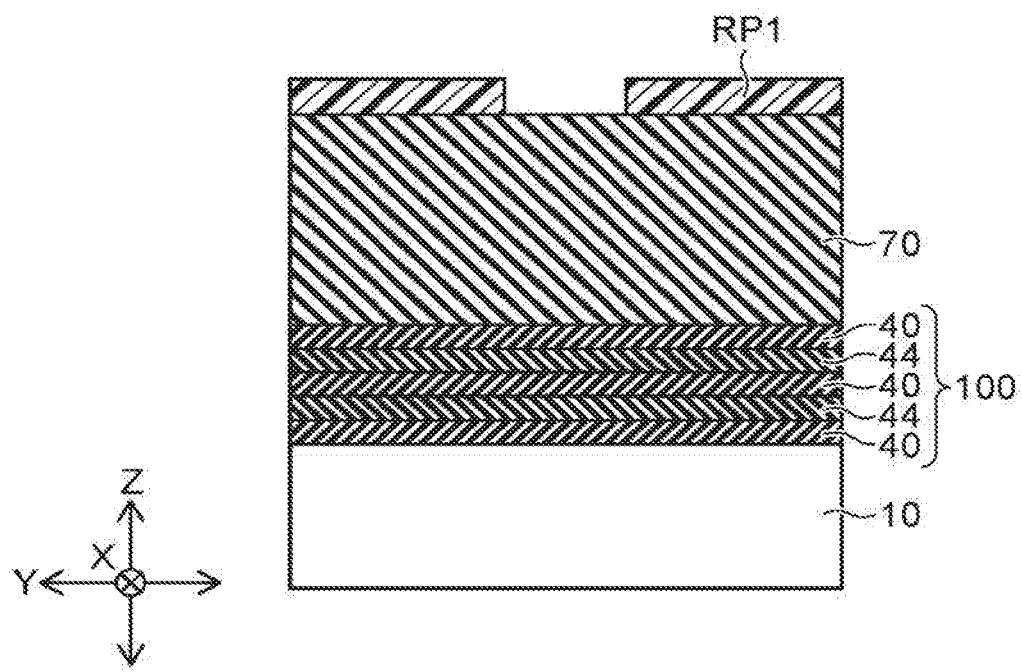
Figure 14D:
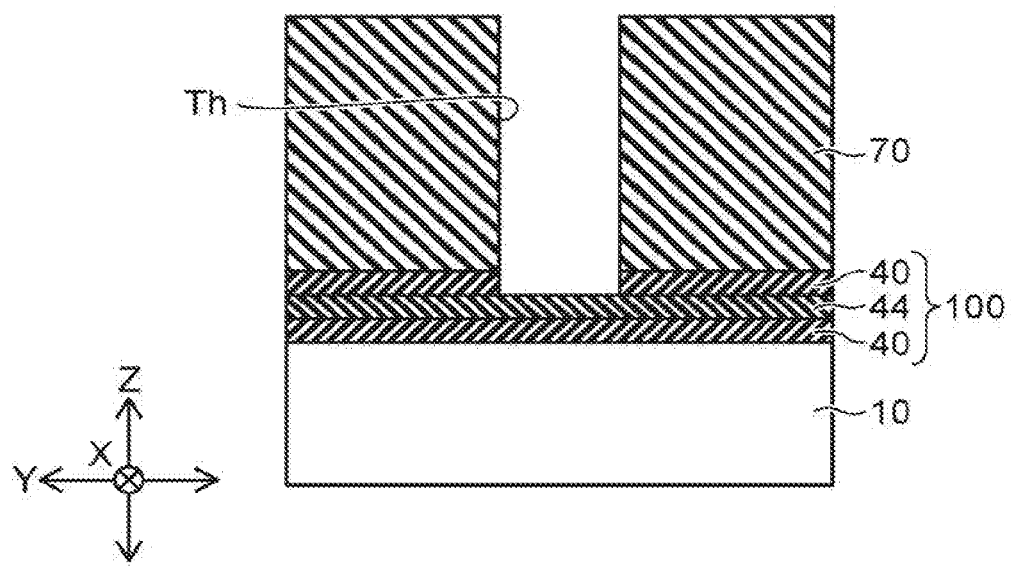
Figure 14E:
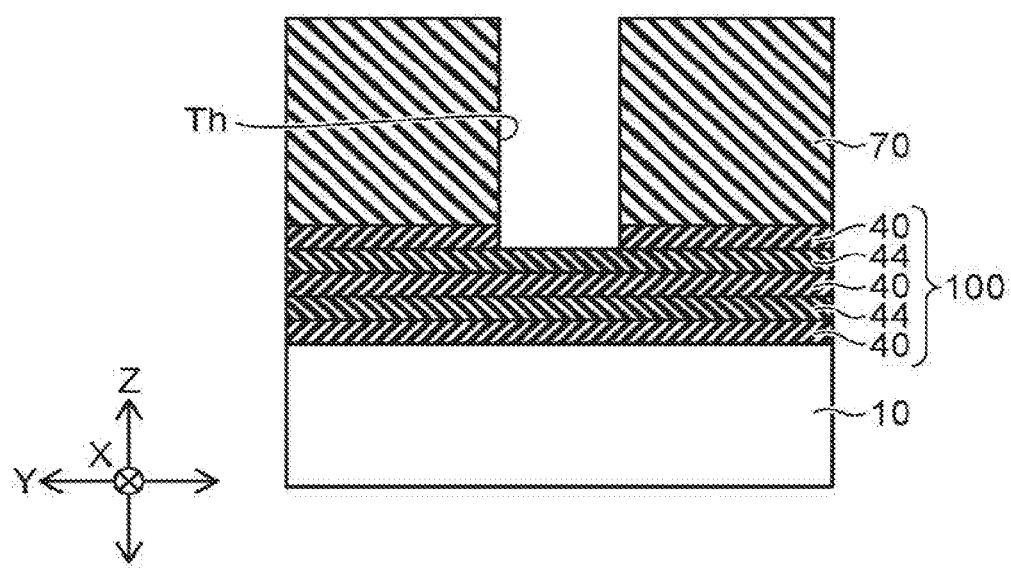
Figure 15A:
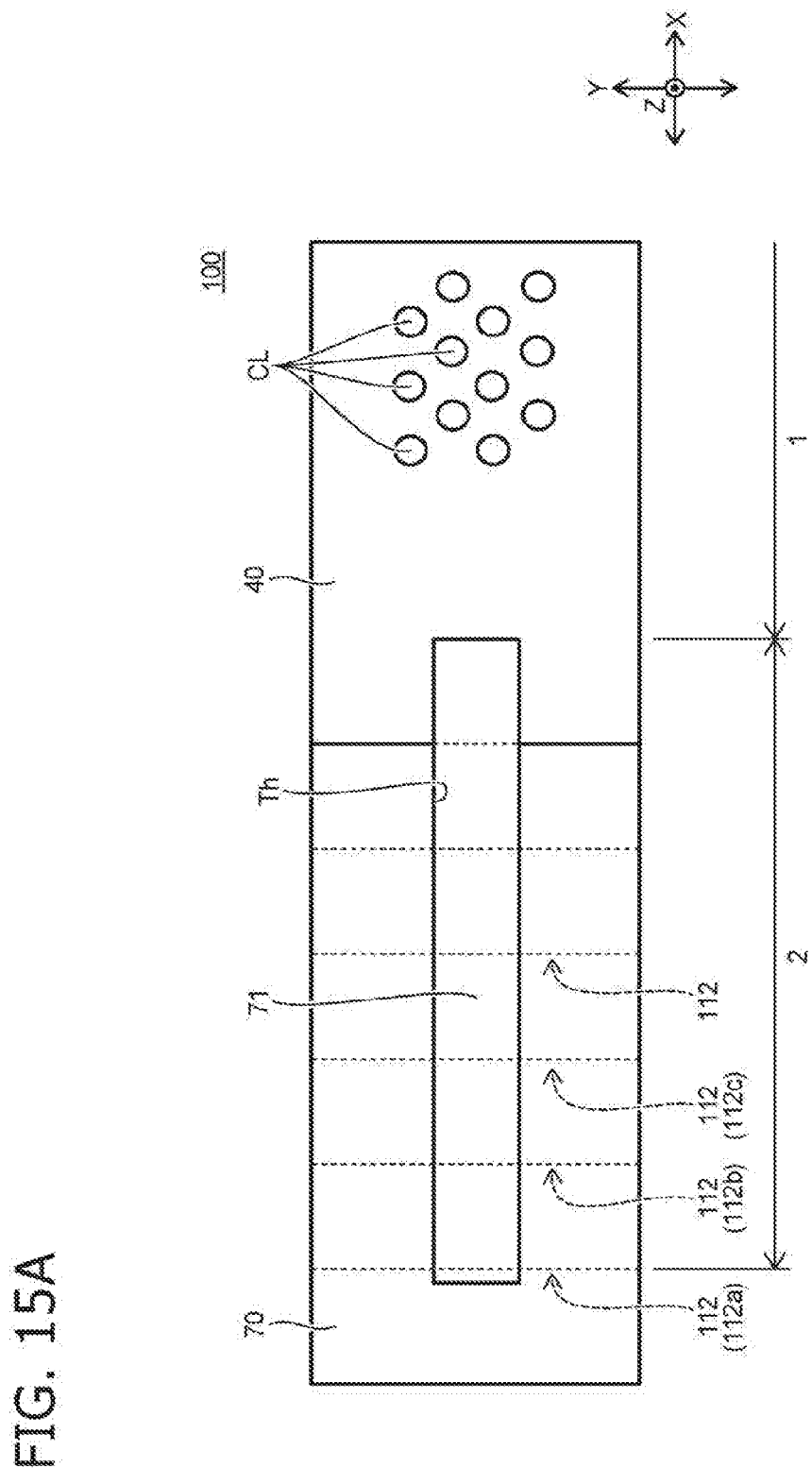
Figure 15D:
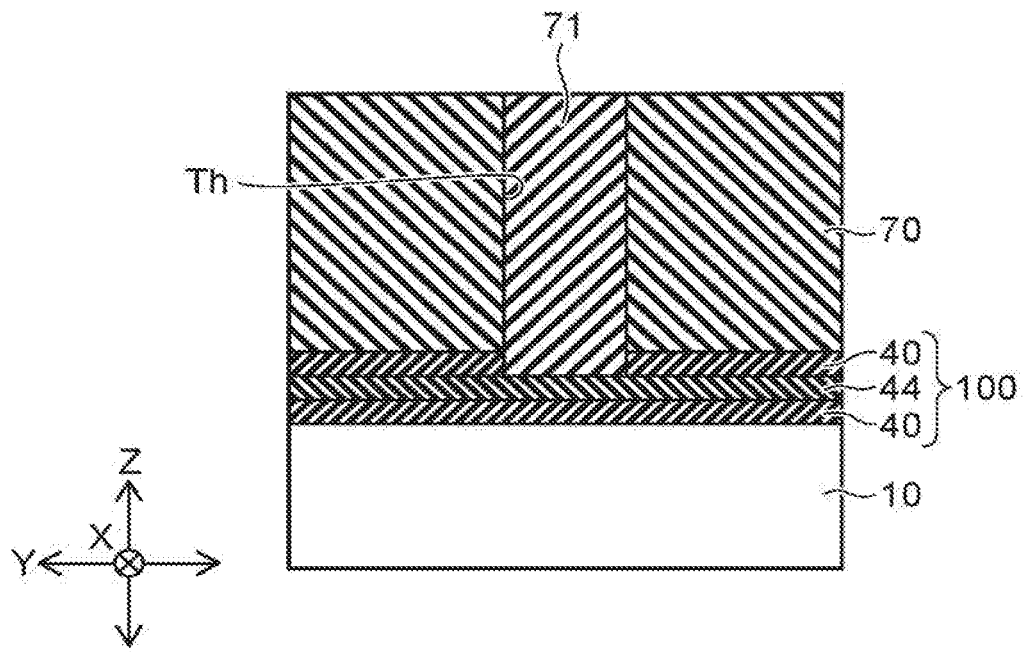
Figure 15E:
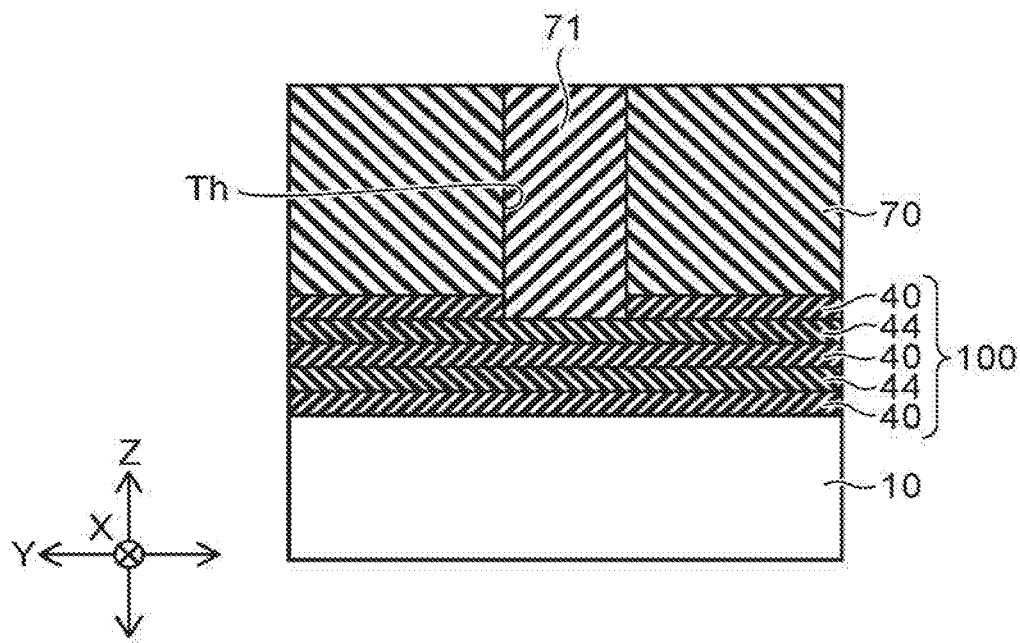
Figure 16D:
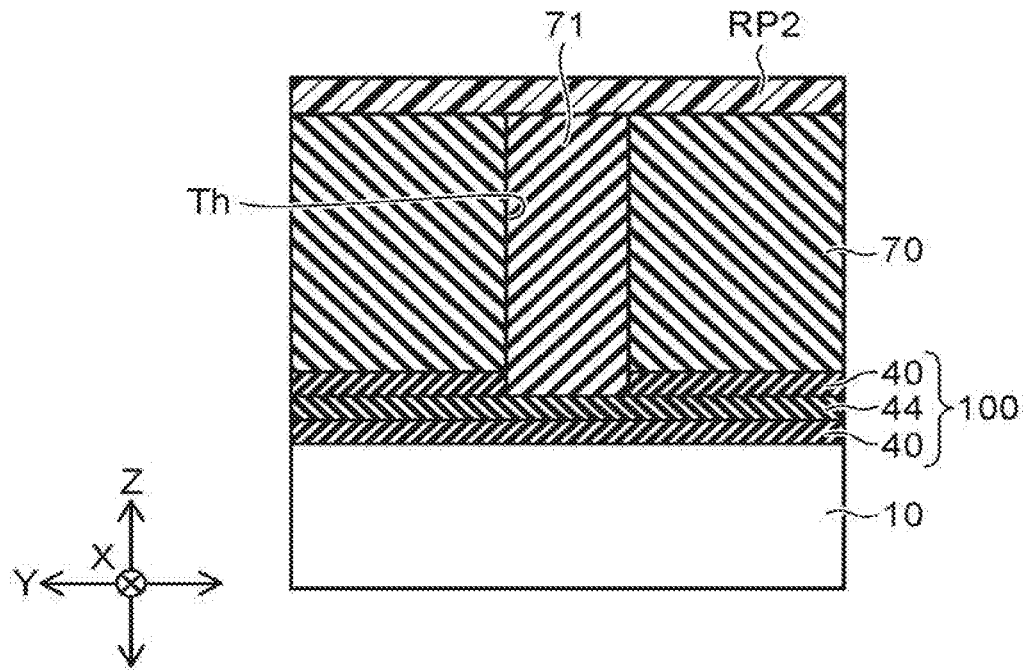
Figure 16E:
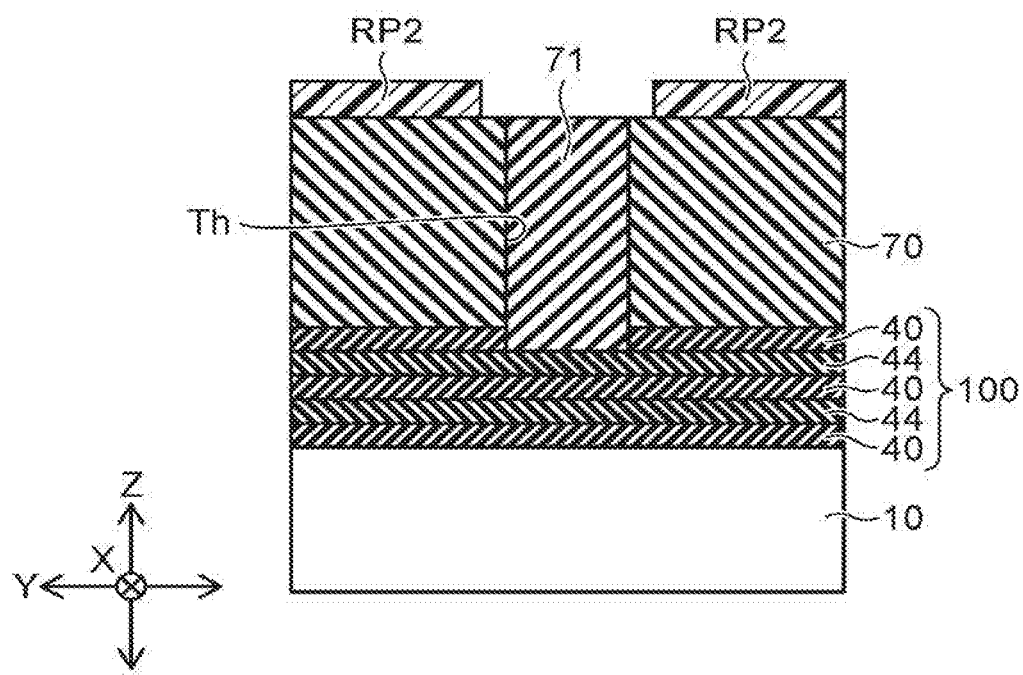
Figure 17A:
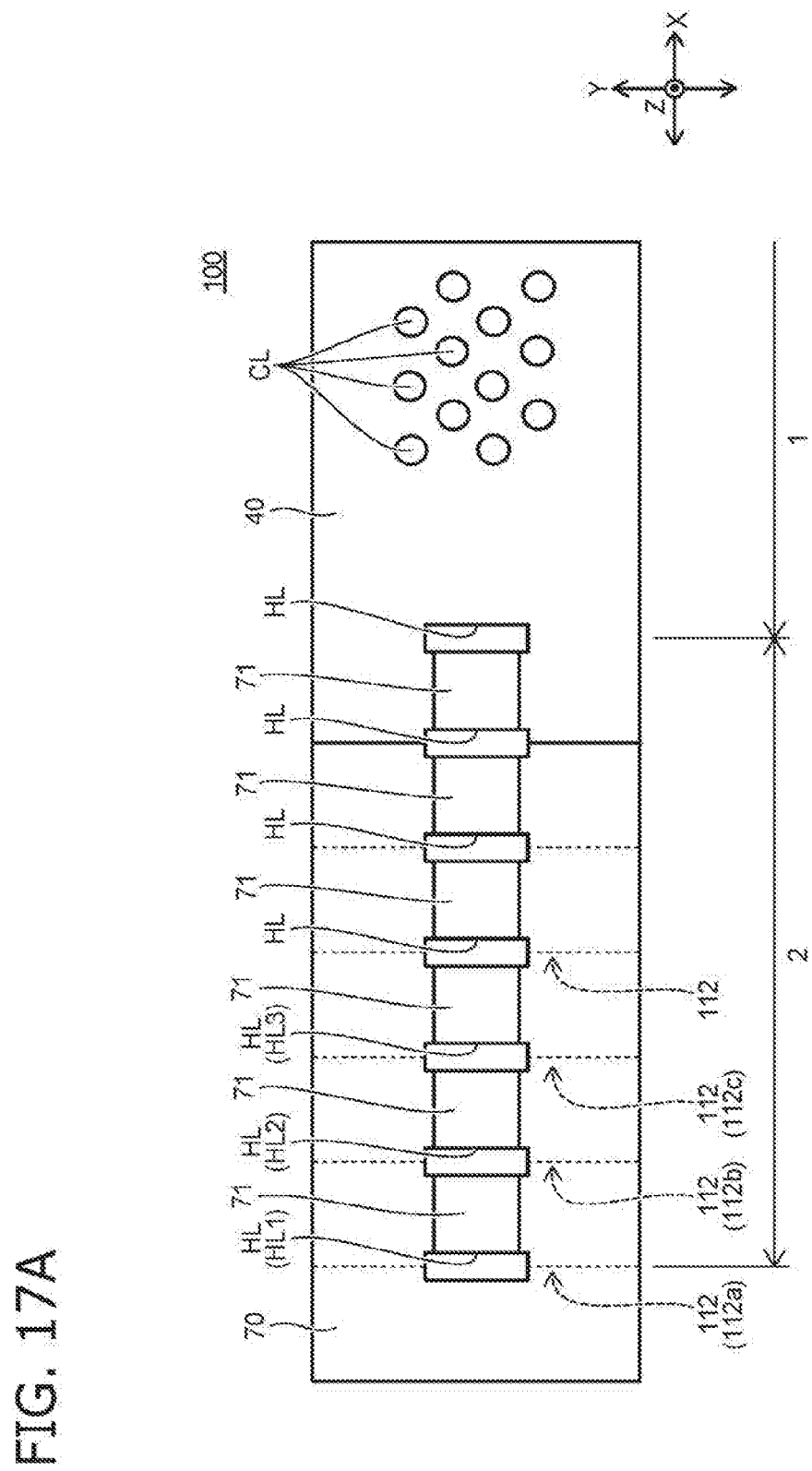
Figure 17D:
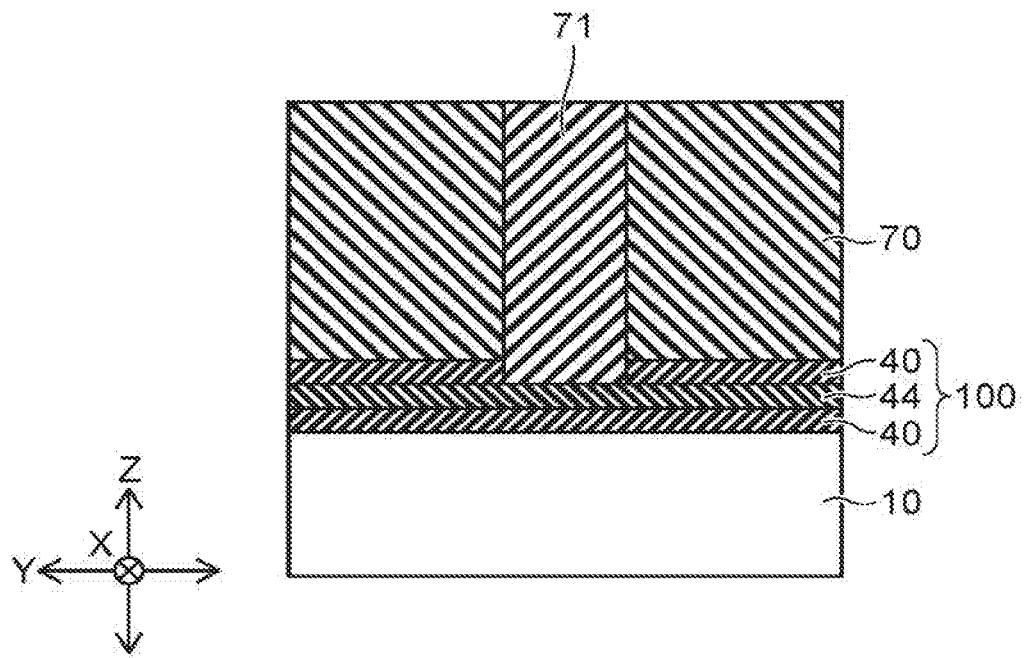
Figure 17E:
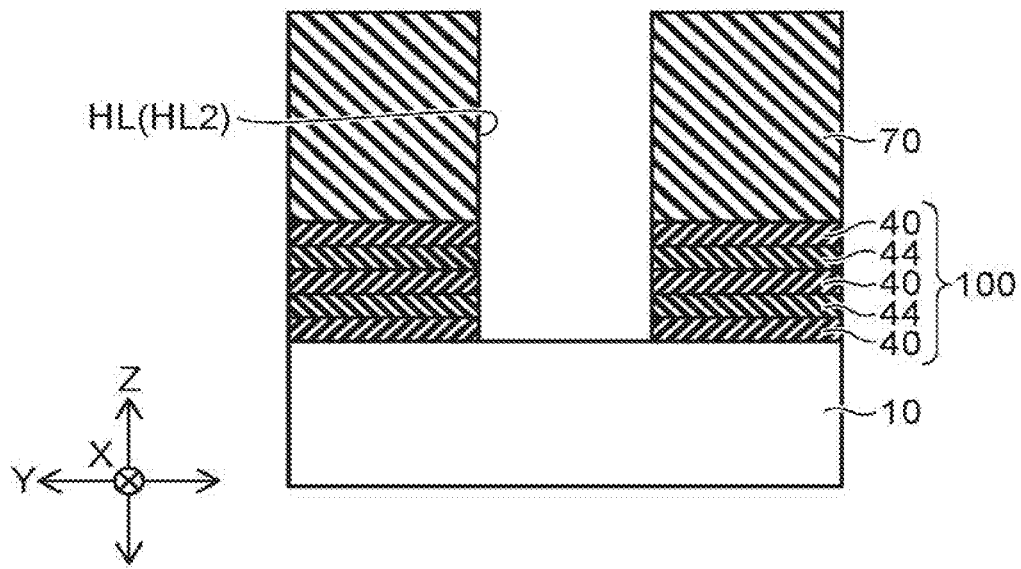
Figure 18D:
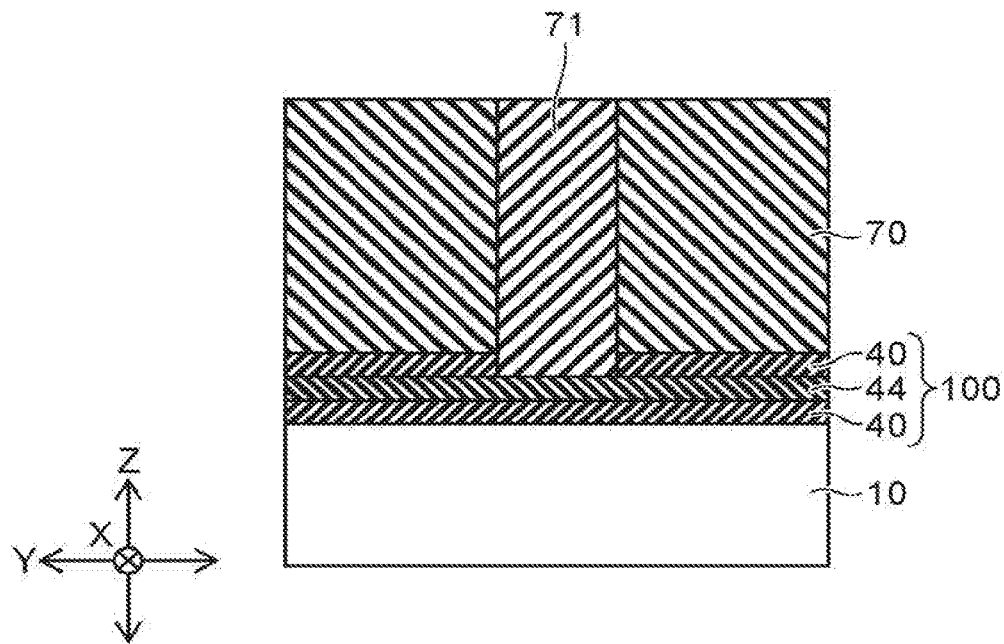
Figure 18E:
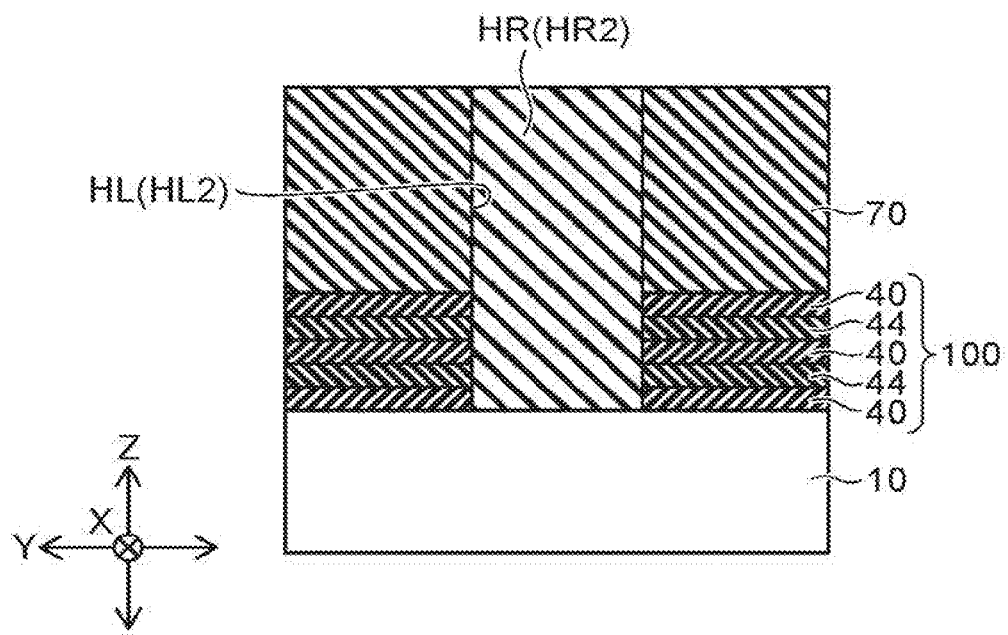
Figure 19D:
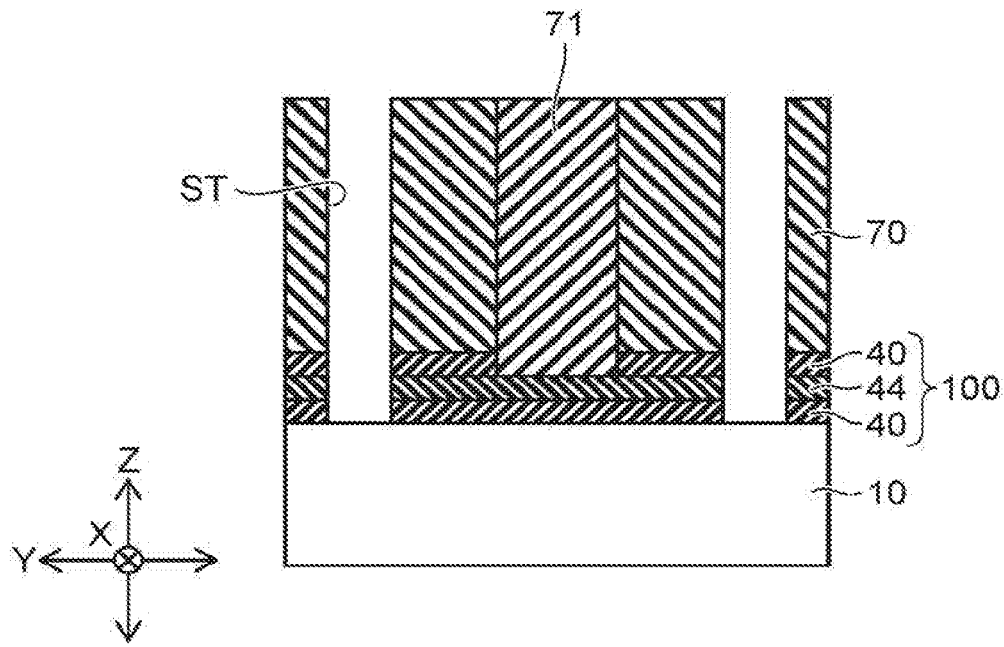
Figure 19E:
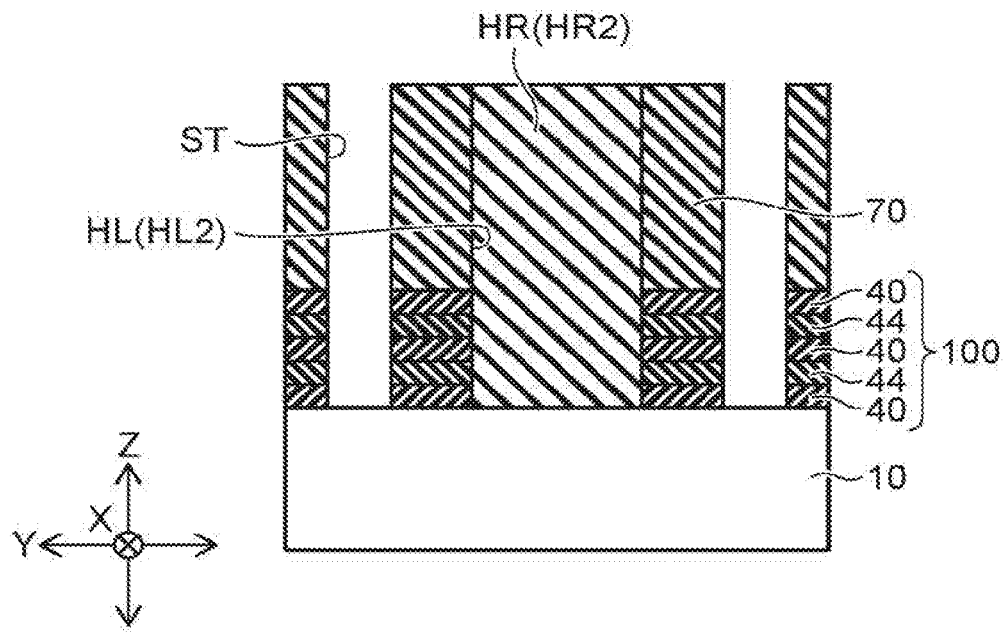
Figure 20A:
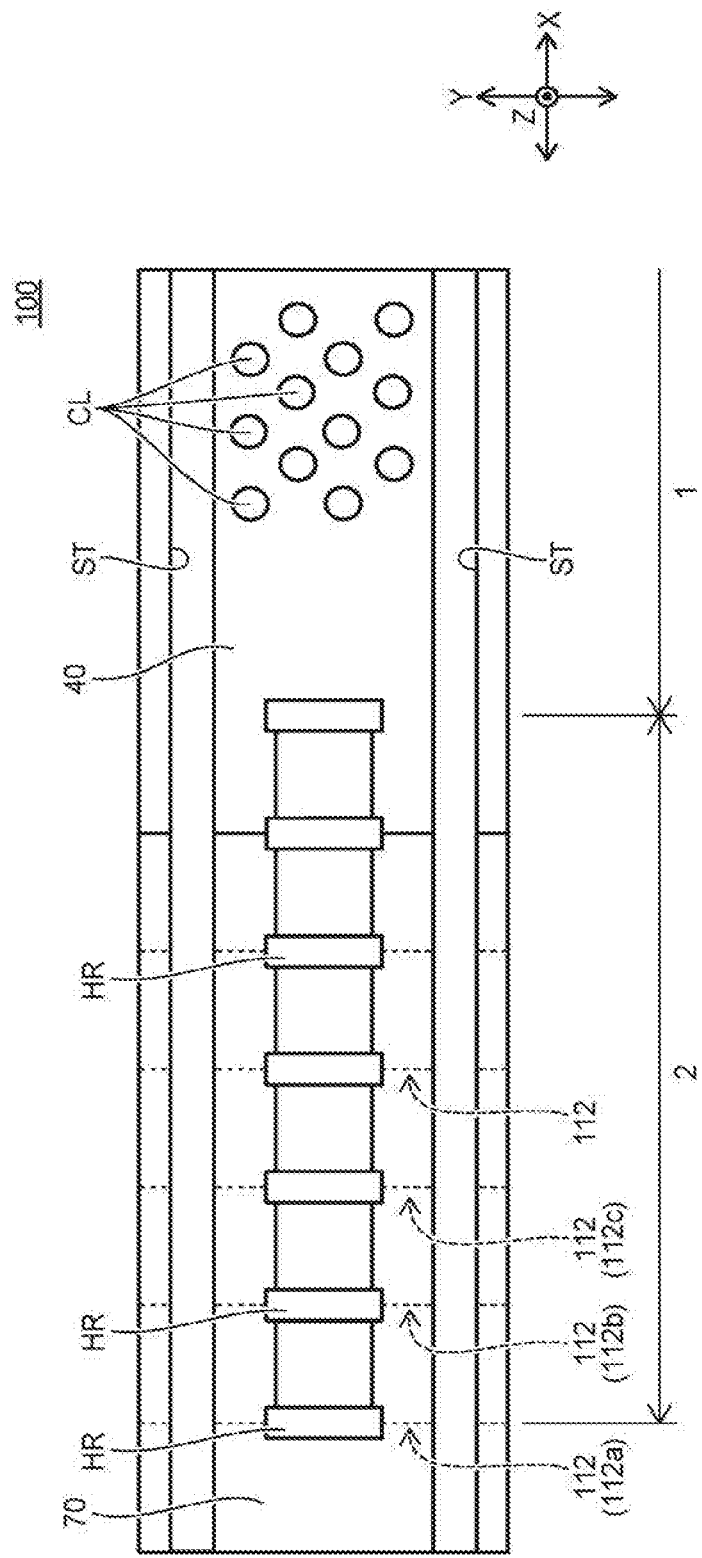
Figure 20D:
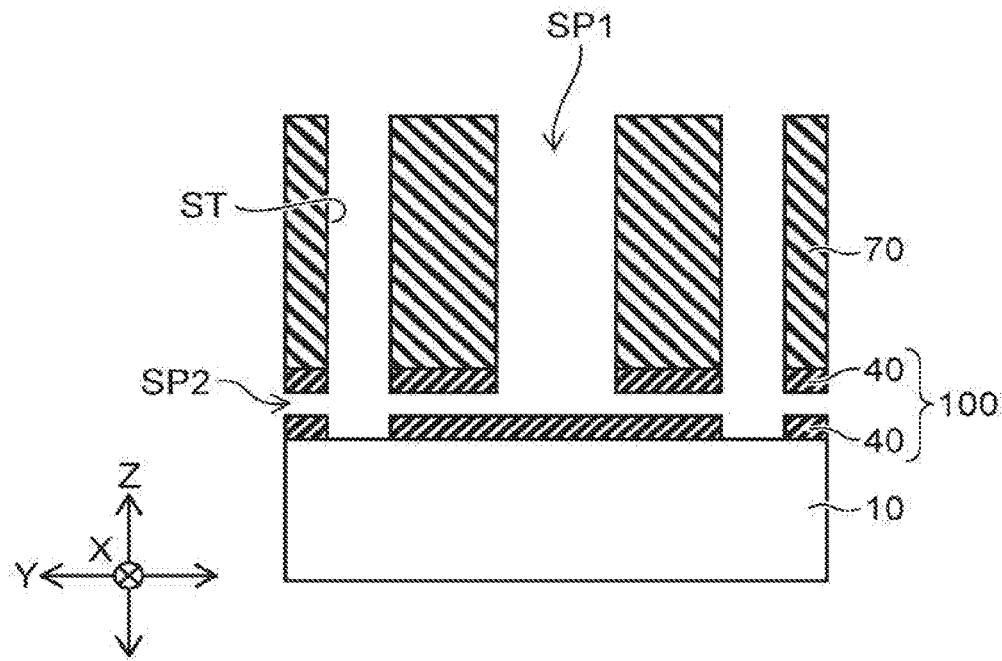
Figure 20E:
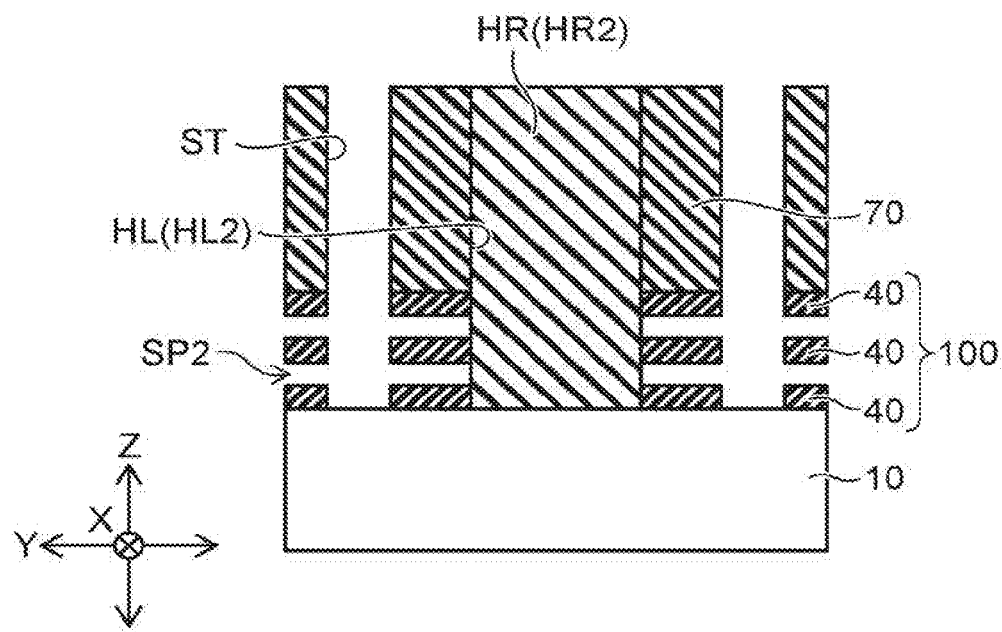
Figure 21D:
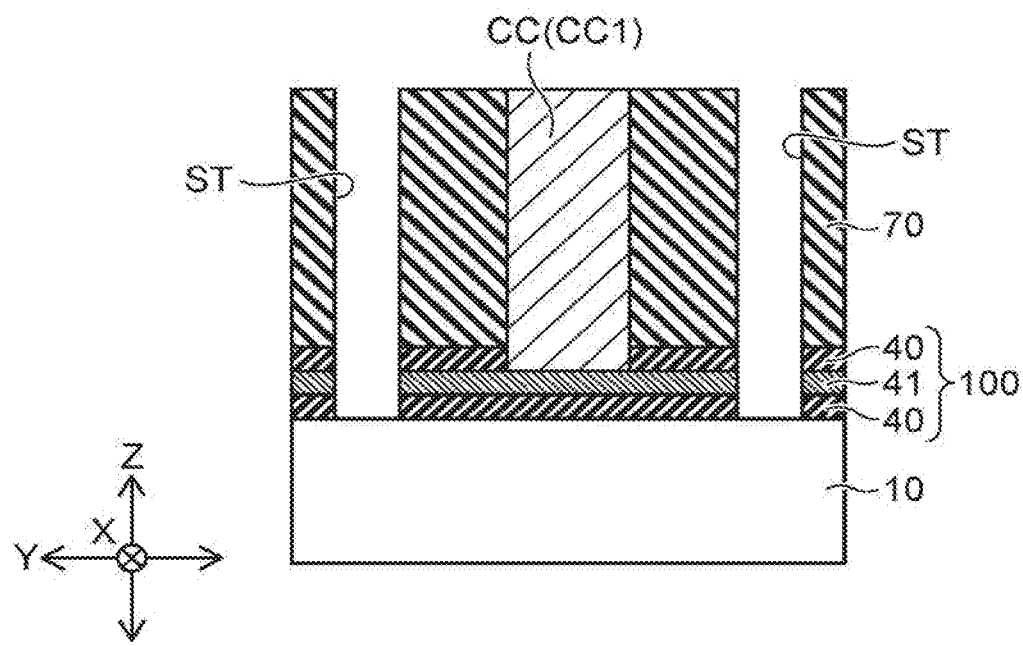
Figure 21E:
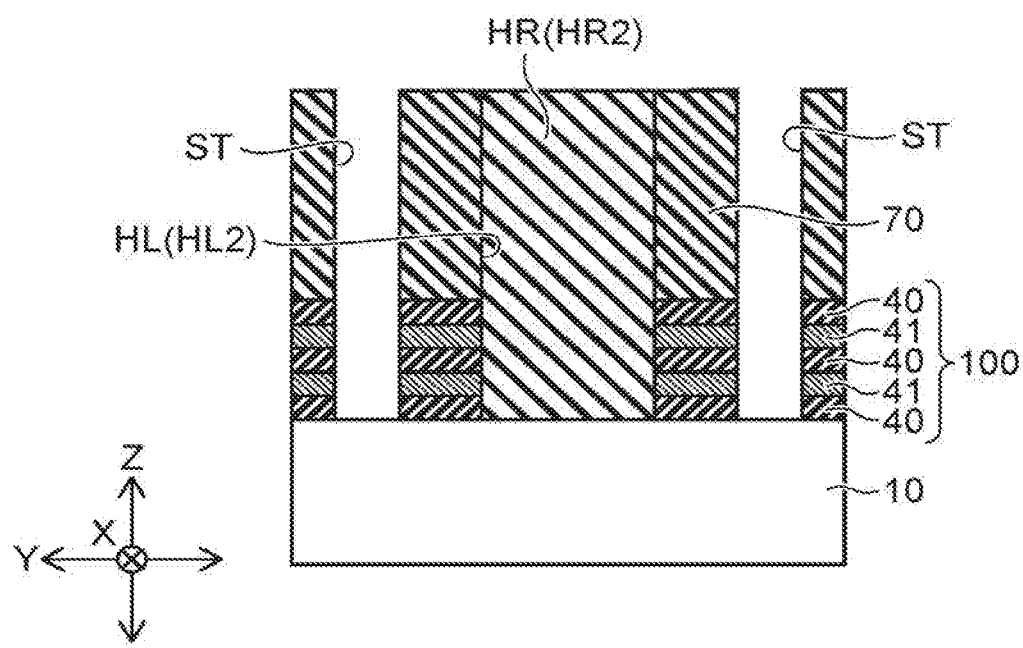

FIG. 4 is a plan view of the memory cell array and the staircase portion of the semiconductor device according to the first embodiment. FIG. 5 is a cross-sectional view along line V-V in FIG. 4. FIG. 6 is a cross-sectional view along line VI-VI in FIG. 4. FIG. 7 is a cross-sectional view along line VII-VII in FIG. 4. FIG. 8 is a cross-sectional view along line VIII-VIII in FIG. 4.

As shown in FIG. 4 to FIG. 8, the stacked body 100 includes multiple structure bodies 110. The substrate 10 and the multiple structure bodies 110 are arranged along the Z-direction. The stacked body 100 includes the staircase portion 2 at an end portion of the stacked body 100. For example, the staircase portion 2 has a structure having a staircase configuration along the X-direction. An insulating film 70 is provided on the staircase portion 2. For example, the insulating film 70 fills the recess occurring in the staircase portion 2. Thereby, the front surface of the semiconductor device is planarized from the memory cell array 1 to the staircase portion 2.

Each of the structure bodies 110 includes one electrode layer 41 and one insulator 40. The upper surfaces of the structure bodies 110 that do not overlap the structure bodies 110 of the higher layers in the Z-direction are called "terraces 111." The terraces 111 are arranged along the X-direction. In the staircase portion 2, the portions where the side surfaces of the electrode layers 41 are exposed to the insulating film 70 are called "level differences 112." For example, the level differences 112 extend in the Y-direction. The insulating film 70 covers the terraces 111 and the level differences 112.

Multiple contact portions CC are provided inside the insulating film 70; and multiple posts HR are provided inside the staircase portion 2 and inside the insulating film 70. The configurations of the contact portions CC and the posts HR are substantially quadrilateral columns and are arranged alternately along the X-direction. For example, the arrangement periods of the contact portions CC and the posts HR are substantially the same as the arrangement periods of the terraces 111 and the level differences 112. For example, the contact portions CC correspond one-to-one with the terraces 111; and the posts HR correspond one-to-one with the level differences 112.

The contact portions CC are provided respectively on the terraces 111. The contact portion CC extends through the insulating film 70 in the Z-direction and is electrically connected to one of the electrode layers 41 at the terrace 111. For example, the multiple contact portions CC are separated from each other and arranged in the X-direction.

The posts HR extend through the insulating film 70 and through the stacked body 100 in the Z-direction and reach the substrate 10. One portion of the multiple posts HR is positioned respectively in the regions between the multiple contact portions CC. At least one of the multiple posts HR reaches the substrate 10 via the level difference 112. In other words, one post HR that extends in the Z-direction crosses one level difference 112 extending in the Y-direction. The upper end edge of one level difference 112 contacts the two Y-direction side surfaces of one post HR; and the lower end edge of the one level difference 112 also contacts the two Y-direction side surfaces of the same post HR. For example, the posts HR are insulating members and include, for example, silicon oxide. The post HR contacts two of the contact portions CC adjacent in the X-direction.

For example, a length L1 of the contact portion CC in the direction (the X-direction) in which the terraces 111 are arranged is longer than a length L2 of the post HR in the direction in which the terraces 111 are arranged. For example, a length W1 of the contact portion CC in a direction (the Y-direction) orthogonal to the direction in which the terraces 111 are arranged is shorter than a length W2 of the post HR in the direction orthogonal to the direction in which the terraces 111 are arranged. Then, on the two Y-direction sides, the post HR extends outside the contact portion CC. In other words, the two Y-direction end portions of the post HR protrude from the side surfaces of the contact portion CC facing the Y-direction. If the conditions described above are satisfied, the configuration of the post HR may be, for example, a substantially elliptical column.

The length W2 of the post HR in the Y-direction is shorter than a length W3 between two mutually-adjacent slits ST. In other words, the length W2 of the post HR is shorter than the length of one block. Thereby, the length in the Y-direction of the electrode layer 41 is longer than the post HR; and the electrode layer 41 is not divided in the X-direction by the post HR.

The multiple structure bodies 110 include, for example, a structure body 110a, a structure body 110b, and a structure body 110c. For example, the three insulators 40 from the bottom of the multiple insulators 40 are taken as an insulator 40a, an insulator 40b, and an insulator 40c. Also, as described above, the three electrode layers 41 from the bottom of the multiple electrode layers 41 are taken as the electrode layer 41a, the electrode layer 41b, and the electrode layer 41c.

The structure body 110a includes the electrode layer 41a and the insulator 40a. The structure body 110a includes a terrace 111a at the end portion of the structure body 110a. The end portion of the structure body 110a includes an end portion 41ae of the electrode layer 41a. In the structure body 110a, the insulator 40a is disposed on the lower layer side; and the electrode layer 41a is disposed on the upper layer side. The other structure bodies 110 are not provided in the region directly above the upper surface of the end portion 41ae of the electrode layer 41a; and the upper surface of the end portion 41ae of the electrode layer 41a is the terrace 111a. The side surface of the electrode layer 41a facing the X-direction is included in a portion of a level difference 112a.

The structure body 110b is provided on the structure body 110a other than the end portion 41ae. The structure body 110b includes the electrode layer 41b and the insulator 40b. In the structure body 110b, the insulator 40b is disposed on the lower layer side; and the electrode layer 41b is disposed on the upper layer side. For example, the insulator 40b contacts the electrode layer 41a.

The other structure bodies 110 are not provided in the region directly above the upper surface of an end portion 41be of the electrode layer 41b; and the upper surface of the end portion 41be of the electrode layer 41b is a terrace 111b. The side surface of the electrode layer 41b facing the X-direction is included in a portion of a level difference 112b.

The structure body 110c is provided on the structure body 110b other than the end portion 41be. The structure body 110c includes the electrode layer 41c and the insulator 40c. In the structure body 110c, the insulator 40c is disposed on the lower layer side; and the electrode layer 41c is disposed on the upper layer side. For example, the insulator 40c contacts the electrode layer 41b.

The other structure bodies 110 are not provided in the region directly above the upper surface of an end portion 41ce of the electrode layer 41c; and the upper surface of the end portion 41ce of the electrode layer 41c is a terrace 111c. The side surface of the electrode layer 41c facing the X-direction is included in a portion of a level difference 112c.

The level difference 112a is disposed between the substrate 10 and the terrace 111a. The level difference 112b is disposed between the terrace 111a and the terrace 111b. The level difference 112c is disposed between the terrace 111b and the terrace 111c.

A contact portion CC1 is provided on the terrace 111a of the structure body 110a. The contact portion CC1 is electrically connected to the electrode layer 41a via the terrace 111a of the electrode layer 41a. The insulator 40b is provided on the two Y-direction sides of the contact portion CC1 on the structure body 110a.

A contact portion CC2 is provided on the terrace 111b of the structure body 110b. The contact portion CC2 is electrically connected to the electrode layer 41b via the terrace 111b of the electrode layer 41b. The insulator 40c is provided on the two Y-direction sides of the contact portion CC2 on the structure body 110b.

A contact portion CC3 is provided on the terrace 111c of the structure body 110c. The contact portion CC3 is electrically connected to the electrode layer 41c via the terrace 111c of the electrode layer 41c. One insulator 40 of the fourth layer from the bottom is provided on the two Y-direction sides of the contact portion CC3 on the structure body 110c.

A post HR1 is provided between the insulating film 70 and the contact portion CC1. The post HR1 reaches the substrate 10 via the terrace 111a and the level difference 112a of the structure body 110a.

A post HR2 is provided between the contact portion CC1 and the contact portion CC2 and inside the structure body 110a below the region between the contact portion CC1 and the contact portion CC2. The post HR2 reaches the substrate 10 via the terrace 111a, the level difference 112b, and the terrace 111b of the structure body 110a and the structure body 110b.

A post HR3 is provided between the contact portion CC2 and the contact portion CC3 and inside the structure body 110b and the structure body 110a below the region between the contact portion CC2 and the contact portion CC3. The post HR3 reaches the substrate 10 via the terrace 111b, the level difference 112c, and the terrace 111c of the structure body 110b and the structure body 110c.

For example, the post HR1, the contact portion CC1, the post HR2, the contact portion CC2, the post HR3, and the contact portion CC3 are arranged along the direction in which the terraces 111 are arranged (e.g., the X-direction).

The post HR1 contacts the contact portion CC1. The post HR2 contacts the contact portion CC1 and the contact portion CC2. The post HR3 contacts the contact portion CC2 and the contact portion CC3.

In the first embodiment, the post HR is disposed to cross the level difference 112. Thereby, when viewed from the Z-direction, the length in the X-direction of the terrace 111 can be shorter compared to the case where the post HR is disposed in the interior of the terrace 111.

Also, in the semiconductor device according to the first embodiment, the post HR is an insulating member. Thereby, for example, compared to the case where the post HR includes a semiconductor portion, the interference between the post HR and the contact portion CC is suppressed. Because the interference between the contact portion CC and the post HR is suppressed, the contact portion CC and the post HR can be provided in contact with each other. In the semiconductor device according to the first embodiment, the contact portion CC and the post HR are provided in contact alternately along the X-direction. Thereby, for example, compared to the case where the contact portion CC and the post HR are formed to be separated, the length in the X-direction of the terrace 111 can be shorter. Also, because a spacing may not be provided between the contact portion CC and the post HR, the surface area of the terrace 111 that can be used for the connection between the contact portion CC and the electrode layer 41 increases. Accordingly, for example, the length L1 of the contact portion CC in the X-direction can be set to be longer than the length L2 of the post HR; and the contact surface area between the contact portion CC and the electrode layer 41 can be large.

Further, in the first embodiment, the posts HR and the contact portions CC are arranged in one column along the X-direction. Thereby, the length in the Y-direction of the terrace 111 can be shortened.

Thus, according to the first embodiment, because both the length in the X-direction and the length in the Y-direction of the terrace 111 can be reduced, the surface area of the terrace 111 can be reduced; and the semiconductor device can be downscaled.

<Manufacturing Method>

FIG. 9A to FIG. 21E are drawings showing the method for manufacturing the semiconductor device according to the first embodiment. FIG. 9A, FIG. 10A, FIG. 11A, FIG. 12A, FIG. 13A, FIG. 14A, FIG. 15A, FIG. 16A, FIG. 17A, FIG. 18A, FIG. 19A, FIG. 20A, and FIG. 21A are plan views corresponding to FIG. 4. FIG. 9B, FIG. 10B, FIG. 11B, FIG. 12B, FIG. 13B, FIG. 14B, FIG. 15B, FIG. 16B, FIG. 17B, FIG. 18B, FIG. 19B, FIG. 20B, and FIG. 21B are cross-sectional views corresponding to FIG. 5. FIG. 9C, FIG. 10C, FIG. 11C, FIG. 12C, FIG. 13C, FIG. 14C, FIG. 15C, FIG. 16C, FIG. 17C, FIG. 18C, FIG. 19C, FIG. 20C, and FIG. 21C are cross-sectional views corresponding to FIG. 6. FIG. 9D, FIG. 10D, FIG. 11D, FIG. 13D, FIG. 14D, FIG. 15D, FIG. 16D, FIG. 17D, FIG. 18D, FIG. 19D, FIG. 20D, and FIG. 21D are cross-sectional views corresponding to FIG. 7. FIG. 9E, FIG. 10E, FIG. 11E, FIG. 13E, FIG. 14E, FIG. 15E, FIG. 16E, FIG. 17E, FIG. 18E, FIG. 19E, FIG. 20E, and FIG. 21E are cross-sectional views corresponding to FIG. 8.

1. Formation of the Stacked Body 100

As shown in FIG. 9A to FIG. 9E, the stacked body 100 is formed on the major surface 10a of the substrate 10. The stacked body 100 is formed by stacking the insulators 40 and sacrificial layers 44 alternately in the Z-direction. The material of the insulators 40 is different from the material of the sacrificial layers 44. The sacrificial layers 44 are selected from a material that can have etching selectivity with respect to the insulators 40. For example, if the insulators 40 are silicon oxide, for example, silicon nitride is selected as the sacrificial layers 44.

2. Formation of the Staircase Portion 2

As shown in FIG. 10A to FIG. 10E, the end portion of the stacked body 100 is patterned into a staircase configuration. For example, the end portion of the stacked body 100 has a staircase configuration along the X-direction. Thereby, the staircase portion 2 is formed in the end portion of the stacked body 100. In the staircase portion 2, for example, the multiple sacrificial layers 44 are formed into the staircase configuration one layer at a time. For example, the upper surfaces of the sacrificial layers 44 are covered with the insulators 40. For example, the staircase portion 2 can be formed by using resist slimming, etc.

The staircase portion 2 includes the multiple terraces 111 and the multiple level differences 112. The multiple terraces 111 include, for example, the terraces 111a to 111c. For example, the terraces 111a to 111c are arranged along the X-direction in this order from the lower level of the staircase portion 2. The level difference 112a is disposed between the terrace 111a and the region of the major surface 10a of the substrate 10 not covered with the stacked body 100. The level difference 112b is disposed between the terrace 111a and the terrace 111b. The level difference 112c is disposed between the terrace 111b and the terrace 111c.

3. Formation of the Insulating Film 70

As shown in FIG. 11A to FIG. 11E, the staircase portion 2 is buried in the insulating film 70. Thereby, the recess that occurs on the staircase portion 2 is filled with the insulating film 70. For example, the insulating film 70 is formed by depositing an insulating material including silicon oxide on the structural component shown in FIG. 10A to FIG. 10E and by subsequently planarizing the insulating material by using CMP to fill the recess occurring in the staircase portion 2.

4. Formation of the Memory Hole MH and the Columnar Portion CL

As shown in FIG. 12A to FIG. 12C, the memory holes MH that extend through the stacked body 100 in the Z-direction are formed. The memory holes MH are formed in the region other than the staircase portion 2 where the memory cell array 1 is to be formed. For example, the memory holes MH are formed to reach the substrate 10.

The columnar portions CL are formed inside the memory holes MH. For example, in the case where the columnar portions CL shown in FIG. 3A and FIG. 3B are formed, summarily, it is sufficient to perform the following processes.

The memory film 30 is formed on the inner surface of the memory hole MH. The bottom of the memory film 30 is etched; and the front surface of the substrate 10 is exposed. Subsequently, the semiconductor body 20 is formed on the bottom surface of the memory hole MH and on the inner surface of the memory film 30. Subsequently, the core member 50 is formed inside the memory hole MH; and the memory hole MH is filled (referring to FIG. 3). Thereby, the columnar portions CL are formed inside the memory holes MH.

5. Formation of the Trench Th

As shown in FIG. 13A to FIG. 13E, a resist pattern RP1 is formed on the structural component shown in FIG. 12A to FIG. 12C. For example, the resist pattern RP1 has an opening having a line configuration extending in the X-direction on the staircase portion 2. The opening of the resist pattern RP1 is formed to cross all of the level differences 112 arranged along the X-direction. The resist pattern RP1 covers the top of the memory cell array 1.

As shown in FIG. 14A to FIG. 14E, the insulating film 70 is selectively etched using the resist pattern RP1 (referring to FIG. 13A to FIG. 13E) as a mask. Thereby, a trench Th is formed in the insulating film 70 in the region directly under the opening of the resist pattern RP1. The upper surfaces of the sacrificial layers 44 (the terraces 111) are exposed at the bottom of the trench Th. In the case where the insulators 40 cover the upper surfaces of the sacrificial layers 44 in the staircase portion 2, a portion of the insulators 40 on the sacrificial layers 44 also is removed. Thereby, the upper surfaces of the sacrificial layers 44 (the terraces 111) are exposed at the bottom of the trench Th. Subsequently, the resist pattern RP1 is removed.

6. Formation of the First Film 71

As shown in FIG. 15A to FIG. 15E, a first film 71 is formed inside the trench Th. The first film 71 is selected from a material that can have etching selectivity with respect to the insulators 40. For example, if the insulators 40 are silicon oxide, for example, silicon nitride is selected as the material of the first film 71. For example, the first film 71 is formed by depositing a film including silicon nitride on the structural component shown in FIG. 14A to FIG. 14E and by subsequently planarizing the film by using CMP to fill the trench Th. At this stage, the sacrificial layers 44 and the first film 71 contact each other at the terraces 111 and contact each other also at the level differences 112.

7. Formation of the Holes HL

As shown in FIG. 16A to FIG. 16E, a resist pattern RP2 is formed on the structural component shown in FIG. 15A to FIG. 15E. The resist pattern RP2 has openings having multiple hole configurations on the staircase portion 2. The openings are formed in regions including the regions directly above the level differences 112. For example, the openings are formed as quadrilaterals when viewed from the Z-direction. For example, the openings may be formed as ellipses. Each opening of the resist pattern RP2 is formed to jut toward the outside from the end edge of the first film 71 at the two Y-direction sides. Therefore, the boundary between the first film 71 and the insulating film 70 is exposed at the bottom surface of each opening.

As shown in FIG. 17A to FIG. 17E, anisotropic etching is performed using the resist pattern RP2 (referring to FIG. 16A to FIG. 16E) as a mask. Thereby, in the staircase portion 2, the first film 71, the insulating film 70, and the stacked body 100 are selectively removed; and holes HL are formed in the regions directly under the openings of the resist pattern RP2.

The holes HL pierce the first film 71 and the stacked body 100 and reach the substrate 10. The hole HL reaches the substrate 10 via two terraces 111 and the level difference 112 between the two terraces 111. Also, the hole HL is formed to jut outside the first film 71 at the two Y-direction sides. Thereby, the first film 71 is divided in the X-direction by the hole HL. At this time, because the portion of the first film 71 in contact with the level difference 112 is removed, each divided portion of the first film 71 contacts the sacrificial layer 44 only at the terrace 111 and does not contact the sacrificial layer 44 at the level difference 112. Therefore, each divided portion of the first film 71 is linked to only one sacrificial layer 44 having the terrace 111 positioned directly under the divided portion of the first film 71; and each portion of the first film 71 has a structure having a columnar configuration separated from the other sacrificial layers 44 having the terraces 111 positioned to be adjacent in the X-direction. Subsequently, the resist pattern RP2 is removed.

The multiple holes HL include, for example, a hole HL1, a hole HL2, and a hole HL3. The hole HL1 is formed over the level difference 112a and the terrace 111a. The hole HL2 is formed over the terrace 111a, the level difference 112b, and the terrace 111b. The hole HL3 is formed over the terrace 111b, the level difference 112c, and the terrace 111c.

8. Formation of the Posts HR

As shown in FIG. 18A to FIG. 18E, the posts HR are formed inside the holes HL. The holes HL are filled with the posts HR. For example, the post HR1 is formed inside the hole HL1. For example, the post HR2 is formed inside the hole HL2. For example, the posts HR are selected from a material that can have etching selectivity with respect to the sacrificial layers 44 and the first film 71. For example, in the case where the sacrificial layers 44 and the first film 71 include silicon nitride, for example, silicon oxide is selected as the material of the posts HR. In the process shown in FIG. 16A to FIG. 16E described above, because the openings of the resist pattern RP2 are formed to jut toward the two Y-direction sides from the first film 71, in this process, the two Y-direction end portions of the post HR protrude outside the side surfaces of the first film 71 facing the two Y-direction sides.

9. Removal of the First Film 71 and the Sacrificial Layers 44

As shown in FIG. 19A to FIG. 19E, the slits ST are formed inside the insulating film 70 and inside the stacked body 100. For example, the slits ST extend in the X-direction. For example, the slits ST pierce the insulating film 70 and the stacked body 100 and reach the substrate 10.

As shown in FIG. 20A to FIG. 20E, the first film 71 and the sacrificial layers 44 are removed via the slits ST by using isotropic etching. One example of isotropic etching is wet etching using phosphoric acid.

Spaces SP1 are made inside the insulating film 70 and inside the stacked body 100 by removing the first film 71. Spaces SP2 are made inside the stacked body 100 by removing the sacrificial layers 44. At this time, the posts HR function as members that support the insulators 40. Thereby, the posts HR support the structure of the stacked body 100. For example, sagging of the insulators 40 is suppressed. Also, in the process shown in FIG. 17A to FIG. 17E described above, because each divided portion of the first film 71 is linked via the terrace 111 to only one sacrificial layer 44 directly under the portion, in this process, the space SP1 communicates with only the space SP2 directly under the space SP1.

10. Formation of the Contact Portions CC and the Electrode Layers 41

As shown in FIG. 21A to FIG. 21E, a conductive material is filled into the spaces SP1 and the spaces SP2 via the slits ST. The conductive material includes, for example, tungsten. Subsequently, the conductive material is removed from inside the slits ST. Thereby, the contact portions CC are formed inside the spaces SP1; and the electrode layers 41 are formed inside the spaces SP2. As a result, the main portions of the memory cell array 1 are formed.

In the process shown in FIG. 20A to FIG. 20E described above, because the space SP1 communicates with only the space SP2 directly under the space SP1, in this process, the contact portion CC is connected to only one electrode layer 41 directly under the contact portion CC and is not connected to the other electrode layers 41. Accordingly, the electrode layers 41 also are not connected via the contact portion CC.

Also, in the process shown in FIG. 19A to FIG. 19E described above, because the side surfaces of the first film 71 facing the Y-direction are disposed at positions that are recessed with respect to the side surfaces of the post HR facing the Y-direction, the side surfaces of the contact portion CC facing the Y-direction are disposed at positions that are recessed past the side surfaces of the post HR facing the Y-direction. Therefore, the length in the Y-direction of the contact portion CC is shorter than the length in the Y-direction of the post HR.

Thus, according to the first embodiment, the contact portions CC and the electrode layers 41 can be formed self-alignedly and as one body.

11. Formation of the Source Lines SL, the Bit Lines BL, Etc.

Subsequently, as shown in FIG. 2 and FIG. 4, an insulating film 61 is formed on the side surface of the slit ST. The source line SL is formed inside the slit ST with the insulating film 61 interposed. The contacts Cb and the conductive bodies V1 are formed on the columnar portions CL. The bit lines BL that extend in the Y-direction are formed on the conductive bodies V1. The shunt interconnect 80 that extends in the Y-direction is formed on the source lines SL.

The semiconductor device according to the embodiment can be manufactured by the manufacturing method described above.

In the manufacturing method, the electrode layers 41 and the contact portions CC can be formed collectively. Compared to the case where the electrode layers 41 and the contact portions CC are formed by separate processes, the manufacturing processes can be reduced. Also, in the manufacturing method, the contact portion CC and the post HR are formed in contact with each other. Because a spacing may not be provided between the contact portion CC and the post HR, the degree of difficulty of the patterning can be reduced. Further, because the contact portion CC and the post HR can be formed self-aligningly, the manufacturing of the semiconductor device is easy.

Second Embodiment

<Semiconductor Device>

In the embodiment, a semiconductor device is described in which a semiconductor portion is included in the post HR.

Figure 22:
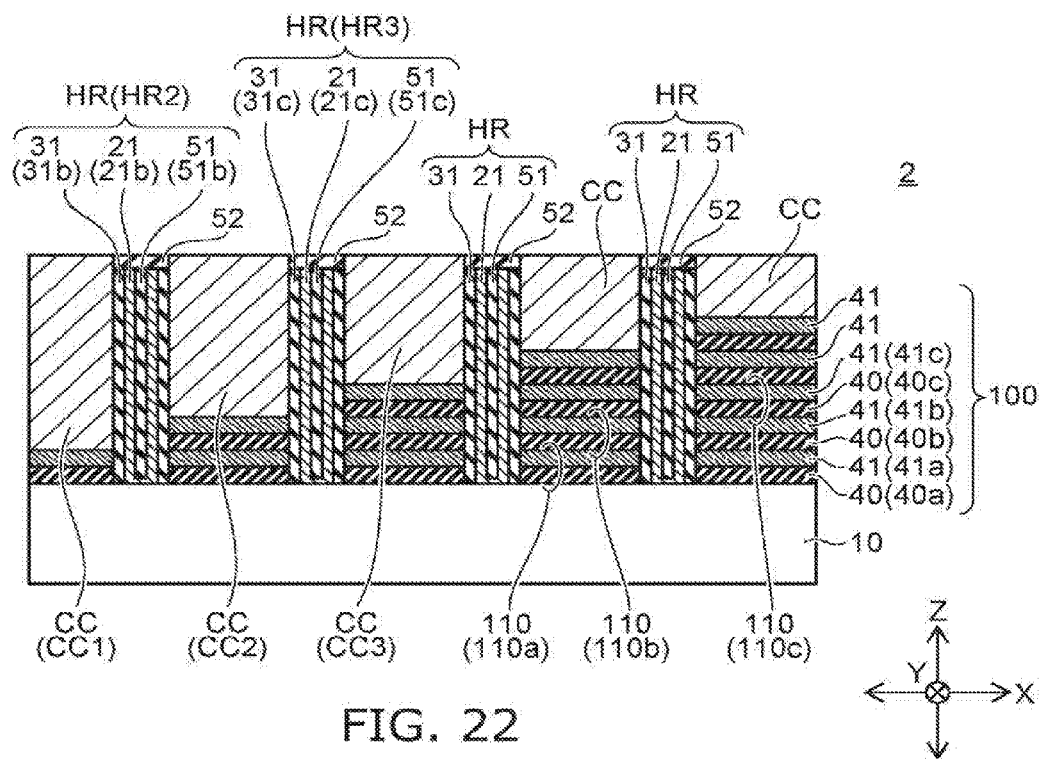
FIG. 22 is a cross-sectional view showing a portion of a staircase portion of a semiconductor device according to a second embodiment.
Figure 23:
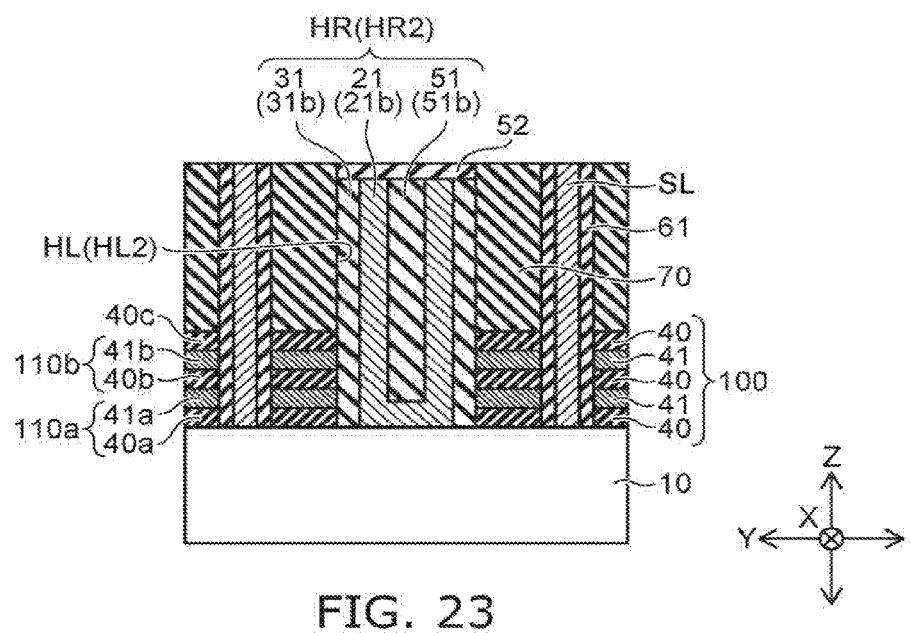
FIG. 23 is a cross-sectional view showing a portion of the semiconductor device according to the second embodiment.

FIG. 22 is a cross-sectional view showing a portion of the staircase portion of the semiconductor device according to the second embodiment. FIG. 23 is a cross-sectional view showing a portion of the semiconductor device according to the second embodiment. FIG. 23 is a cross-sectional view corresponding to the cross section along line VIII-VIII shown in FIG. 4.

As shown in FIG. 22 and FIG. 23, in the case where the interference between the post HR and the contact portion CC can be suppressed sufficiently, the post HR may include a semiconductor portion 21. For example, the post HR includes an insulating portion 51, the semiconductor portion 21, and an insulating film 31. The insulating portion 51, the semiconductor portion 21, and the insulating film 31 extend through the insulating film 70 and through the stacked body 100 in the Z-direction. The semiconductor portion 21 is provided between the insulating portion 51 and the stacked body 100, between the insulating portion 51 and the insulating film 70, and between the contact portions CC adjacent to the insulating portion 51. For example, the insulating film 31 is provided between the semiconductor portion 21 and the stacked body 100, between the semiconductor portion 21 and the insulating film 70, and between the contact portions CC adjacent to the semiconductor portion 21.

The insulating film 31 may be, for example, a multilayer film including a silicon oxide film and a silicon nitride film. An insulating film 52 is provided on the post HR. The insulating film 52 includes, for example, silicon oxide.

For example, the post HR2 includes an insulating portion 51$b$, a semiconductor portion 21$b$, and an insulating film 31$b$. The insulating portion 51$b$, the semiconductor portion 21$b$, and the insulating film 31$b$ extend through the insulating film 70 and through the structure body 110$a$ in the Z-direction. The semiconductor portion 21*b* is provided between the insulating portion 51*b* and the structure body 110*a*, between the insulating portion 51*b* and the structure body 110*b*, between the insulating portion 51*b* and the contact portion CC1, between the insulating portion 51*b* and the contact portion CC2, and between the insulating portion 51*b* and the insulating film 70. For example, the insulating film 31*b* is provided between the semiconductor portion 21*b* and the electrode layer 41*a*, between the semiconductor portion 21*b* and the electrode layer 41*b*, between the semiconductor portion 21*b* and the insulator 40*a*, between the semiconductor portion 21*b* and the insulator 40*b*, between the semiconductor portion 21*b* and the contact portion CC1, between the semiconductor portion 21*b* and the contact portion CC2, and between the semiconductor portion 21*b* and the insulating film 70.

For example, the post HR3 includes an insulating portion 51*c*, a semiconductor portion 21*c*, and an insulating film 31*c*. The insulating portion 51*c*, the semiconductor portion 21*c*, and the insulating film 31*c* extend through the insulating film 70, through the structure body 110*a*, and through the structure body 110*b* in the Z-direction. The semiconductor portion 21*c* is provided between the insulating portion 51*c* and the structure body 110*a*, between the insulating portion 51*c* and the structure body 110*b*, between the insulating portion 51*c* and the structure body 110*c*, between the insulating portion 51*c* and the contact portion CC2, between the insulating portion 51*c* and the contact portion CC3, and between the insulating portion 51*c* and the insulating film 70. For example, the insulating film 31*c* is provided between the semiconductor portion 21*c* and the electrode layer 41*a*, between the semiconductor portion 21*c* and the electrode layer 41*b*, between the semiconductor portion 21*c* and the electrode layer 41*c*, between the semiconductor portion 21*c* and the insulator 40*a*, between the semiconductor portion 21*c* and the insulator 40*b*, between the semiconductor portion 21*c* and the insulator 40*c*, between the semiconductor portion 21*c* and the contact portion CC2, between the semiconductor portion 21*c* and the contact portion CC3, and between the semiconductor portion 21*c* and the insulating film 70.

A semiconductor pillar may be provided between the post HR and the substrate 10. However, in such a case, the semiconductor pillar and the semiconductor portion 21 each are provided not to interfere with the electrode layers 41 due to the interposed insulating film 31.

<Manufacturing Method>

FIG. 24A to FIG. 28C are drawings showing a method for manufacturing the semiconductor device according to the second embodiment. FIG. 24A, FIG. 25A, FIG. 26A, FIG. 27A, and FIG. 28A are plan views corresponding to FIG. 4. FIG. 24B, FIG. 25B, FIG. 26B, FIG. 27B, and FIG. 28B are cross-sectional views corresponding to FIG. 5. FIG. 24C, FIG. 25C, FIG. 26C, FIG. 27C, and FIG. 28C are cross-sectional views corresponding to FIG. 6.

Figure 24A:
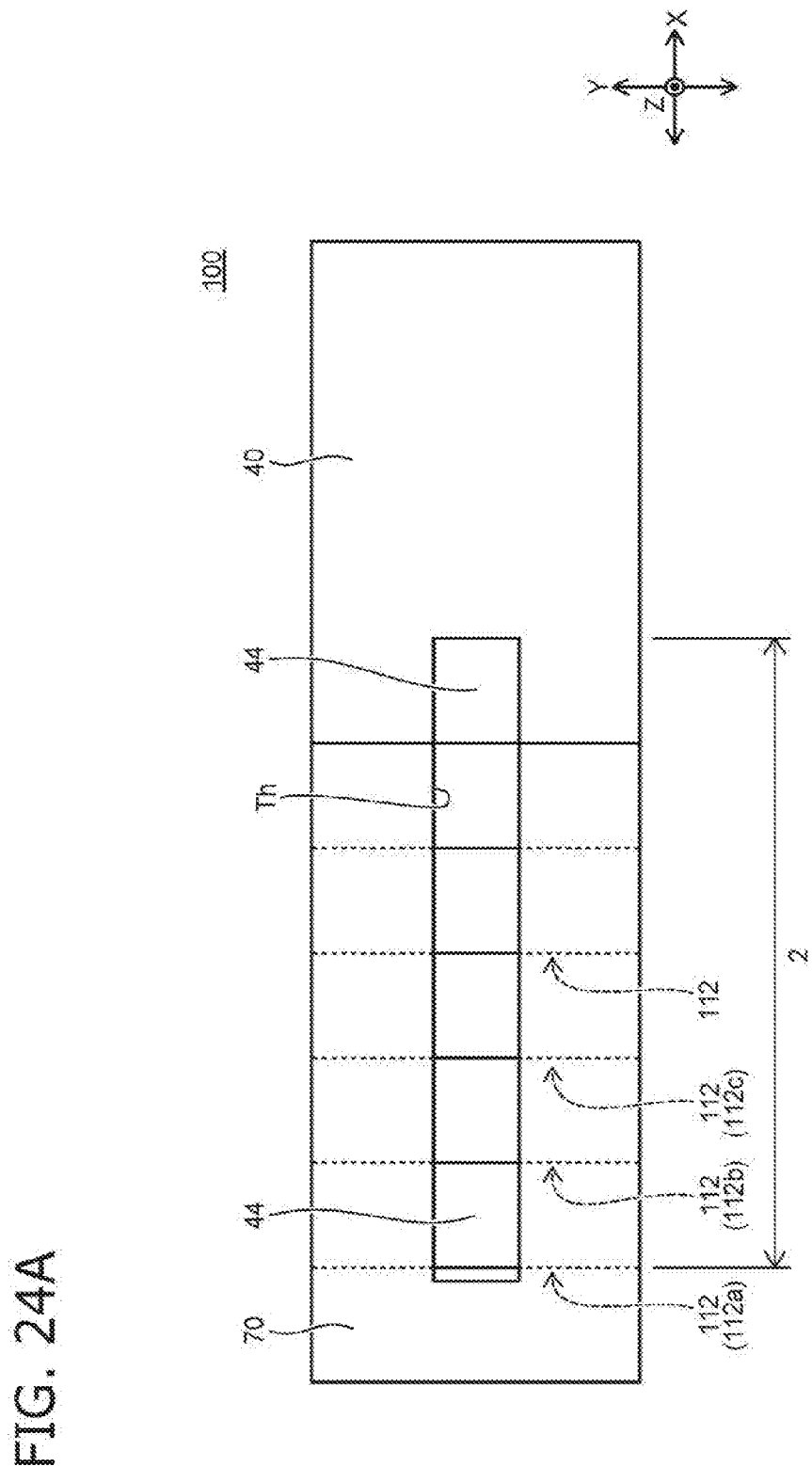

First, similarly to the first embodiment, the processes shown in FIG. 9A to FIG. 11E are implemented. Subsequently, as shown in FIG. 24A to FIG. 24C, the trench Th is formed in the portion of the insulating film 70 disposed in the staircase portion 2. The method for forming the trench Th and the configuration of the trench Th are similar to those of the first embodiment. At this time, in the embodiment, the columnar portions CL are not yet formed.

As shown in FIG. 25A to FIG. 25C, the first film 71 is formed inside the trench Th. Subsequently, as shown in FIG. 26A to FIG. 26C, a resist pattern RP3 is formed on the structural component shown in FIG. 25A to FIG. 25C. The resist pattern RP3 has multiple openings having hole configurations. For example, when viewed from the Z-direction, quadrilateral openings are formed in the portion of the resist pattern RP3 disposed on the staircase portion 2. The configurations of the openings may be ellipses. On the other hand, for example, when viewed from the Z-direction, circular holes are formed in the portion of the resist pattern RP3 disposed on the region where the memory cell array 1 is to be formed.

Figure 27A:
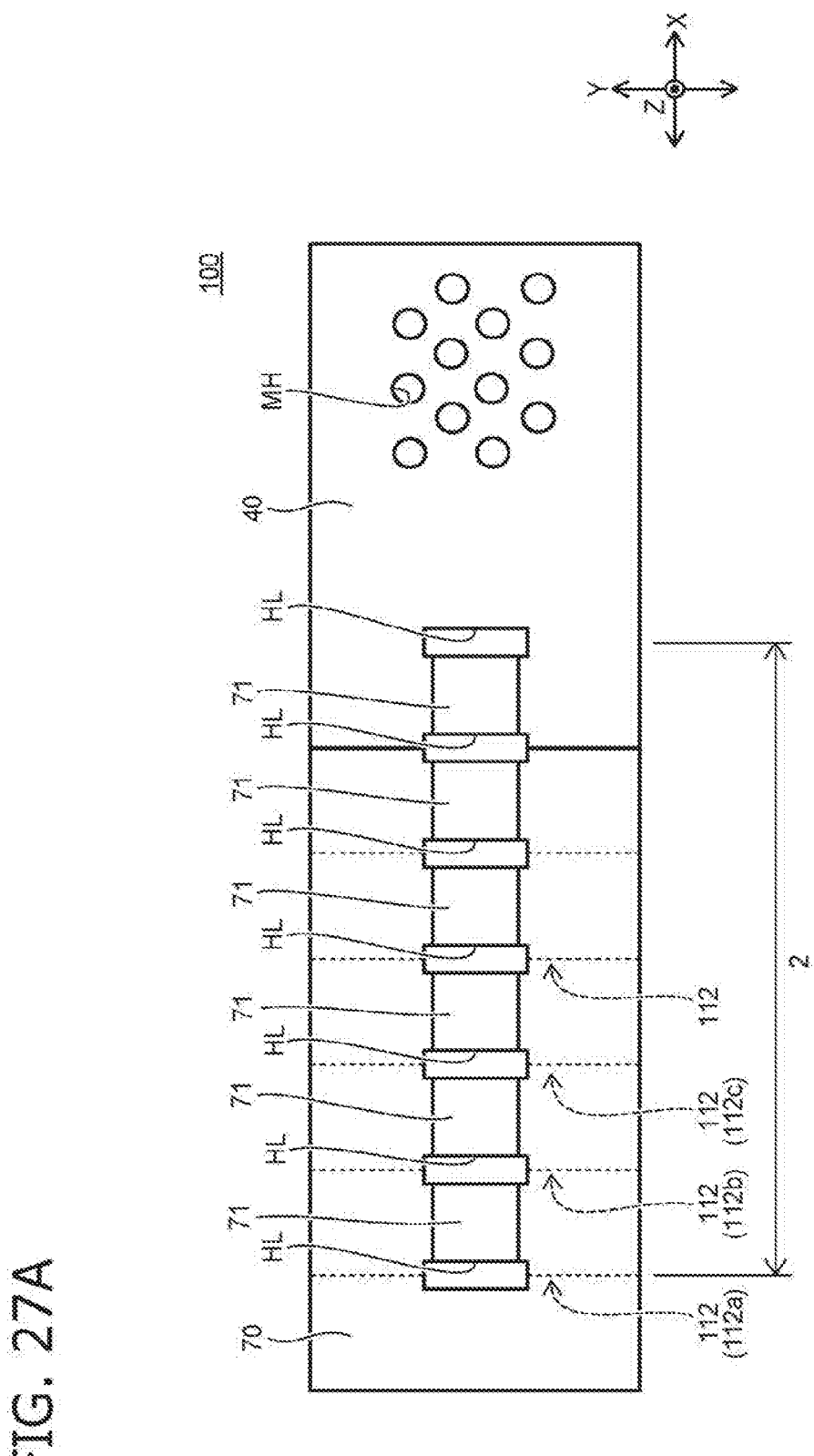

As shown in FIG. 27A to FIG. 27C, the stacked body 100, the first film 71, and the insulating film 70 are etched using the resist pattern RP3 (referring to FIG. 26A to FIG. 26C) as a mask. Thereby, the holes HL are formed in the staircase portion 2; and the memory holes MH are formed in the region where the memory cell array 1 is to be formed. Thus, the holes HL and the memory holes MH are formed collectively. Subsequently, the resist pattern RP3 is removed.

The columnar portions CL and the posts HR are formed as shown in FIG. 28A to FIG. 28C. For example, the columnar portions CL and the posts HR are formed collectively.

For example, a stacked film in which a silicon oxide film, a silicon nitride film, and a silicon oxide film are stacked in this order is formed on the memory hole MH side surfaces and on the side surfaces of the holes HL. Thereby, the memory film 30 (referring to FIG. 3A and FIG. 3B) is formed on the side surfaces of the memory holes MH; and the insulating film 31 (referring to FIG. 22 and FIG. 23) is formed on the side surfaces of the holes HL.

Subsequently, a semiconductor material is provided inside the memory holes MH and inside the holes HL. Thereby, the semiconductor bodies 20 (referring to FIG. 3A and FIG. 3B) are formed inside the memory holes MH; and the semiconductor portions 21 (referring to FIG. 22 and FIG. 23) are formed inside the holes HL. Subsequently, an insulating material such as silicon oxide or the like is filled into the memory holes MH and into the holes HL. Thereby, the core members 50 (referring to FIG. 3A and FIG. 3B) are formed inside the memory holes MH; and the insulating portions 51 (referring to FIG. 22 and FIG. 23) are formed inside the holes HL. Thus, the columnar portions CL are formed inside the memory holes MH; and the posts HR are formed inside the holes HL.

In such a case, the insulating film 52 is formed on the posts HR so that the posts HR are not etched in the subsequent etching. The insulating film 52 includes, for example, silicon oxide. For example, as shown in FIG. 28B, the upper surfaces of the posts HR are formed to be lower than the upper surface of the insulating film 70 around the upper surfaces of the posts HR. The insulating film 52 is formed inside recesses made thereby.

Subsequently, similarly to the first embodiment, the processes shown in FIG. 19A to FIG. 21E are implemented.

By the manufacturing method recited above, the semiconductor device according to the embodiment can be manufactured.

In the manufacturing method, the holes HL and the memory holes MH can be formed collectively. Also, the columnar portions CL and the posts HR can be formed collectively. Thereby, the manufacturing processes can be reduced. Otherwise, the configuration, the manufacturing method, and the effects of the embodiment are similar to those of the first embodiment described above.

Third Embodiment

<Semiconductor Device>

Figure 29:
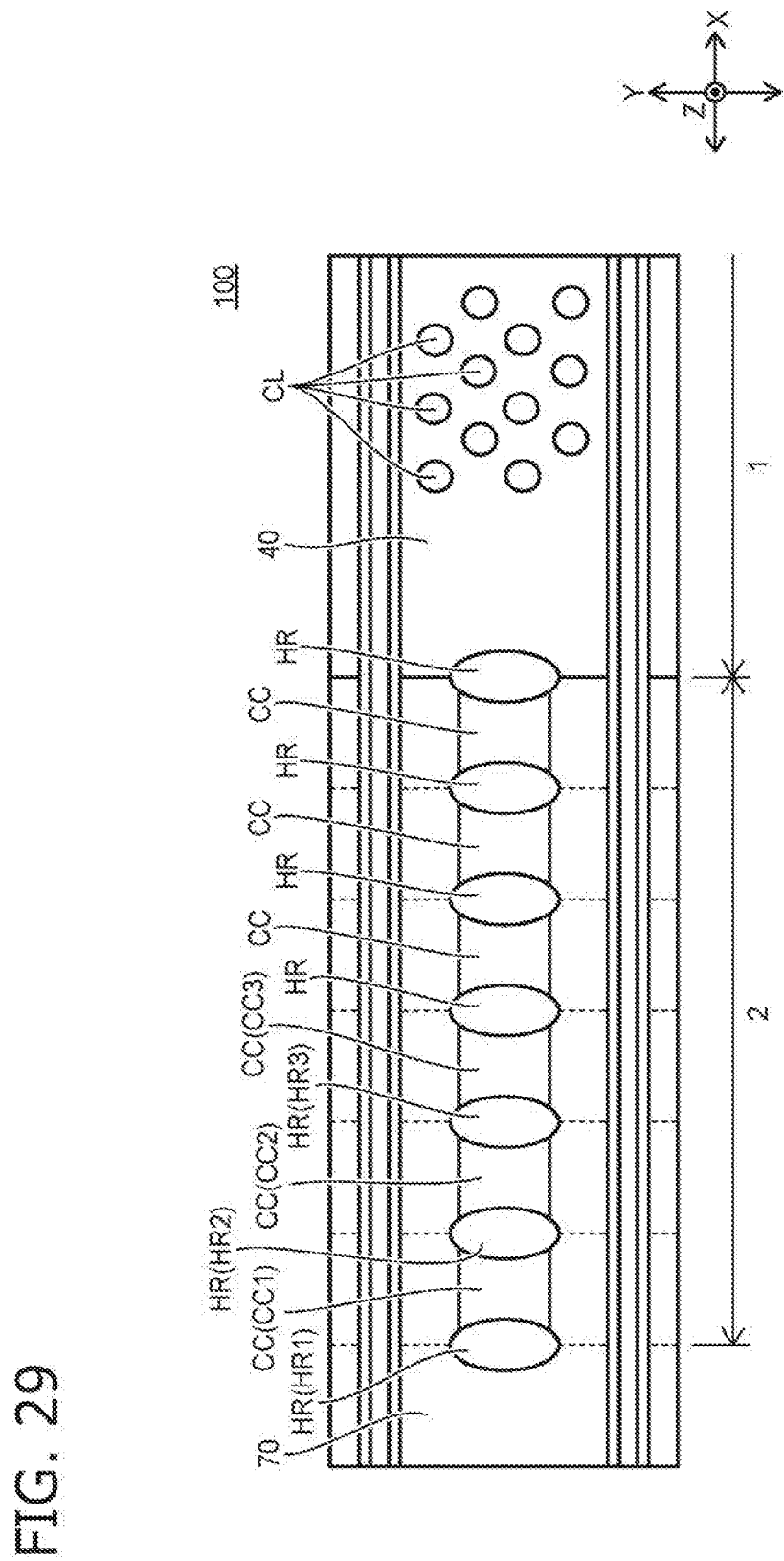
FIG. 29 is a plan view showing a semiconductor device according to a third embodiment.

FIG. 29 is a plan view showing a semiconductor device according to a third embodiment.

The configuration of the post HR of the semiconductor device according to the embodiment is different from that of the semiconductor device according to the first embodiment. As shown in FIG. 29, the configuration of the post HR is an elliptical columnar configuration. The two Y-direction end portions of the post HR protrude on the two Y-direction sides from the side surfaces of the contact portion CC facing the Y-direction. Otherwise, the configuration of the embodiment is similar to that of the first embodiment.

Thus, according to the embodiments, a semiconductor device can be obtained in which the planar size of the staircase portion 2 can be reduced.

Hereinabove, the embodiments are described with reference to several examples. However, the embodiments are not limited to the examples described in the specification. The embodiments described above are not intended to limit the scope of the invention.

For example, in the first embodiment, the posts HR are utilized as members supporting the insulators 40 when the sacrificial layers 44 are replaced with the electrode layers 41 (referring to FIG. 20A to FIG. 21E).

However, the posts HR also can be utilized as members supporting the electrode layers 41 in the case where, for example, the insulators 40 are "air gaps" instead of insulating materials.

Moreover, in the first to third embodiments, the base member includes only the substrate 10. However, the base member may include a more complicated structure. For example, the base member may include a substrate, a first insulating film provided on the substrate, a conductive film used as a source line on the first insulating film, and a second insulating film provided on the conductive film. In this case, the semiconductor body 20 may be connected to the conductive film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a base member;
   a first structure body provided above the base member, the first structure body including a first electrode layer and a first insulator, the first structure body having a first terrace in a front surface of a first end portion of the first electrode layer;
   a second structure body provided on the first structure body other than the first end portion, the second structure body including a second electrode layer and a second insulator, the second structure body having a second terrace in a front surface of a second end portion of the second electrode layer, a side surface of the second electrode layer being at a first level difference between the first terrace and the second terrace;
   a first contact portion extending in a first direction and being provided on the first terrace, the first direction being a direction in which the base member, the first structure body, and the second structure body are arranged, the first contact portion being electrically connected to the first electrode layer at the first terrace;
   a second contact portion extending in the first direction and being provided on the second terrace, the second contact portion being electrically connected to the second electrode layer at the second terrace; and
   a first post contacting the base member, being disposed between the first contact portion and the second contact portion, and being provided inside the first structure body, the first post crossing the first level difference.

2. The device according to claim 1, wherein the first contact portion, the first post, and the second contact portion are arranged along a second direction other than the first direction in which the first terrace and the second terrace are arranged.

3. The device according to claim 1, wherein the first post contacts the first contact portion and the second contact portion.

4. The device according to claim 1, wherein the first post has an elliptical columnar configuration or a quadrilateral prism configuration.

5. The device according to claim 1, wherein the first terrace and the second terrace are arranged in the first direction and in a second direction other than the first direction, and a length of the first post in a third direction crossing the first direction and the second direction is longer than lengths of the first contact portion and the second contact portion in the third direction.

6. The device according to claim 1, wherein the first terrace and the second terrace are arranged in the first direction and in a second direction other than the first direction, and lengths of the first contact portion and the second contact portion in the second direction are longer than a length of the first post in the second direction.

7. The device according to claim 1, further comprising:
   a third structure body provided on the second structure body other than the second end portion, the third structure body including a third electrode layer and a third insulator, the third structure body having a third terrace in a front surface of a third end portion of the third electrode layer, a side surface of the third electrode layer being at a second level difference between the second terrace and the third terrace;
   a third contact portion extending in the first direction and being provided on the third terrace, the third contact portion being electrically connected to the third electrode layer at the third terrace; and
   a second post contacting the base member, being disposed between the second contact portion and the third contact portion, and being provided inside the first structure body and inside the second structure body, the second post crossing the second level difference.

8. The device according to claim 7, wherein the first contact portion, the first post, the second contact portion, the second post, and the third contact portion are arranged along a second direction other than the first direction in which the first terrace, the second terrace, and the third terrace are arranged.

9. The device according to claim 1, further comprising:
   a semiconductor body extending in the first direction, being provided inside the first structure body and inside the second structure body, and being electrically connected to the base member; and a memory film provided between the semiconductor body and one of the first electrode layer and the second electrode layer, the memory film including a charge storage portion.

10. The device according to claim 1, wherein the first post includes:
   a first semiconductor portion provided inside the first structure body; and
   a first insulating film provided between the first semiconductor portion and the first electrode layer and between the first semiconductor portion and the second electrode layer.

11. The device according to claim 1, wherein the first terrace and the second terrace are arranged in the first direction and in a second direction other than the first direction, and a length of the first electrode layer in a third direction crossing the first direction and the second direction is longer than a length of the first post in the third direction.

12. A semiconductor device, comprising:
   a base member;
   a stacked body provided above the base member, the stacked body including a plurality of electrode layers stacked in a first direction with an insulator interposed, the first direction being a direction in which the base member and the stacked body are arranged, an end portion in a second direction of the stacked body including a staircase portion, the second direction crossing the first direction, a plurality of terraces and a plurality of level differences being arranged alternately in the second direction in the staircase portion, the plurality of terraces respectively being upper surfaces of the plurality of electrode layers, the plurality of level differences respectively including side surfaces of the plurality of electrode layers;
   a plurality of contact portions provided in regions directly above the plurality of terraces, the plurality of contact portions being electrically connected respectively to the plurality of electrode layers; and
   a plurality of posts extending through the staircase portion in the first direction and respectively crossing the plurality of level differences, each of the plurality of posts contacting the base member,
   the plurality of contact portions and the plurality of posts being arranged along the second direction,
   the plurality of posts extending outside the plurality of contact portions on two sides in a third direction crossing the first direction and the second direction.

13. The device according to claim 12, wherein at least one of the plurality of contact portions and at least one of the plurality of posts are in contact.

14. The device according to claim 13, wherein at least one of the plurality of posts is in contact with two of the plurality of contact portions adjacent to each other in the second direction.

15. The device according to claim 12, wherein at least one of the plurality of posts has an elliptical columnar configuration or a quadrilateral prism configuration.

16. The device according to claim 12, further comprising:
   a semiconductor body extending in the first direction, being provided inside the stacked body, and being electrically connected to the base member; and
   a memory film provided between the semiconductor body and one of the plurality of electrode layers, the memory film including a charge storage portion.

17. The device according to claim 12, wherein at least one of the plurality of posts includes:
   a semiconductor portion provided inside the stacked body; and
   an insulating film provided between the semiconductor portion and the plurality of electrode layers.

* * * * *